(12) United States Patent
Endo et al.

(10) Patent No.: US 11,296,085 B2
(45) Date of Patent: Apr. 5, 2022

(54) SEMICONDUCTOR DEVICE

(71) Applicant: Semiconductor Energy Laboratory Co., Ltd., Atsugi (JP)

(72) Inventors: Yuta Endo, Atsugi (JP); Hideomi Suzawa, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/645,665

(22) PCT Filed: Sep. 5, 2018

(86) PCT No.: PCT/IB2018/056756
§ 371 (c)(1),
(2) Date: Mar. 9, 2020

(87) PCT Pub. No.: WO2019/053558
PCT Pub. Date: Mar. 21, 2019

(65) Prior Publication Data
US 2020/0279851 A1 Sep. 3, 2020

(30) Foreign Application Priority Data
Sep. 15, 2017 (JP) .............................. JP2017-177386

(51) Int. Cl.
*H01L 23/528* (2006.01)
*H01L 27/00* (2006.01)
(Continued)

(52) U.S. Cl.
CPC ........ *H01L 27/1052* (2013.01); *H01L 23/528* (2013.01); *H01L 27/0207* (2013.01);
(Continued)

(58) Field of Classification Search
CPC ............. H01L 27/0207; H01L 27/1225; H01L 27/10852; H01L 27/10897; H01L 27/1218;
(Continued)

(56) References Cited

U.S. PATENT DOCUMENTS 7,674,650 B2  3/2010  Akimoto et al.
7,732,819 B2  6/2010  Akimoto et al.
(Continued)

FOREIGN PATENT DOCUMENTS

CN      105789322 A     7/2016
JP      2007-096055 A   4/2007
(Continued)

OTHER PUBLICATIONS

International Search Report (Application No. PCT/IB2018/056756) dated Dec. 4, 2018.
(Continued)

*Primary Examiner* — Nikolay K Yushin
(74) *Attorney, Agent, or Firm* — Robinson Intellectual Property Law Office; Eric J. Robinson

(57) ABSTRACT

A semiconductor device that can be highly integrated is provided. The semiconductor device includes a first transistor, a second transistor, and an electrode. The first transistor and the second transistor include an oxide, a gate insulator over the oxide, and a gate. The electrode is connected to one of a source and a drain of the first transistor and one of a source and a drain of the second transistor. The channel length of the first transistor is longer than the short side of the first conductor. The channel length of the second transistor is longer than the short side of the second conductor.

5 Claims, 35 Drawing Sheets

(51) Int. Cl.
   *H01L 29/00*      (2006.01)
   *H01L 27/105*     (2006.01)
   *H01L 27/02*      (2006.01)
   *H01L 29/24*      (2006.01)
   *H01L 29/66*      (2006.01)
   *H01L 29/786*     (2006.01)

(52) U.S. Cl.
   CPC ........ *H01L 29/24* (2013.01); *H01L 29/66969* (2013.01); *H01L 29/7869* (2013.01)

(58) Field of Classification Search
   CPC ........... H01L 27/1052; H01L 27/10814; H01L 28/90; H01L 28/86; H01L 28/60; H01L 29/7869; H01L 29/24; H01L 29/66969; H01L 23/528; H01L 23/53257; H01L 23/4985; H01L 23/49855
   See application file for complete search history.

(56) References Cited

U.S. PATENT DOCUMENTS

| | | | |
|---|---|---|---|
| 7,910,490 B2 | 3/2011 | Akimoto et al. | |
| 7,932,521 B2 | 4/2011 | Akimoto et al. | |
| 8,274,077 B2 | 9/2012 | Akimoto et al. | |
| 8,779,432 B2 | 7/2014 | Yamazaki et al. | |
| 8,809,854 B2 | 8/2014 | Isobe et al. | |
| 8,809,870 B2 | 8/2014 | Yamazaki et al. | |
| 8,860,108 B2 | 10/2014 | Yamazaki et al. | |
| 8,878,288 B2 | 11/2014 | Isobe et al. | |
| 8,916,868 B2 | 12/2014 | Isobe et al. | |
| 8,932,913 B2 | 1/2015 | Sasagawa et al. | |
| 9,209,092 B2 | 12/2015 | Yamazaki et al. | |
| 9,553,583 B2 | 1/2017 | Yamazaki et al. | |
| 10,490,553 B2 | 11/2019 | Yamazaki | |
| 2011/0062435 A1 | 3/2011 | Yamazaki et al. | |
| 2012/0061800 A1 | 3/2012 | Hirota | |
| 2012/0235150 A1 | 9/2012 | Isobe et al. | |
| 2012/0267709 A1 | 10/2012 | Isobe et al. | |
| 2013/0292671 A1 | 11/2013 | Yamazaki et al. | |
| 2017/0213833 A1 | 7/2017 | Godo et al. | |
| 2020/0091154 A1 | 3/2020 | Yamazaki | |
| 2021/0005755 A1 | 1/2021 | Yamazaki et al. | |

FOREIGN PATENT DOCUMENTS

| | | |
|---|---|---|
| JP | 2007-123861 A | 5/2007 |
| JP | 2011-119674 A | 6/2011 |
| JP | 2011-192801 A | 9/2011 |
| JP | 2012-209547 A | 10/2012 |
| JP | 2012-235102 A | 11/2012 |
| JP | 2017-135378 A | 8/2017 |
| TW | 201731077 | 9/2017 |
| WO | WO-2011/033993 | 3/2011 |
| WO | WO-2011/052396 | 5/2011 |

OTHER PUBLICATIONS

Written Opinion (Application No. PCT/IB2018/056756) dated Dec. 4, 2018.

Taiwanese Office Action (Application No. 107131671) dated Nov. 4, 2021.

SEMICONDUCTOR DEVICE

TECHNICAL FIELD

One embodiment of the present invention relates to a semiconductor device and a manufacturing method thereof. Another embodiment of the present invention relates to a semiconductor wafer, a module, and an electronic device.

Note that in this specification and the like, a semiconductor device generally means a device that can function by utilizing semiconductor characteristics. A semiconductor element such as a transistor, a semiconductor circuit, an arithmetic device, and a memory device are each an embodiment of the semiconductor device. A display device (e.g., a liquid crystal display device and a light-emitting display device), a projection device, a lighting device, an electro-optical device, a power storage device, a memory device, a semiconductor circuit, an imaging device, an electronic device, and the like may include a semiconductor device.

Note that one embodiment of the present invention is not limited to the above technical field. One embodiment of the invention disclosed in this specification and the like relates to an object, a method, or a manufacturing method. Furthermore, one embodiment of the present invention relates to a process, a machine, manufacture, or a composition of matter.

BACKGROUND ART

A technique of fabricating a transistor using a semiconductor thin film has attracted attention. The transistor is used in a wide range of electronic devices such as an integrated circuit (IC) and an image display device (also simply referred to as a display device). A silicon-based semiconductor material is widely known as a material for a semiconductor thin film that can be used in a transistor. As another material, an oxide semiconductor has been attracting attention.

For example, in some disclosed techniques, an oxide semiconductor such as zinc oxide or an In—Ga—Zn-based oxide is used for an active layer of a transistor and a display device is manufactured with use of the transistor (see Patent Documents 1 and 2).

Moreover, in recent years, a technique of fabricating an integrated circuit of a memory device with use of a transistor including an oxide semiconductor has been disclosed (see Patent Document 3). In addition, not only the memory device but also an arithmetic device or other similar devices have been fabricated using a transistor including an oxide semiconductor.

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2011-119674

DISCLOSURE OF INVENTION

Here, as electronic devices have increased performance and reduced size and weight, the integration degree of integrated circuits has increased and the sizes of transistors have decreased. At the same time, the process rule for fabricating a transistor has decreased year by year from 45 nm to 32 nm and 22 nm. This requires transistors including oxide semiconductors to exhibit good electrical characteristics as designed even when they have minute structures.

An object of one embodiment of the present invention is to provide a semiconductor device that can be miniaturized or highly integrated. Another object of one embodiment of the present invention is to provide a semiconductor device having good electrical characteristics. Another object of one embodiment of the present invention is to provide a semiconductor device with a low off-state current. Another object of one embodiment of the present invention is to provide a transistor with a high on-state current. Another object of one embodiment of the present invention is to provide a highly reliable semiconductor device. Another object of one embodiment of the present invention is to provide a semiconductor device with low power consumption. Another object of one embodiment of the present invention is to provide a semiconductor device that can be manufactured with high productivity.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a novel semiconductor device.

Note that the description of these objects does not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulator, a second insulator and a third insulator over the first insulator, a fourth insulator positioned between the second insulator and the third insulator, an oxide covering the first to fourth insulators, a fifth insulator over the oxide, a first conductor that is positioned between the second insulator and the fourth insulator and is in contact with the fifth insulator, a second conductor that is positioned between the third insulator and the fourth insulator and is in contact with the fifth insulator, and a third conductor overlapping with the fourth insulator. The oxide, the fifth insulator, and the first conductor constitute a first transistor. The oxide, the fifth insulator, and the second conductor constitute a second transistor. The third conductor is positioned between the first transistor and the second transistor and is connected to one of a source and a drain of the first transistor and one of a source and a drain of the second transistor. The channel length of the first transistor is longer than a short side of the first conductor and the channel length of the second transistor is longer than a short side of the second conductor.

Another embodiment of the present invention is a semiconductor device including a fourth conductor over the third conductor, a fifth conductor over the first transistor, a sixth conductor over the second transistor, a first capacitor over the fifth conductor, and a second capacitor over the sixth conductor. The fourth conductor is connected to the third conductor. The fifth conductor is connected to the other of the source and the drain of the first transistor and one electrode of the first capacitor. The sixth conductor is connected to the other of the source and the drain of the second transistor and one electrode of the second capacitor.

Another embodiment of the present invention is a semiconductor device including a sixth insulator over the first transistor and the second transistor, and a seventh insulator over the sixth insulator. The sixth insulator includes a first opening that exposes the oxide. The sixth insulator and the seventh insulator include a second opening and a third opening that expose the oxide. The third conductor is provided in the first opening. The fifth conductor is provided in the second opening. The sixth conductor is provided in the third opening. The fourth conductor functioning as a wiring is positioned over the sixth insulator and the third conductor.

In the above, preferably, a long side of the fourth conductor is substantially perpendicular to a long side of the first conductor and a long side of the second conductor, and the angle between a long side of the oxide and the long side of the fourth conductor is greater than or equal to 20° and less than or equal to 70°.

In the above, the oxide preferably contains In, an element M (M is Al, Ga, Y, or Sn), and Zn.

According to one embodiment of the present invention, a semiconductor device that can be miniaturized or highly integrated can be provided. According to one embodiment of the present invention, a semiconductor device having good electrical characteristics can be provided. According to one embodiment of the present invention, a semiconductor device with a low off-state current can be provided. According to one embodiment of the present invention, a transistor with a high on-state current can be provided. According to one embodiment of the present invention, a highly reliable semiconductor device can be provided. According to one embodiment of the present invention, a semiconductor device with low power consumption can be provided. According to one embodiment of the present invention, a semiconductor device with high productivity can be provided.

A semiconductor device capable of retaining data for a long time can be provided. A semiconductor device capable of high-speed data writing can be provided. A semiconductor device with high design flexibility can be provided. A novel semiconductor device can be provided.

Note that the descriptions of these effects do not disturb the existence of other effects. One embodiment of the present invention does not have to have all the effects listed above. Other effects will be apparent from and can be derived from the description of the specification, the drawings, the claims, and the like.

BEST MODE FOR CARRYING OUT THE INVENTION

Figure 1A:
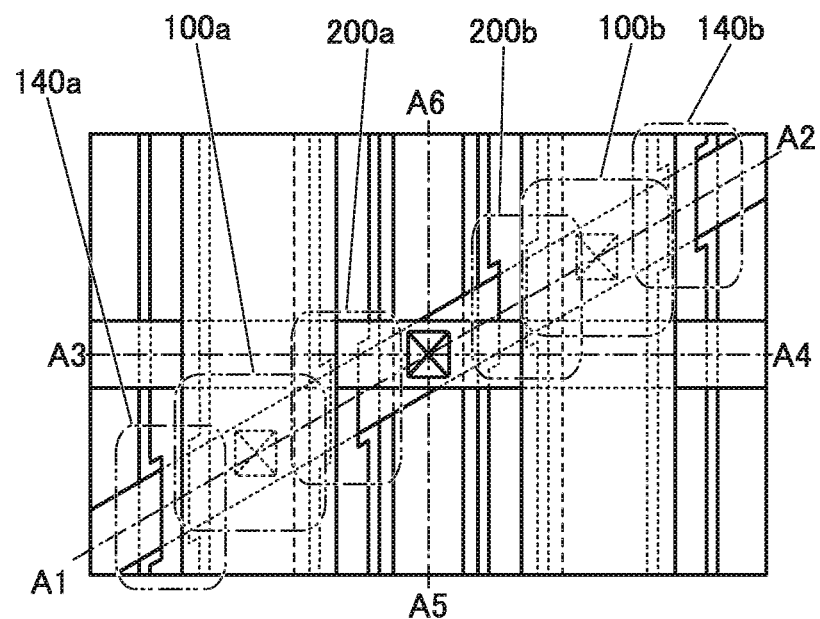
FIGS. 1A and 1B are a top view and a cross-sectional view of a semiconductor device of one embodiment of the present invention.

Embodiments will be described below with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. For example, in the actual manufacturing process, a layer, a resist mask, or the like might be unintentionally reduced in size by treatment such as etching, which is not illustrated in some cases for easy understanding. In the drawings, the same portions or portions having similar functions are denoted by the same reference numerals in different drawings, and explanation thereof will not be repeated in some cases. The same hatching pattern is applied to portions having similar functions, and the portions are not denoted by specific reference numerals in some cases.

Especially in a top view (also referred to as a "plan view"), a perspective view, or the like, some components might not be illustrated for easy understanding of the invention. In addition, some hidden lines and the like might not be shown.

In this specification and the like, the ordinal numbers such as first and second are used for convenience and do not denote the order of steps or the stacking order of layers. Therefore, for example, description can be made even when "first" is replaced with "second" or "third", as appropriate. In addition, the ordinal numbers in this specification and the like are not always the same as those used for specifying one embodiment of the present invention.

In this specification, terms for describing arrangement (e.g., over, above, under, and below) are used for convenience in describing a positional relationship between components with reference to drawings. Furthermore, the positional relationship between components changes as appropriate in accordance with the direction in which each component is described. Thus, terms for the description are not limited to those used in this specification, and the description can change appropriately depending on the situation.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can be switched in some cases in this specification and the like.

Note that the channel length refers to, for example, the distance between a source and a drain in a region where a semiconductor (or a portion where a current flows in a semiconductor when a transistor is on) and a gate overlap with each other or in a region where a channel is formed in a top view of the transistor. Note that in one transistor, channel lengths in all regions are not necessarily the same. In other words, the channel length of one transistor is not fixed to one value in some cases. Thus, in this specification, the channel length is any one of values, the maximum value, the minimum value, or the average value in a region where a channel is formed.

Note that depending on the transistor structure, a channel length in a region where a channel is actually formed (hereinafter also referred to as an "effective channel length") is different from a channel length shown in a top view of a transistor (hereinafter also referred to as an "apparent channel length") in some cases. For example, in a transistor having a gate covering a side surface of a semiconductor, an effective channel length is greater than an apparent channel length and has a non-negligible influence in some cases. For example, in a miniaturized transistor having a gate covering a side surface of a semiconductor, the proportion of a channel formation region formed in a side surface of a semiconductor is increased in some cases. In that case, an effective channel length is greater than an apparent channel length.

The channel width refers to, for example, the length of a channel formation region perpendicular to a channel length direction in a region where a semiconductor (or a portion where a current flows in a semiconductor when a transistor is on) and a gate overlap with each other, or in a region where a channel is formed in a top view of the transistor. Note that in one transistor, channel widths in all regions are not necessarily the same. In other words, the channel width of one transistor is not fixed to one value in some cases. Thus, in this specification, the channel width is any one of values, the maximum value, the minimum value, or the average value in a region where a channel is formed.

Note that depending on the transistor structure, a channel width in a region where a channel is actually formed (hereinafter also referred to as an "effective channel width") is different from a channel width shown in a top view of a transistor (hereinafter also referred to as an "apparent channel width") in some cases. For example, in a transistor having a gate covering a side surface of a semiconductor, an effective channel width is greater than an apparent channel width and has a non-negligible influence in some cases. For example, in a miniaturized transistor having a gate covering a side surface of a semiconductor, the proportion of a channel formation region formed in a side surface of a semiconductor is increased in some cases. In that case, an effective channel width is greater than an apparent channel width.

In such a case, an effective channel width is difficult to measure in some cases. For example, to estimate an effective channel width from a design value, it is necessary to assume that the shape of a semiconductor is a known one. Accordingly, in the case where the shape of a semiconductor is not known exactly, it is difficult to measure an effective channel width accurately.

Thus, in this specification, an apparent channel width is referred to as a surrounded channel width (SCW) in some cases. Furthermore, in the case where the term "channel width" is simply used in this specification, it represents a surrounded channel width or an apparent channel width in some cases. In other cases, the simple term "channel width" represents an effective channel width in this specification. Note that a channel length, a channel width, an effective channel width, an apparent channel width, a surrounded channel width, and the like can be determined by analyzing a cross-sectional TEM image and the like.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, or the crystallinity may be decreased. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. For an oxide semiconductor, water also serves as an impurity in some cases. For an oxide semiconductor, entry of impurities may lead to formation of oxygen vacancies, for example. When the semiconductor is silicon, examples of an impurity which changes the characteristics of the semiconductor include oxygen, Group 1 elements except hydrogen, Group 2 elements, Group 13 elements, and Group 15 elements.

In this specification and the like, a silicon oxynitride film contains more oxygen than nitrogen. A silicon oxynitride film preferably contains, for example, oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film contains more nitrogen than oxygen. A silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In addition, in this specification and the like, the term "insulator" can be replaced with an insulating film or an insulating layer. Moreover, the term "conductor" can be replaced with a conductive film or a conductive layer. Furthermore, the term "semiconductor" can be replaced with a semiconductor film or a semiconductor layer.

Furthermore, unless otherwise specified, transistors described in this specification and the like are field-effect transistors. Unless otherwise specified, transistors described in this specification and the like are n-channel transistors. Thus, unless otherwise specified, the threshold voltage (also referred to as "Vth") is higher than 0 V.

In this specification and the like, the term "parallel" indicates that the angle formed between two straight lines is greater than or equal to −10° and less than or equal to 10°. Thus, the case where the angle is greater than or equal to −5° and less than or equal to 5° is also included. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°. Thus, the case where the angle is greater than or equal to 85° and less than or equal to 95° is also included. In addition, the term "substantially perpendicular" indicates that the angle formed between two straight lines is greater than or equal to 60° and less than or equal to 120°.

Note that in this specification, a barrier film refers to a film having a function of inhibiting the passage of oxygen and impurities such as hydrogen. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in an active layer of a transistor is called an oxide semiconductor in some cases. In other words, an OS field-effect transistor (FET) is a transistor including an oxide or an oxide semiconductor.

Embodiment 1

A semiconductor device of one embodiment of the present invention includes an oxide in a channel formation region. In this embodiment, one embodiment of the semiconductor device will be described with reference to FIG. 1A to FIG. 21B.

Structure Example of Semiconductor Device

An example of a semiconductor device of one embodiment of the present invention, which includes a transistor 200a, a transistor 200b, a transistor 140a, a transistor 140b, a capacitor 100a, and a capacitor 100b, is described below. One embodiment of the semiconductor device is described below with reference to FIG. 1A to FIG. 21B.

Figure 1B:
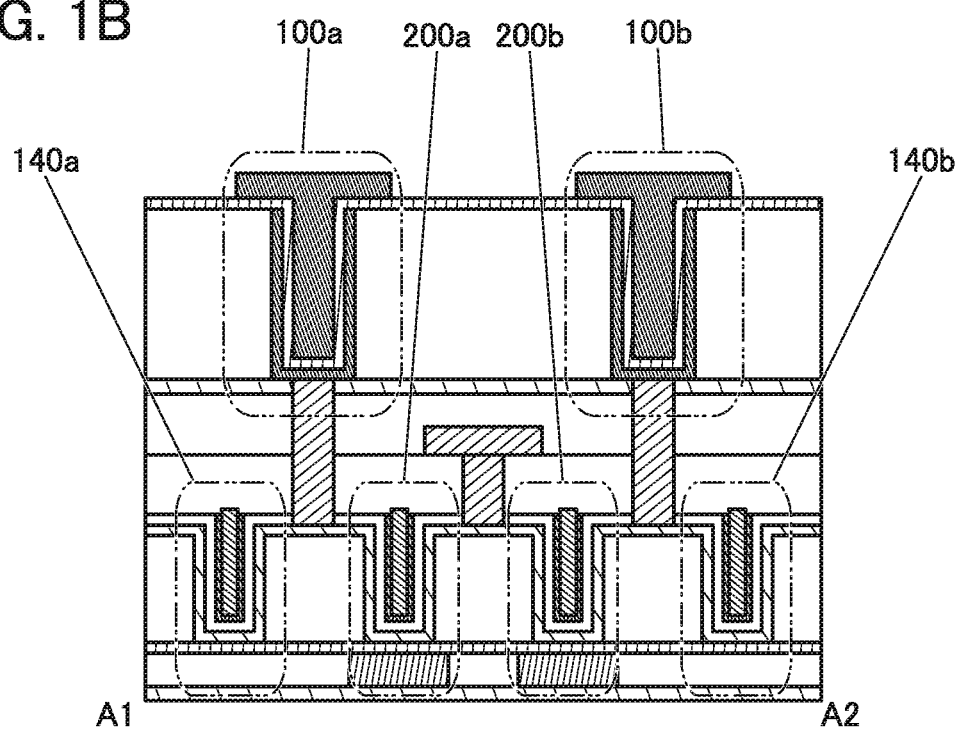
Figure 2A:
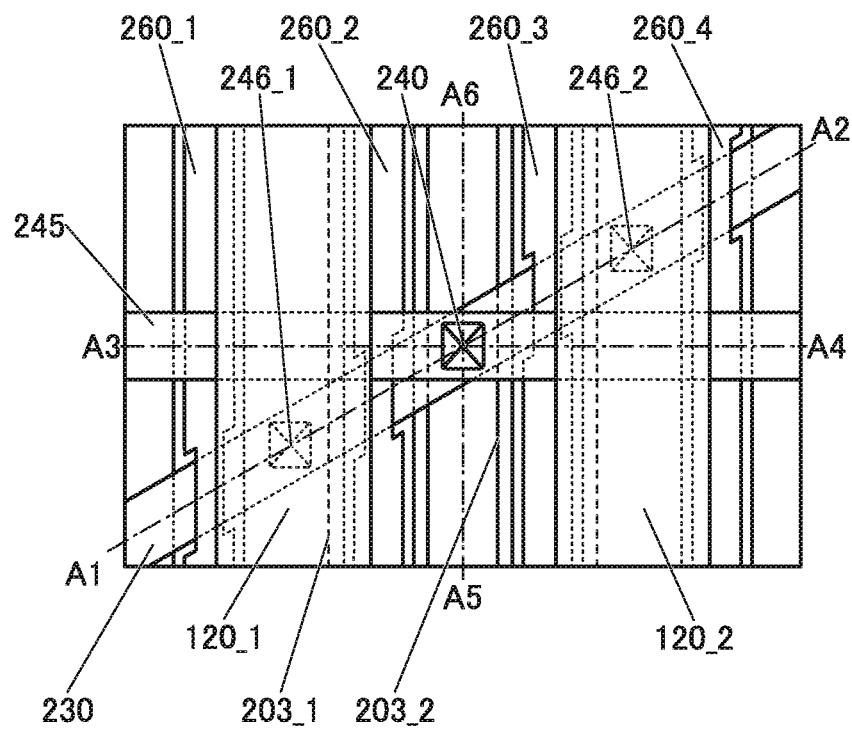
FIGS. 2A and 2B are a top view and a cross-sectional view of a semiconductor device of one embodiment of the present invention.
Figure 2B:
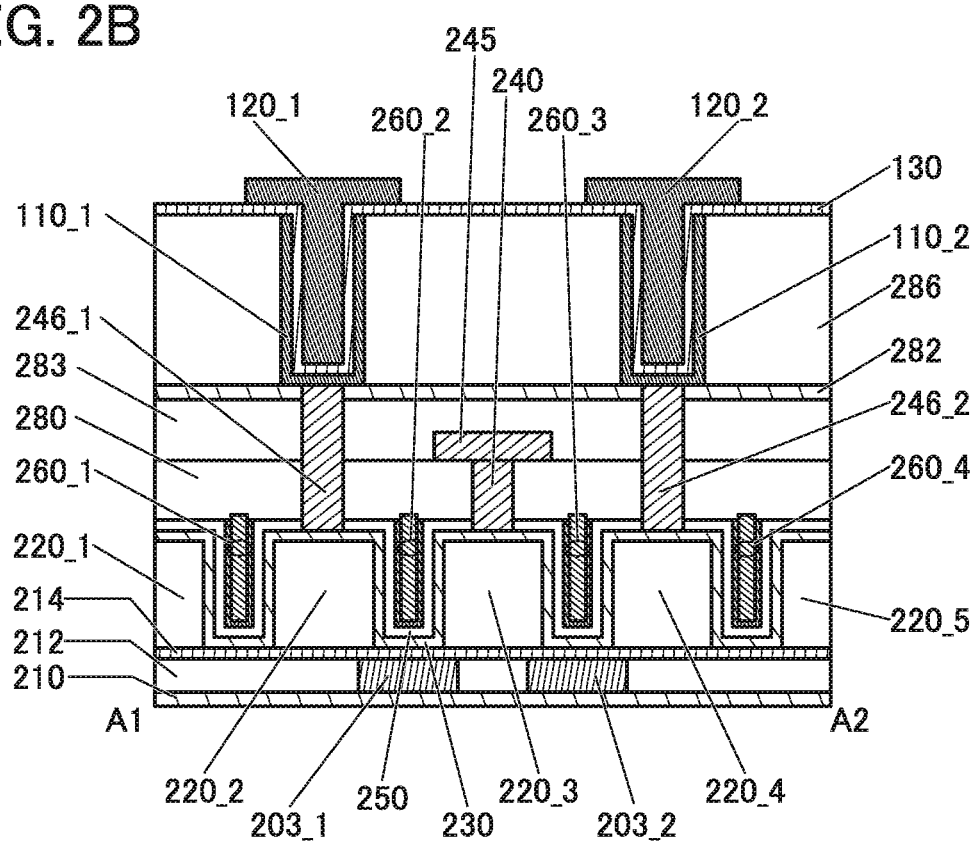
Figure 3:
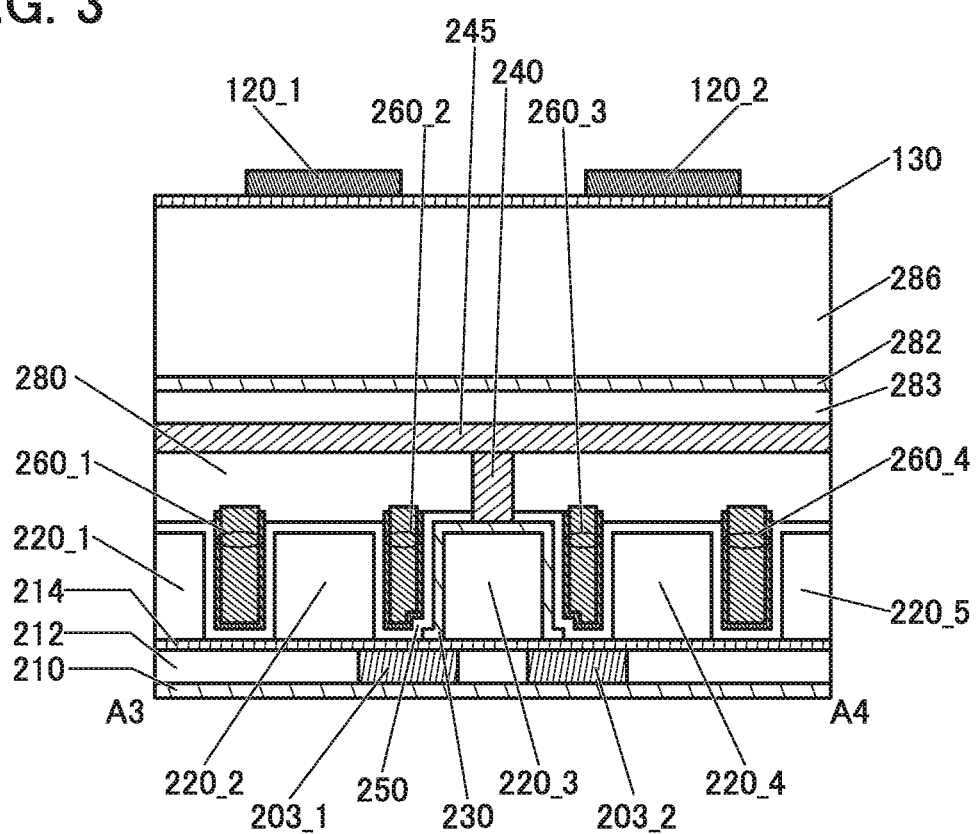
FIG. 3 is a cross-sectional view of a semiconductor device of one embodiment of the present invention.

FIGS. 1A and 2A are top views of the semiconductor device including the transistor 200a, the transistor 200b, the transistor 140a, the transistor 140b, the capacitor 100a, and the capacitor 100b. FIG. 1B and FIG. 2B are cross-sectional views taken along dashed-dotted lines A1-A2 in FIG. 1A and FIG. 2A, respectively. FIG. 3 is a cross-sectional view taken along dashed-dotted line A3-A4 in FIG. 1A and FIG. 2A. Some components are not illustrated in the top views of FIG. 1A and FIG. 2A for simplification of the drawings. In FIGS. 2A and 2B, the components in FIGS. 1A and 1B are denoted by reference numerals.

The semiconductor device of one embodiment of the present invention includes, as illustrated in FIGS. 1A and 1B, FIGS. 2A and 2B, and FIG. 3, the transistors 200a, 200b, 140a, and 140b, the capacitors 100a and 100b, and insulators 210, 212, 280, 283, 282, and 286 functioning as interlayer films. Furthermore, the semiconductor device includes conductors 240, 246_1, and 246_2 functioning as plugs, a conductor 245 which is electrically connected to the conductor 240 and functions as a wiring, a conductor 110_1 which is electrically connected to the conductor 246_1 and functions as a lower electrode of the capacitor 100a, a conductor 110_2 which is electrically connected to the conductor 246_2 and functions as a lower electrode of the capacitor 100b, an insulator 130 which is over the conductors 110_1 and 110_2 and functions as a dielectric of the capacitors 100a and 100b, a conductor 120_1 which is over the insulator 130 and functions as an upper electrode of the capacitor 100a, and a conductor 120_2 which is over the insulator 130 and functions as an upper electrode of the capacitor 100b.

Here, the transistors 200a and 200b are symmetric with respect to the intersection point of dashed-dotted line A1-A2 and dashed-dotted line A5-A6 in the part illustrated in FIG. 1A.

Similarly, the transistors 140a and 140b are symmetric with respect to the intersection point of dashed-dotted line A1-A2 and dashed-dotted line A5-A6 in the part illustrated in FIG. 1A.

Similarly, the capacitors 100a and 100b are symmetric with respect to the intersection point of dashed-dotted line A1-A2 and dashed-dotted line A5-A6 in the part illustrated in FIG. 1A.

In the above structure, the transistors 200a and 200b can be connected to the conductor 240 functioning as a common plug. In other words, one of a source and a drain of each of the transistors 200a and 200b can be electrically connected to the same wiring. This results in a reduction in the area occupied by the semiconductor device including the transistors 200a, 200b, 140a, and 140b and the capacitors 100a and 100b.

In the semiconductor device, the insulator 280 is preferably provided to cover the transistors 200a, 200b, 140a, and 140b. The insulator 280 preferably contains a reduced concentration of impurities such as water and hydrogen.

The conductor 240 is formed in contact with the inner wall of an opening in the insulator 280. An oxide 230 is positioned on at least part of a bottom portion of the opening, and thus the conductor 240 is in contact with the oxide 230 (see FIG. 2B).

The conductor 240 may be formed after aluminum oxide is formed on a side wall portion of the opening. The aluminum oxide formed on the side wall portion of the opening can inhibit the passage of oxygen from the outside to prevent oxidation of the conductor 240. Furthermore, impurities such as water and hydrogen can be prevented from diffusing from the conductor 240 to the outside. The aluminum oxide can be formed by forming aluminum oxide in the opening by an ALD method or the like and then performing anisotropic etching.

The conductor 240 functions as a plug that connects the one of the source and the drain of the transistor 200a and the one of the source and the drain of the transistor 200b to the conductor 245 functioning as a wiring. Such a structure enables a reduction in the distance between the transistors 200a and 200b adjacent to each other. Consequently, the transistors can be arranged with high density, leading to a highly integrated semiconductor device.

The other of the source and the drain of the transistor 200a and the capacitor 100a overlap with each other. Similarly, the other of the source and the drain of the transistor 200b and the capacitor 100b overlap with each other.

The conductor 246_1 functions as a plug that connects the other of the source and the drain of the transistor 200a to the lower electrode of the capacitor 100a. Similarly, the conductor 246_2 functions as a plug that connects the other of the source and the drain of the transistor 200b to the lower electrode of the capacitor 100b.

As illustrated in FIGS. 1A and 2A, the conductor 245 and the oxide 230 are preferably arranged so that the angle between the long side of the conductor 245 and the long side of the oxide 230 is greater than or equal to 20° and less than or equal to 70°, further preferably greater than or equal to 30° and less than or equal to 60°. This arrangement allows, for example, the capacitors 100a and 100b and the conductor 245 to be arranged without obstruction.

In one embodiment of the present invention, the plurality of capacitors, the plurality of transistors, and the plugs connected to these components have the above-described structure, whereby a semiconductor device that can be miniaturized or highly integrated can be provided.

[Transistor 200a and Transistor 200b]

As illustrated in FIGS. 1A and 1B, FIGS. 2A and 2B, and FIG. 3, the transistor 200a includes the insulator 212, which is over the insulator 210 positioned over a substrate (not illustrated), a conductor 203_1 positioned to be embedded in the insulator 212, an insulator 214 positioned over the conductor 203_1 and the insulator 212, an insulator 220_2 and an insulator 220_3 positioned over the insulator 214, the oxide 230 covering the insulator 214, the insulator 220_2, and the insulator 220_3, an insulator 250 over the oxide 230, and a conductor 260_2 which is between the insulator 220_2 and the insulator 220_3 and in contact with the insulator 250.

As illustrated in FIGS. 1A and 1B, FIGS. 2A and 2B, and FIG. 3, the transistor 200b includes the insulator 212, which is over the insulator 210 positioned over the substrate (not illustrated), a conductor 203_2 positioned to be embedded in the insulator 212, the insulator 214 positioned over the conductor 203_2 and the insulator 212, the insulator 220_3 and an insulator 220_4 positioned over the insulator 214, the oxide 230 covering the insulator 214, the insulator 220_3, and the insulator 220_4, the insulator 250 over the oxide 230, and a conductor 260_3 which is between the insulator 220_3 and the insulator 220_4 and in contact with the insulator 250.

Note that the transistors 200a and 200b each include a single-layer oxide 230; however, the present invention is not limited to this structure. For example, the oxide 230 may have a stacked structure of two, three, or four or more layers.

Although the conductors 260_2 and 260_3 of the transistors 200a and 200b each have a two-layer structure, the present invention is not limited thereto. For example, the conductors 260_2 and 260_3 may each have a stacked structure of three or more layers.

Here, as described above, the transistors 200a and 200b are symmetric with respect to the intersection point of dashed-dotted line A1-A2 and dashed-dotted line A5-A6 in the part illustrated in FIG. 1A.

That is, the components of the transistor 200b correspond to those of the transistor 200a. Thus, in drawings, the corresponding components in the transistors 200a and 200b are basically denoted by the same three-digit reference numerals. Unless otherwise specified, the description for the transistor 200a can be referred to for the transistor 200b.

For example, the conductor 203_1 and the conductor 260_2 of the transistor 200a correspond to the conductor 203_2 and the conductor 260_3 of the transistor 200b, respectively.

Note that the oxide 230 is shared by the transistors 200a and 200b. Thus, the oxide 230 includes a region functioning as a channel formation region of the transistor 200a, a region functioning as the other of the source and the drain of the transistor 200a, a region functioning as a channel formation region of the transistor 200b, a region functioning as the other of the source and the drain of the transistor 200b, and a region functioning as the one of the source and the drain of the transistors 200a and 200b.

With the above structure, the one of the source and the drain can be electrically connected to a common plug. In particular, when the oxide 230 is shared by the transistors 200a and 200b, the distance between the conductor 260_2 functioning as a first gate of the transistor 200a and the conductor 260_3 functioning as a first gate of the transistor 200b may be a minimum feature size. When the distance between the conductor 260_2 and the conductor 260_3 is set to be the minimum feature size, the area occupied by the two transistors can be reduced.

For example, as the oxide 230, an oxide semiconductor typified by a metal oxide such as an In-M-Zn oxide (M is one or more of aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is used. In particular, aluminum, gallium, yttrium, or tin is preferable as the element M An In—Ga oxide or an In—Zn oxide may also be used as the oxide 230.

The transistors 200a and 200b each including an oxide semiconductor in the channel formation region has an extremely low leakage current in an off state; thus, a semiconductor device with low power consumption can be provided. In addition, an oxide semiconductor can be deposited by a sputtering method or the like and thus can be used for the transistors 200a and 200b included in a highly integrated semiconductor device.

Figure 12:
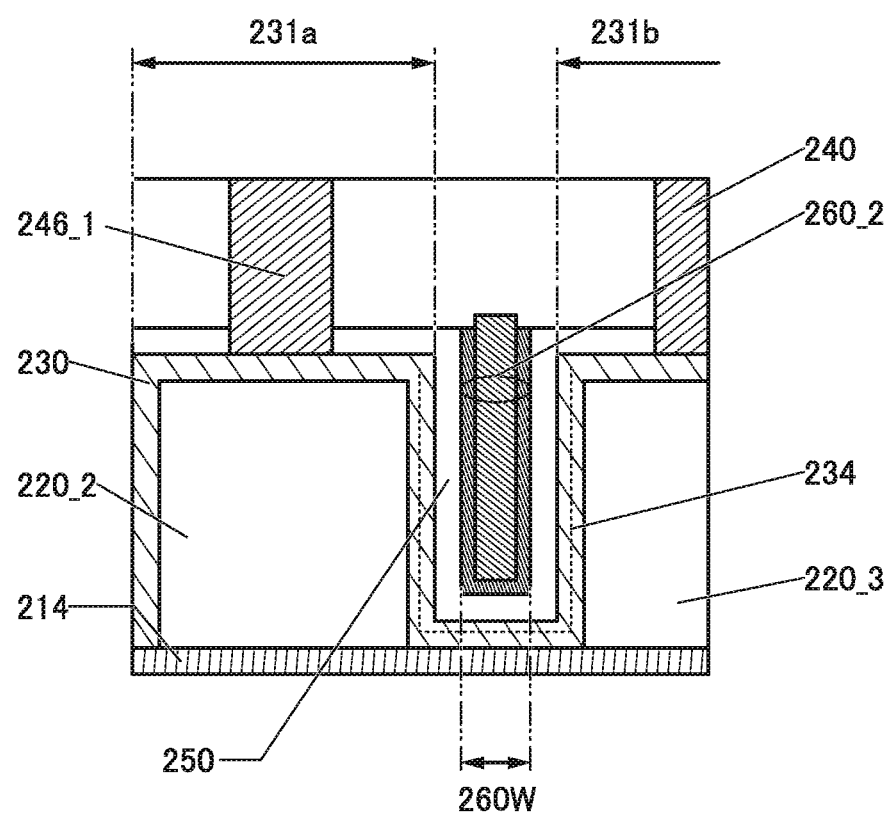
FIG. 12 is a cross-sectional view of a semiconductor device of one embodiment of the present invention.
Figure 13A:
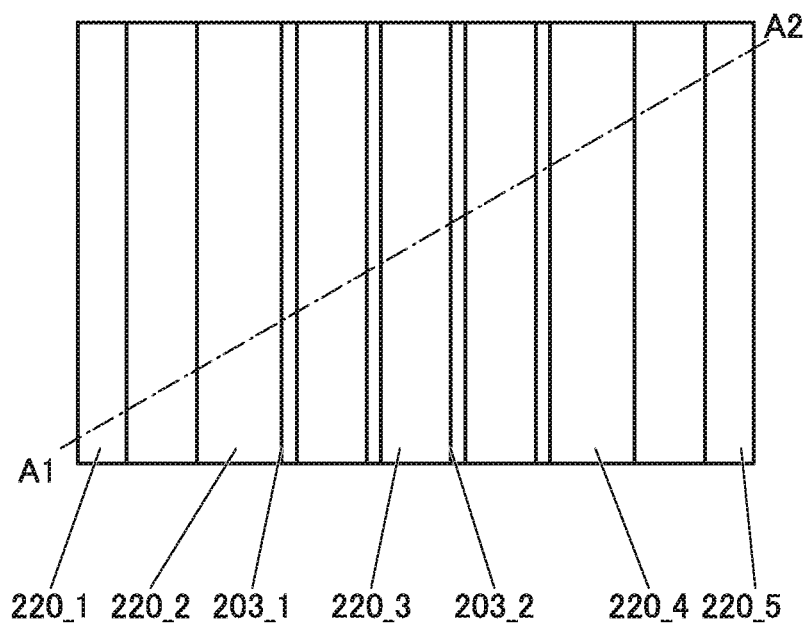
FIGS. 13A and 13B are a top view and a cross-sectional view illustrating a method for manufacturing a semiconductor device of one embodiment of the present invention.
Figure 13B:
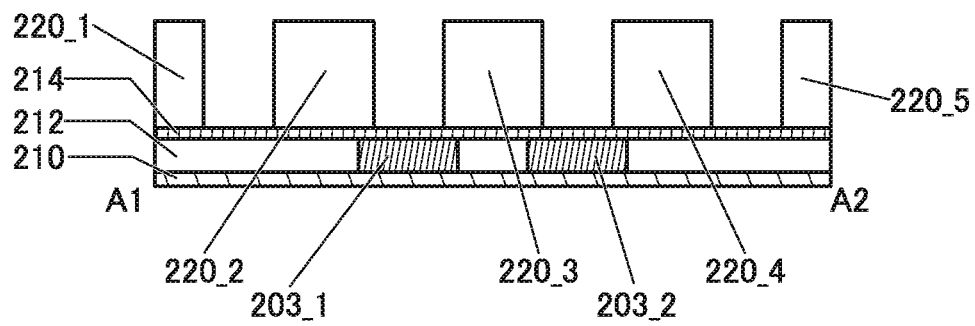

Here, an enlarged view of a region including a channel and the vicinity of the channel of the transistor 200a in FIG. 2B is shown in FIG. 12.

As illustrated in FIG. 12, the oxide 230 includes a region 234 functioning as a channel formation region of the transistor 200a, and a region 231 (a region 231a and a region 231b) functioning as the source or the drain of the transistor 200a. In FIG. 12, the vicinity of the region 234 is denoted by a dashed line. Although FIG. 12 shows the region 234 near the center of the oxide 230 for clarity of the drawing, the position of the region 234 is not limited to this and may be the vicinity of the interface between the oxide 230 and the insulator 250, the vicinity of the interface between the oxide 230 and the insulators 220_2, 220_3, and 214, or the whole of the oxide 230 in the range denoted by the dashed line.

The region 231 functioning as the source or the drain has a low oxygen concentration, a high carrier density, and a reduced resistance. The region 234 functioning as the channel formation region has a higher oxygen concentration and a lower carrier density than the region 231 functioning as the source or the drain, namely, the region 234 is a high-resistance region.

Note that at least a surface and the vicinity of the surface of the region 231 in the oxide 230 need to have a lower resistance.

Note that to form each region of the oxide 230 in the transistor 200a, an impurity or a metal element may be added to the oxide 230 with the conductor 260_2 used as a mask so that a low-resistance region can be formed in a self-aligned manner. In the transistor 200b, an impurity or a metal element may be added to the oxide 230 with the conductor 260_3 used as a mask so that a low-resistance region can be formed in a self-aligned manner. Thus, in the case where a plurality of semiconductor devices each including the transistors 200a and 200b are formed at the same time, variations in electrical characteristics between the semiconductor devices can be reduced.

As illustrated in FIG. 12, the channel length of the transistor 200a is substantially the same as the length of the region 234. The length of the region 234 is approximately equal to the sum of the length of a region where each side surface of the conductor 260_2 overlaps with the oxide 230 with the insulator 250 therebetween and the length of a region where the short side of the conductor 260_2 overlaps with the oxide 230 with the insulator 250 therebetween. That is, the channel length of the transistor 200a can be longer than a length 260 W of the short side of the conductor 260_2. The approximate length of the region 234 is denoted by the dashed line in FIG. 12.

Since the channel length of the transistor 200a can be longer than the length 260 W, the short-channel effect can be reduced even when the transistor 200a is miniaturized and the length 260 W decreases. Note that the channel length of the transistor 200a is set to greater than or equal to 1.5 times and less than or equal to 10 times larger than the length 260 W.

Note that the aforementioned structure and effect of the transistor 200a can be referred to for the structure and effect of the transistor 200b.

Specific structures of the transistors 200a and 200b of one embodiment of the present invention will be described below. Note that also in the following description, the structure of the transistor 200a can be referred to for the structure of the transistor 200b.

The conductor 203_1 functioning as a second gate of the transistor 200a is positioned to overlap with the oxide 230 and the conductor 260_2.

Here, the conductor 260_2 functions as the first gate of the transistor 200a in some cases.

Note that the potential applied to the conductor 203_1 may be the ground potential or a given potential that is different from the potential applied to the conductor 260_2. For example, the threshold voltage of the transistor 200a can be controlled when the potential applied to the conductor 203_1 changes independently of the potential applied to the conductor 260_2. In particular, when a negative potential is applied to the conductor 203_1, the threshold voltage of the transistor 200a can be higher than 0 V, and the off-state current can be reduced. Accordingly, a drain current with a voltage of 0 V applied to the conductor 260_2 can be reduced.

The potential applied to the conductor 203_1 may be equal to the potential applied to the conductor 260_2. When the potential applied to the conductor 203_1 is equal to the potential applied to the conductor 260_2, the conductor 203_1 may be provided such that, in the channel width direction, the length of the conductor 203_1 is larger than that of the region 234 in the oxide 230. It is particularly preferable that the conductor 203_1 extend beyond the end portion of the region 234 in the oxide 230 in the channel width direction. That is, outside the side surface of the oxide 230 in the channel width direction, the conductor 203_1 and the conductor 260_2 preferably overlap with each other with the insulators positioned therebetween.

The insulator 210 can function as a barrier insulating film that prevents impurities such as water and hydrogen from entering the transistors from a lower layer. The insulator 210 is preferably formed using an insulating material having a function of inhibiting the passage of impurities such as water and hydrogen. For example, silicon nitride, aluminum oxide, hafnium oxide, an oxide containing silicon and hafnium (hafnium silicate), or an oxide containing aluminum and hafnium (hafnium aluminate) is preferably used for the insulator 210. This can inhibit diffusion of impurities such as hydrogen and water into a layer positioned above the insulator 210. Note that the insulator 210 preferably has a function of inhibiting the passage of at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. The same applies to an insulating material having a function of inhibiting the passage of impurities in the description below.

Furthermore, for the insulator 210, an insulating material that has a function of inhibiting the passage of oxygen (e.g., an oxygen atom and an oxygen molecule) is preferably used. In that case, oxygen contained in the insulator 214 or the like can be inhibited from diffusing into lower layers.

The insulator 250 can function as a first gate insulating film of the transistor 200a, and the insulator 214 can function as a second gate insulating film of the transistor 200a. Although the insulator 214 has a single-layer structure in the transistor 200a, the present invention is not limited thereto. For example, the insulator 214 may have a stacked structure of two or more layers.

For the oxide 230, a metal oxide functioning as an oxide semiconductor (hereinafter also referred to as an oxide semiconductor) is preferably used. The metal oxide preferably has an energy gap of 2 eV or more, preferably 2.5 eV or more. The use of the metal oxide having such a wide energy gap allows a reduction in the off-state current of the transistor.

A transistor including an oxide semiconductor has an extremely low leakage current in an off state; thus, a semiconductor device with low power consumption can be provided. In addition, an oxide semiconductor can be deposited by a sputtering method or the like and thus can be used for a transistor included in a highly integrated semiconductor device.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also called a metal oxide in some cases. Moreover, a metal oxide containing nitrogen may be called a metal oxynitride.

Here, when the oxide semiconductor contains a metal element such as aluminum, ruthenium, titanium, tantalum, chromium, or tungsten in addition to the constituent element of the oxide semiconductor, the oxide semiconductor becomes a metal compound to have a reduced resistance in some cases. Note that aluminum, titanium, tantalum, tungsten, or the like is preferably used. To add the metal element to the oxide semiconductor, for example, a metal film containing the metal element, a nitride film containing the metal element, or an oxide film containing the metal element is provided over the oxide semiconductor. When such a film is provided, some oxygen in the oxide semiconductor at and in the vicinity of an interface between the film and the oxide semiconductor is absorbed by the film or the like to form an oxygen vacancy, which might reduce the resistance of the oxide semiconductor at and in the vicinity of the interface.

The periphery of an oxygen vacancy formed at and in the vicinity of the interface has a distortion. When the above film is formed by a sputtering method with a sputtering gas containing a rare gas, the rare gas might enter the oxide semiconductor during the formation of the film. When the rare gas enters the oxide semiconductor, a distortion or a structural disorder is caused at and in the vicinity of the interface and around the rare gas. The rare gas is, for example, He or Ar. Note that Ar is preferable to He because its atomic radius is larger than that of He. When Ar enters the oxide semiconductor, a distortion or a structural disorder is suitably caused. In a region with such a distortion or a structural disorder, the number of metal atoms bonded to a small number of oxygen atoms probably increases. When the number of metal atoms bonded to a small number of oxygen atoms increases, the resistance at and in the vicinity of the interface and around the rare gas is reduced in some cases.

In the case where a crystalline oxide semiconductor is used as the oxide semiconductor, a region with the distortion or the structural disorder has broken crystallinity and seems like an amorphous oxide semiconductor in some cases.

After the metal film, the nitride film containing the metal element, or the oxide film containing the metal element is provided over the oxide semiconductor, heat treatment is preferably performed in an atmosphere containing nitrogen. By the heat treatment in the atmosphere containing nitrogen, the metal element diffuses from the metal film, the nitride film containing the metal element, or the oxide film containing the metal element into the oxide semiconductor; thus, the metal element can be added to the oxide semiconductor.

In the case where hydrogen in the oxide semiconductor diffuses into a low-resistance region of the oxide semiconductor and enters an oxygen vacancy in the low-resistance region, the hydrogen becomes relatively stable. It is known that hydrogen in an oxygen vacancy in an oxide semiconductor is released from the oxygen vacancy by heat treatment at 250° C. or higher, diffuses into a low-resistance region of the oxide semiconductor, enters an oxygen vacancy in the low-resistance region, and becomes relatively stable. Thus, by the heat treatment, the resistance of the low-resistance region in the oxide semiconductor tends to be further reduced, and the other region with the resistance maintained in the oxide semiconductor tends to be highly purified (reduced in the amount of impurities such as water and hydrogen) and to have an increased resistance.

When containing an impurity element such as hydrogen or nitrogen, an oxide semiconductor has an increased carrier density. Hydrogen contained in the oxide semiconductor reacts with oxygen bonded to a metal atom to be water, and thus forms an oxygen vacancy in some cases. Entry of hydrogen into the oxygen vacancy increases carrier density. Furthermore, in some cases, bonding of part of hydrogen to oxygen bonded to a metal atom causes generation of an electron functioning as a carrier. That is, the resistance of an oxide semiconductor containing nitrogen or hydrogen is reduced.

Hence, selective addition of a metal element and an impurity element such as hydrogen and nitrogen to the oxide semiconductor allows a high-resistance region and a low-resistance region to be formed in the oxide semiconductor. In other words, when the resistance of the oxide 230 is selectively reduced, a region functioning as a semiconductor having a low carrier density and low-resistance regions functioning as the source and the drain can be formed in the oxide 230.

[Transistor 140a and Transistor 140b]

As illustrated in FIGS. 1A and 1B and FIGS. 2A and 2B, the transistors 140a and 140b are different from the aforementioned transistors 200a and 200b in including neither the conductor 203_1 functioning as the second gate of the transistor 200a nor the conductor 203_2 functioning as the second gate of the transistor 200b. The other structures of the transistors 140a and 140b are similar to those of the transistors 200a and 200b.

As illustrated in FIGS. 1A and 1B and FIGS. 2A and 2B, the transistors 140a and 140b are positioned to hold the ends of the transistors 200a and 200b in the A1-A2 direction. That is, the transistor 140a is positioned to be adjacent to the A1 side of the transistor 200a and the transistor 140b is positioned to be adjacent to the A2 side of the transistor 200b.

For example, in the case where a semiconductor device includes a plurality of memory cells each provided with the transistor 200a, the transistor 200b, the capacitor 100a, and the capacitor 100b, and the memory cells are continuously positioned in the A1-A2 direction and the A5-A6 direction in FIGS. 1A and 1B and FIGS. 2A and 2B, electric conduction is established between the transistors in adjacent memory cells that share the oxide 230.

The transistors 140a and 140b electrically isolate the memory cells adjacent to each other. In other words, the transistor 140a has a function of cutting the electric conduction to the memory cell adjacent to the A1 side whereas the transistor 140b has a function of cutting the electric conduction to the memory cell adjacent to the A2 side. These functions are realized when the transistors 140a and 140b are always off. To make the transistors 140a and 140b always off, a potential at which the transistor 140a is turned off is applied to a conductor 260_1 functioning as a first gate of the transistor 140a, and a potential at which the transistor 140b is turned off is applied to a conductor 260_4 functioning as a first gate of the transistor 140b.

Figure 6A:
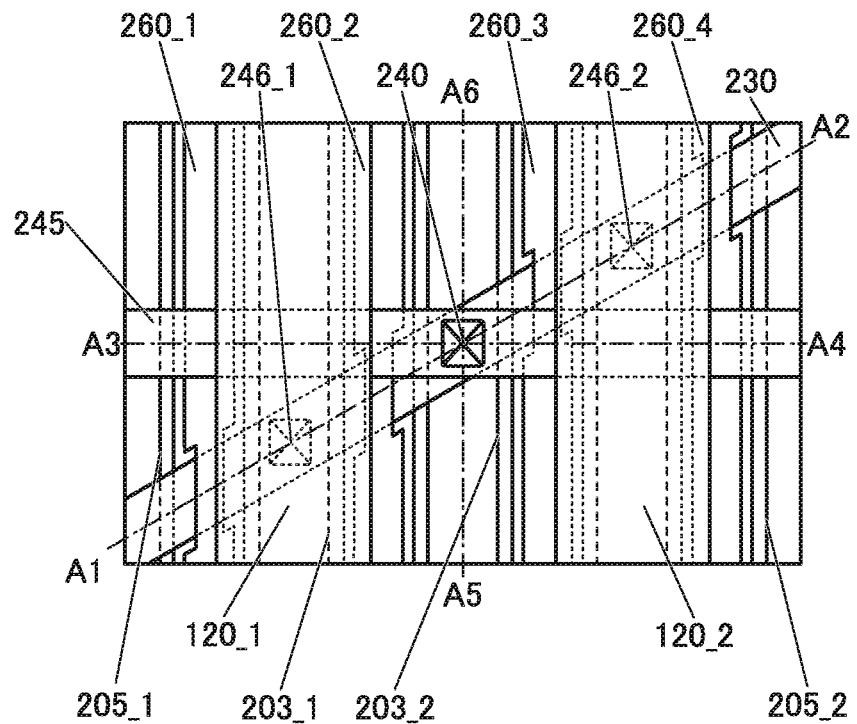
FIGS. 6A and 6B are a top view and a cross-sectional view of a semiconductor device of one embodiment of the present invention.
Figure 6B:
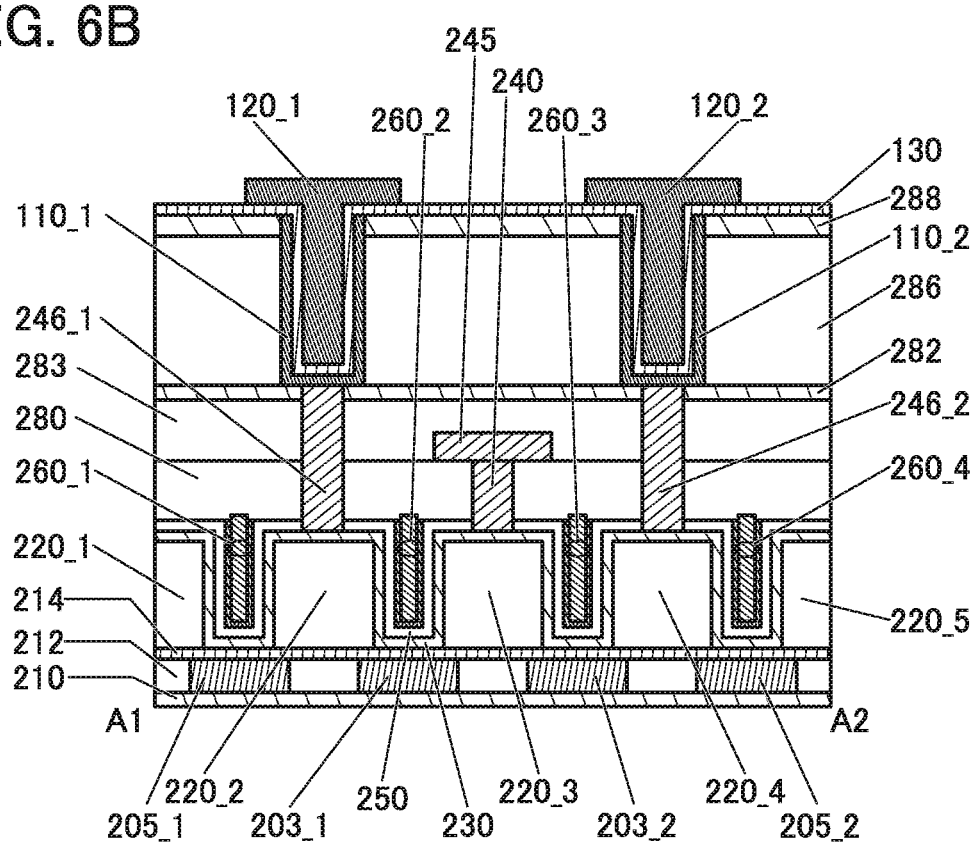
Figure 7:
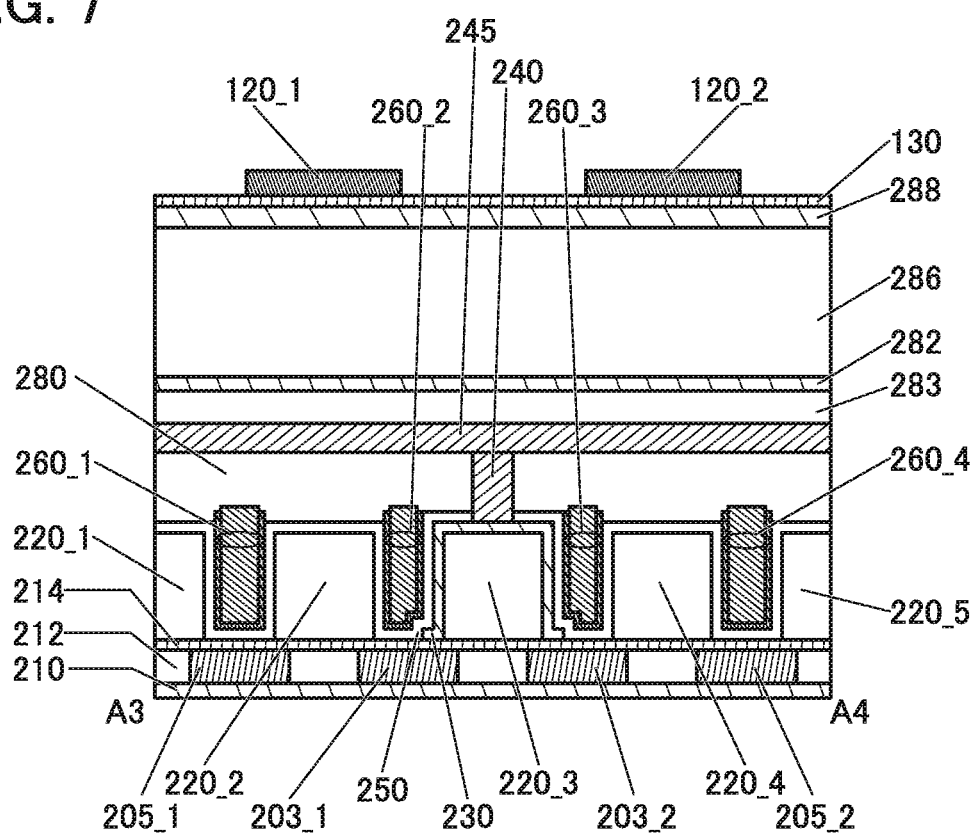
FIG. 7 is a cross-sectional view of a semiconductor device of one embodiment of the present invention.

As illustrated in FIGS. 6A and 6B and FIG. 7, a conductor 205_1 functioning as a second gate of the transistor 140a and a conductor 205_2 functioning as a second gate of the transistor 140b may be provided. With such a structure, for example, when a negative potential is applied to each of the conductors 205_1 and 205_2, the transistors 140a and 140b can be turned off with a low potential applied to each of the conductors 260_1 and 260_4. In addition, the off-state current can be reduced.

Alternatively, the conductors 205_1 and 260_1 may be connected to each other and receive the same potential and the conductors 205_2 and 260_4 may be connected to each other and receive the same potential.

[Capacitor 100a and Capacitor 100b]

As illustrated in FIGS. 1A and 1B and FIGS. 2A and 2B, the capacitor 100a is provided above the transistor 200a to overlap with the transistor 200a with the conductor 246_1 therebetween. Similarly, the capacitor 100b is provided above the transistor 200b to overlap with the transistor 200b with the conductor 246_2 therebetween.

Note that the components of the capacitor 100b correspond to those of the capacitor 100a. Thus, in drawings, the corresponding components in the capacitors 100a and 100b are basically denoted by the same three-digit reference numerals. Unless otherwise specified, the description for the capacitor 100a can be referred to for the capacitor 100b.

The capacitor 100a has a structure in which the conductor 110_1 functioning as a lower electrode and the conductor 120_1 functioning as an upper electrode face each other with the insulator 130 functioning as a dielectric interposed therebetween at a bottom surface and a side surface of an opening in the insulator 286. Accordingly, the capacitance per unit area can be increased.

In particular, with the deeper opening of the insulator 286, the capacitor 100a can have larger capacitance without an increase in its projected area. Therefore, the capacitor 100a preferably has a cylinder shape (i.e., the side surface area is larger than the bottom surface area).

The insulator 130 preferably has a high dielectric constant. For example, an insulator containing an oxide of one or both of aluminum and hafnium can be used. Aluminum oxide, hafnium oxide, an oxide containing aluminum and hafnium (hafnium aluminate), or the like is preferably used for the insulator containing an oxide of one or both of aluminum and hafnium.

The insulator 130 may have a stacked-layer structure of, for example, two or more of silicon oxide, silicon oxynitride, silicon nitride oxide, silicon nitride, aluminum oxide, hafnium oxide, an oxide containing aluminum and hafnium (hafnium aluminate), and the like. For example, hafnium oxide, aluminum oxide, and hafnium oxide are preferably stacked in this order by an ALD method. The thickness of each of the hafnium oxide and the aluminum oxide is greater than or equal to 0.5 nm and less than or equal to 5 nm. With such a stacked-layer structure, the capacitor 100a can have a large capacitance value and a low leakage current.

<Substrate>

As a substrate over which the transistors are formed, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. Any of the above semiconductor substrates that includes an insulator region, e.g., a silicon on insulator (SOI) substrate, can also be used. Examples of the conductor substrate include a graphite substrate, a metal substrate, an alloy substrate, and a conductive resin substrate. A substrate including a nitride of a metal, a substrate including an oxide of a metal, or the like can also be used. An insulator substrate provided with a conductor or a semiconductor, a semiconductor substrate provided with a conductor or an insulator, a conductor substrate provided with a semiconductor or an insulator, or the like may be used. Alternatively, any of these substrates over which an element is provided may be used. Examples of the element provided over the substrate include a capacitor, a resistor, a switching element, a light-emitting element, and a memory element.

A flexible substrate may be used as the substrate. To provide a transistor over a flexible substrate, after the transistor is formed over a non-flexible substrate, the transistor may be separated and transferred to a flexible substrate. In that case, a separation layer is preferably provided between the non-flexible substrate and the transistor. As the substrate, a sheet, a film, or a foil containing a fiber may be used. The substrate may have elasticity. The substrate may also have a property of returning to its original shape when bending or pulling is stopped. Alternatively, the substrate may have a property of not returning to its original shape. The substrate has a region with a thickness of, for example, greater than or equal to 5 μm and less than or equal to 700 μm, preferably greater than or equal to 10 μm and less than or equal to 500 μm, and further preferably greater than or equal to 15 μm and less than or equal to 300 μm. When the substrate has a small thickness, the weight of the semiconductor device including the transistor can be reduced. When the substrate has a small thickness, even in the case of using glass or the like, the substrate may have elasticity or a property of returning to its original shape when bending or pulling is stopped. This can reduce the impact or the like applied to the semiconductor device over the substrate due to dropping or the like. That is, a robust semiconductor device can be provided.

For the substrate which is a flexible substrate, metal, an alloy, a resin, glass, or fiber thereof can be used, for example. The flexible substrate preferably has a lower coefficient of linear expansion because deformation due to an environment is suppressed. The flexible substrate is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon and aramid), polyimide, polycarbonate, and acrylic. In particular, aramid is preferably used for the flexible substrate because of its low coefficient of linear expansion.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

The transistor can have stable electrical characteristics when surrounded by an insulator that has a function of inhibiting the passage of oxygen and impurities such as hydrogen. For example, an insulator that has a function of inhibiting the passage of oxygen and impurities such as hydrogen may be used as each of the insulators 210 and 282.

The insulator that has a function of inhibiting the passage of oxygen and impurities such as hydrogen can have, for example, a single-layer structure or a stacked-layer structure of an insulator including boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

For example, the insulators 210 and 282 may be formed using a metal oxide such as aluminum oxide, magnesium oxide, gallium oxide, germanium oxide, yttrium oxide, zirconium oxide, lanthanum oxide, neodymium oxide, hafnium oxide, an oxide containing silicon and hafnium, an oxide containing aluminum and hafnium, or tantalum oxide, silicon nitride oxide, or silicon nitride. Note that, for example, the insulators 210 and 282 preferably contain aluminum oxide and hafnium oxide.

The insulators 214 and 250 preferably include an insulator with a high dielectric constant. For example, the insulators 214 and 250 preferably include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, or a nitride containing silicon and hafnium.

Alternatively, the insulators 214 and 250 each preferably have a stacked-layer structure of silicon oxide or silicon oxynitride and an insulator with a high dielectric constant. Because silicon oxide and silicon oxynitride have thermal stability, a combination of silicon oxide or silicon oxynitride with an insulator with a high dielectric constant allows the stacked-layer structure to be thermally stable and have a high dielectric constant. For example, when aluminum oxide, gallium oxide, or hafnium oxide in the insulator 250 is in contact with the oxide 230, entry of silicon included in silicon oxide or silicon oxynitride into the oxide 230 can be reduced. Furthermore, for example, when silicon oxide or silicon oxynitride in the insulator 250 is in contact with the oxide 230, trap centers might be formed at the interface between aluminum oxide, gallium oxide, or hafnium oxide and the silicon oxide or the silicon oxynitride. The trap centers can shift the threshold voltage of the transistor in the positive direction by trapping electrons, in some cases.

The insulator 212, an insulator 220 (an insulator 220_1, the insulator 220_2, the insulator 220_3, the insulator 220_4, and an insulator 220_5), the insulator 280, the insulator 283, and the insulator 286 preferably include an insulator with a low dielectric constant. For example, the insulators 212, 220, 280, 283, and 286 preferably include silicon oxide, silicon oxynitride, silicon nitride oxide, silicon oxide to which fluorine is added, silicon oxide to which carbon is added, silicon oxide to which carbon and nitrogen are added, porous silicon oxide, a resin, or the like. Alternatively, each of the insulators 212, 220, 280, 283, and 286 preferably has a stacked-layer structure of a resin and one of the following materials: silicon oxide, silicon oxynitride, silicon nitride oxide, silicon oxide to which fluorine is added, silicon oxide to which carbon is added, silicon oxide to which carbon and nitrogen are added, and porous silicon oxide. Because silicon oxide and silicon oxynitride have thermal stability, a combination of silicon oxide or silicon oxynitride with a resin allows the stacked-layer structure to be thermally stable and have a low dielectric constant. Examples of the resin include polyester, polyolefin, polyamide (e.g., nylon and aramid), polyimide, polycarbonate, and acrylic.

<Conductor>

A conductor 203 (the conductor 203_1 and the conductor 203_2), a conductor 205 (the conductor 205_1 and the conductor 205_2), a conductor 260 (the conductor 260_1, the conductor 260_2, the conductor 260_3, and the conductor 260_4), the conductor 240, the conductor 245, and a conductor 246 (the conductor 246_1 and the conductor 246_2) can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like. Alternatively, a semiconductor having a high electric conductivity typified by polycrystalline silicon containing an impurity element such as phosphorus, or silicide such as nickel silicide may be used.

Especially for the conductor 260, a conductive material containing oxygen and a metal element included in a metal oxide that can be used for the oxide 230 may be used. A conductive material containing the above metal element and nitrogen may also be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may also be used. With the use of such a material, hydrogen contained in the oxide 230 can be captured in some cases. Hydrogen that enters from an external insulator or the like can be captured in some cases.

Conductive layers formed with the above materials may be stacked. For example, a stacked-layer structure combining a material containing the above-described metal element and a conductive material containing oxygen may be used. Alternatively, a stacked-layer structure combining a material containing the above-described metal element and a conductive material containing nitrogen may be used. Further alternatively, a stacked-layer structure combining a material containing the above-described metal element, a conductive material containing oxygen, and a conductive material containing nitrogen may be used.

Note that in the case where an oxide is used for the channel formation region of the transistor, a stacked-layer structure combining a material containing the above-described metal element and a conductive material containing oxygen is preferably used for the gate. In this case, the conductive material containing oxygen is preferably formed on the channel formation region side. When the conductive material containing oxygen is provided on the channel formation region side, oxygen released from the conductive material is easily supplied to the channel formation region.

<Metal Oxide>

As the oxide 230, a metal oxide functioning as an oxide semiconductor (hereinafter also referred to as an oxide semiconductor) is preferably used. A metal oxide that can be used for the semiconductor layer and the oxide 230 of one embodiment of the present invention is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide that contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

[Structure of Metal Oxide]

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, a lattice arrangement is distorted and thus formation of a grain boundary is inhibited. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a stacked-layer structure) in which a layer containing indium and oxygen (hereinafter, an In layer) and a layer containing the element M, zinc, and oxygen (hereinafter, an (M, Zn) layer) are stacked. Note that indium and the element M can be replaced with each other, and when the element M of the (M, Zn) layer is replaced with indium, the layer can also be referred to as an (In, M, Zn) layer. When indium of the In layer is replaced with the element M, the layer can also be referred to as an (In, M) layer.

The CAAC-OS is an oxide semiconductor with high crystallinity. On the other hand, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide semiconductor, depending on an analysis method.

The a-like OS has a structure intermediate between those of the nc-OS and the amorphous oxide semiconductor. The a-like OS has a void or a low-density region. That is, the a-like OS has lower crystallinity than the nc-OS and the CAAC-OS.

An oxide semiconductor can have any of various structures which show different properties. Two or more of the amorphous oxide semiconductor, the polycrystalline oxide semiconductor, the a-like OS, the nc-OS, and the CAAC-OS may be included in an oxide semiconductor of one embodiment of the present invention.

<Method for Manufacturing Semiconductor Device>

Next, a manufacturing method of the semiconductor device of one embodiment of the present invention that includes the transistor 200a, the transistor 200b, the capacitor 100a, and the capacitor 100b is described with reference to FIG. 13A to FIG. 21B. In FIG. 13A to FIG. 21B, Figure A is a top view, and Figure B is a cross-sectional view taken along dashed-dotted line A1-A2 in Figure A.

First, a substrate (not illustrated) is prepared, and the insulator 210 is deposited over the substrate. The insulator 210 can be deposited by a sputtering method, a chemical vapor deposition (CVD) method, a molecular beam epitaxy (MBE) method, a pulsed laser deposition (PLD) method, an ALD method, or the like.

Note that CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

The PECVD method enables a high-quality film to be obtained at a relatively low temperature. The thermal CVD method does not use plasma and thus causes less plasma damage to an object. For example, a wiring, an electrode, an element (e.g., a transistor or a capacitor), or the like included in a semiconductor device might be charged up by receiving charges from plasma. In that case, accumulated charges might break the wiring, electrode, element, or the like included in the semiconductor device. By contrast, such plasma damage is not caused and the yield of semiconductor devices can be increased with the thermal CVD method which does not use plasma. Furthermore, a film with few defects can be obtained with the thermal CVD method because plasma damage during film formation is not caused.

The ALD method also causes less damage to an object. Since the ALD method does not cause plasma damage during film formation, a film with few defects can be obtained.

Unlike in the film formation method in which particles ejected from a target or the like are deposited, a film is formed by reaction at a surface of an object in the CVD method and the ALD method. Thus, the CVD method and the ALD method can provide good step coverage almost regardless of the shape of an object. In particular, the ALD method enables excellent step coverage and excellent thickness uniformity and can be suitably used for covering a surface of an opening with a high aspect ratio, for example. Note that the ALD method has a relatively low film formation rate; thus, in some cases, the ALD method is preferably combined with another film formation method with a high film formation rate, such as the CVD method.

The composition of a film obtained by the CVD method and the ALD method can be controlled with the flow rate ratio of source gases. For example, with the CVD method and the ALD method, a film with a certain composition can be formed by adjusting the flow rate ratio of source gases. Moreover, for example, when a film is formed while the flow rate ratio of source gases is changed in the CVD method and the ALD method, the obtained film can have a continuously changing composition. The time taken for a film to be formed while the flow rate ratio of source gases is changed can be shorter than the time taken for a film to be formed in a plurality of deposition chambers because transfer and pressure adjustment are not necessary. Hence, the productivity of semiconductor devices can be improved in some cases.

For example, aluminum oxide is deposited as the insulator 210 by a sputtering method. The insulator 210 may have a multilayer structure: for example, an aluminum oxide film is formed by a sputtering method and another aluminum oxide film is formed thereover by an ALD method. Alternatively, an aluminum oxide film is formed by an ALD method and another aluminum oxide is formed thereover by a sputtering method.

Next, a conductive film to be the conductors 203_1 and 203_2 is formed over the insulator 210. The conductive film to be the conductors 203_1 and 203_2 can be formed by a sputtering method, a CVD method, an MBE method, a PLD method, an ALD method, or the like. The conductive film to be the conductors 203_1 and 203_2 may be a multilayer film. A tungsten film is formed as the conductive film to be the conductors 203_1 and 203_2, for example.

Next, the conductive film to be the conductors 203_1 and 203_2 is processed by a lithography method to form the conductors 203_1 and 203_2.

In the lithography method, first, a resist is exposed to light through a mask. Next, a region exposed to light is removed or left using a developing solution, so that a resist mask is formed. Then, etching with the resist mask is conducted, whereby a conductor, a semiconductor, an insulator, or the like can be processed into a desired shape. The resist mask is formed by, for example, exposure of the resist to KrF excimer laser light, ArF excimer laser light, or extreme ultraviolet (EUV) light. A liquid immersion technique may be employed in which a portion between a substrate and a projection lens is filled with a liquid (e.g., water) to perform light exposure. An electron beam or an ion beam may be used instead of the above-mentioned light. Note that a mask is not necessary in the case of using an electron beam or an ion beam. To remove the resist mask, dry etching treatment such as ashing or wet etching treatment can be performed; alternatively, wet etching treatment may be performed after dry etching treatment or dry etching treatment may be performed after wet etching treatment.

A hard mask formed of an insulator or a conductor may be used instead of the resist mask. In the case where a hard mask is used, an insulating film or a conductive film that is a hard mask material is formed over the conductive film to be the conductors 203_1 and 203_2, a resist mask is formed thereover, and then the hard mask material is etched, whereby a hard mask with a desired shape can be formed. The etching of the conductive film to be the conductors 203_1 and 203_2 may be performed after removal of the resist mask or without removal of the resist mask. In the latter case, the resist mask is removed during the etching in some cases. The hard mask may be removed by etching after the etching of the conductive film to be the conductors 203_1 and 203_2. The hard mask does not need to be removed in the case where the hard mask material does not affect the following process or can be utilized in the following process.

As a dry etching apparatus, a capacitively coupled plasma (CCP) etching apparatus including parallel plate electrodes can be used. The capacitively coupled plasma etching apparatus including parallel plate electrodes may have a structure in which high-frequency power is applied to one of the parallel plate electrodes. Alternatively, different high-frequency powers may be applied to one of the parallel plate electrodes. Further alternatively, high-frequency powers with the same frequency may be applied to the parallel plate electrodes. Still further alternatively, high-frequency powers with different frequencies may be applied to the parallel plate electrodes. Alternatively, a dry etching apparatus including a high-density plasma source can be used. As the dry etching apparatus including a high-density plasma source, an inductively coupled plasma (ICP) etching apparatus can be used, for example.

Next, an insulating film to be the insulator 212 is formed over the insulator 210, the conductor 203_1, and the conductor 203_2. The insulating film to be the insulator 212 can be formed by a sputtering method, a CVD method, an MBE method, a PLD method, an ALD method, or the like. For example, as the insulating film to be the insulator 212, silicon oxide is deposited by a CVD method.

Here, the thickness of the insulating film to be the insulator 212 is preferably greater than or equal to the thickness of the conductor 203_1 and the thickness of the conductor 203_2. For example, when the thickness of the conductor 203_1 and the thickness of the conductor 203_2 are each 1, the thickness of the insulating film to be the insulator 212 is greater than or equal to 1 and less than or equal to 3.

Next, chemical mechanical polishing (CMP) treatment is performed on the insulating film to be the insulator 212, so that part of the insulating film to be the insulator 212 is removed and a surface of the conductor 203_1 and a surface of the conductor 203_2 are exposed. Accordingly, the conductors 203_1 and 203_2 and the insulator 212 with flat top surfaces can be formed (see FIGS. 13A and 13B).

A method for forming the conductors 203_1 and 203_2 that is different from the above method is described below.

The insulator 212 is deposited over the insulator 210. The insulator 212 can be deposited by a sputtering method, a CVD method, an MBE method, a PLD method, an ALD method, or the like. Then, openings are formed in the insulator 212 to reach the insulator 210. Examples of the openings include grooves and slits. Regions where the openings are formed may be referred to as opening portions. The openings can be formed by wet etching; however, dry etching is preferable for microfabrication. The insulator 210 is preferably an insulator that functions as an etching stopper film in etching the insulator 212 to form a groove. For example, in the case where a silicon oxide film is used as the insulator 212 in which the groove is to be formed, the insulator 210 is preferably a silicon nitride film, an aluminum oxide film, or a hafnium oxide film.

After the formation of the openings, a conductive film to be the conductors 203_1 and 203_2 is formed. The conductive film desirably contains a conductor that has a function of inhibiting the passage of oxygen. For example, tantalum nitride, tungsten nitride, or titanium nitride can be used. Alternatively, a stacked-layer film of the conductor and tantalum, tungsten, titanium, molybdenum, aluminum, copper, or a molybdenum-tungsten alloy can be used. The conductive film to be the conductors 203_1 and 203_2 can be formed by a sputtering method, a CVD method, an MBE method, a PLD method, an ALD method, or the like.

For example, when the conductive film to be the conductors 203_1 and 203_2 is a multilayer film, a titanium nitride film is stacked over a tantalum nitride film by a sputtering method. Even when a metal that is easily diffused, such as copper, is used for an upper layer of the conductive film to be the conductors 203_1 and 203_2 (described below), the use of such metal nitride for a lower layer of the conductive film to be the conductors 203_1 and 203_2 can prevent diffusion of the metal to the outside from the conductors 203_1 and 203_2.

Next, the upper layer of the conductive film to be the conductors 203_1 and 203_2 is formed. This upper layer of the conductive film can be formed by a plating method, a sputtering method, a CVD method, an MBE method, a PLD method, an ALD method, or the like. For example, a low-resistant conductive material such as copper is formed as the upper layer of the conductive film to be the conductors 203_1 and 203_2.

Next, by CMP treatment, the upper layer and the lower layer of the conductive film to be the conductors 203_1 and 203_2 are partly removed to expose the insulator 212. As a result, the conductive film to be the conductors 203_1 and 203_2 remains only in the openings. In this way, the conductors 203_1 and 203_2 with flat top surfaces can be formed. Note that the insulator 212 is partly removed by the CMP treatment in some cases. The above is the description of the different formation method of the conductors 203_1 and 203_2.

Next, the insulator 214 is formed over the conductors 203_1 and 203_2. The insulator 214 can be deposited by a sputtering method, a CVD method, an MBE method, a PLD method, an ALD method, or the like (see FIGS. 13A and 13B).

Next, heat treatment is preferably performed. The heat treatment is performed at a temperature higher than or equal to 250° C. and lower than or equal to 650° C., preferably higher than or equal to 300° C. and lower than or equal to 500° C., and further preferably higher than or equal to 320° C. and lower than or equal to 450° C. The heat treatment is performed in a nitrogen atmosphere, an inert gas atmosphere, or an atmosphere containing an oxidizing gas at 10 ppm or more, 1% or more, or 10% or more. The heat treatment may be performed under a reduced pressure. Alternatively, the heat treatment may be performed in such a manner that heat treatment is performed in a nitrogen atmosphere or an inert gas atmosphere, and then another heat treatment is performed in an atmosphere containing an oxidizing gas at 10 ppm or more, 1% or more, or 10% or more in order to compensate for released oxygen. By the heat treatment, impurities such as hydrogen and water included in the insulators 212 and 214 can be removed, for example. In the heat treatment, plasma treatment using oxygen may be performed under a reduced pressure. The plasma treatment using oxygen is preferably performed with an apparatus including a power source for generating high-density plasma using microwaves, for example. Alternatively, a power source for applying a radio frequency (RF) to a substrate side may be provided. Note that the heat treatment is not necessarily performed in some cases.

Next, an insulating film to be the insulator 220 (the insulator 220_1, the insulator 220_2, the insulator 220_3, the insulator 220_4, and the insulator 220_5) is formed. The insulating film to be the insulator 220 can be formed by a sputtering method, a CVD method, an MBE method, a PLD method, an ALD method, or the like.

Then, the insulating film to be the insulator 220 is processed by a lithography method to form the insulator 220 (the insulator 220_1, the insulator 220_2, the insulator 220_3, the insulator 220_4, and the insulator 220_5). Here, the insulator 220 is positioned so that a region between the insulator 220_2 and the insulator 220_3 overlaps with the conductor 203_1 and a region between the insulator 220_3 and the insulator 220_4 overlaps with the conductor 203_2 (see FIGS. 13A and 13B).

Figure 14A:
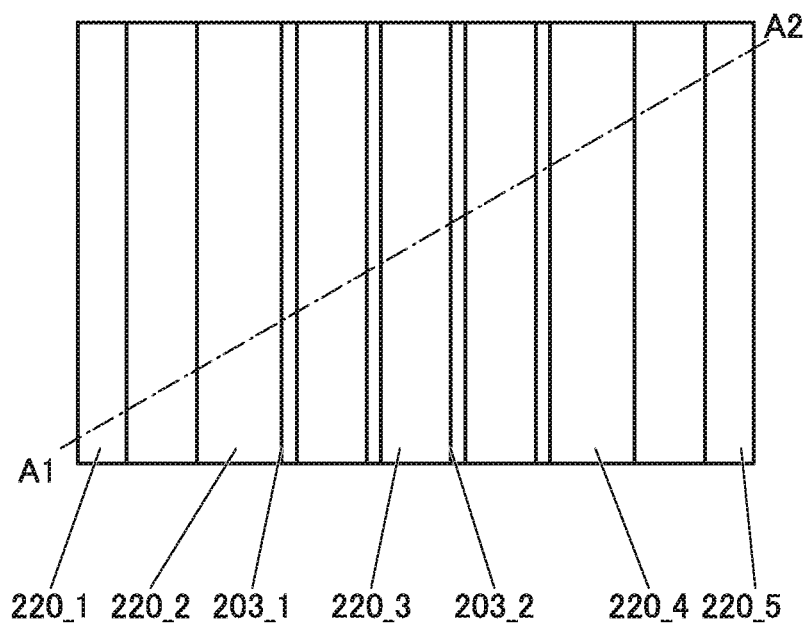
FIGS. 14A and 14B are a top view and a cross-sectional view illustrating a method for manufacturing a semiconductor device of one embodiment of the present invention.
Figure 14B:
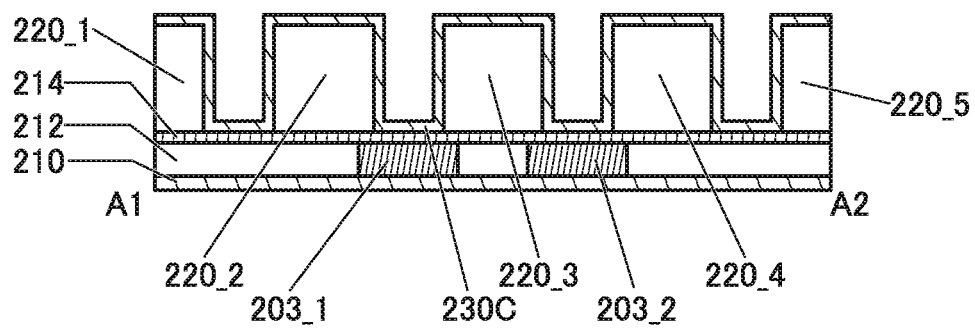

Next, an oxide film 230C is formed to cover the insulator 214 and the insulator 220 (see FIGS. 14A and 14B). The oxide film 230C can be formed by a sputtering method, a CVD method, an MBE method, a PLD method, an ALD method, or the like.

For example, in the case where the oxide film 230C is formed by a sputtering method, oxygen or a mixed gas of oxygen and a rare gas is used as a sputtering gas. An increase in the proportion of oxygen in the sputtering gas can increase the amount of excess oxygen contained in the oxide film to be formed. In the case where the oxide film 230C is formed by a sputtering method, an In-M-Zn oxide target can be used.

In particular, in the formation of the oxide film 230C, part of oxygen contained in the sputtering gas is supplied to the insulator 214, in some cases.

Note that the proportion of oxygen in the sputtering gas for forming the oxide film 230C is 70% or higher, preferably 80% or higher, and further preferably 100%.

In the case where the oxide film 230C is formed by a sputtering method, for example, a target with an atomic ratio of In:Ga:Zn=4:2:4.1, a target with an atomic ratio of In:Ga:Zn=1:1:1, or a target with an atomic ratio of In:Ga:Zn=1:1:0.5 is used.

Although the oxide film 230C has a single-layer structure in this embodiment, the present invention is not limited to this. For example, the oxide film 230C may have a stacked structure of two, three, or four or more layers. In the case where the stacked structure is formed by a sputtering method, targets with different atomic ratios of In to Ga and Zn may be used. Alternatively, the stacked structure may be formed while the proportion of oxygen in a sputtering gas is changed. Further alternatively, the stacked structure may be formed while the atomic ratio of In to Ga and Zn and the proportion of oxygen in a sputtering gas change.

Next, heat treatment may be performed. This heat treatment can be performed under the conditions similar to those for the above heat treatment. By the heat treatment, for example, impurities such as water and hydrogen contained in the oxide film 230C can be removed. For example, treatment is performed in a nitrogen atmosphere at 400° C. for one hour, and another treatment is successively performed in an oxygen atmosphere at 400° C. for one hour.

Figure 15A:
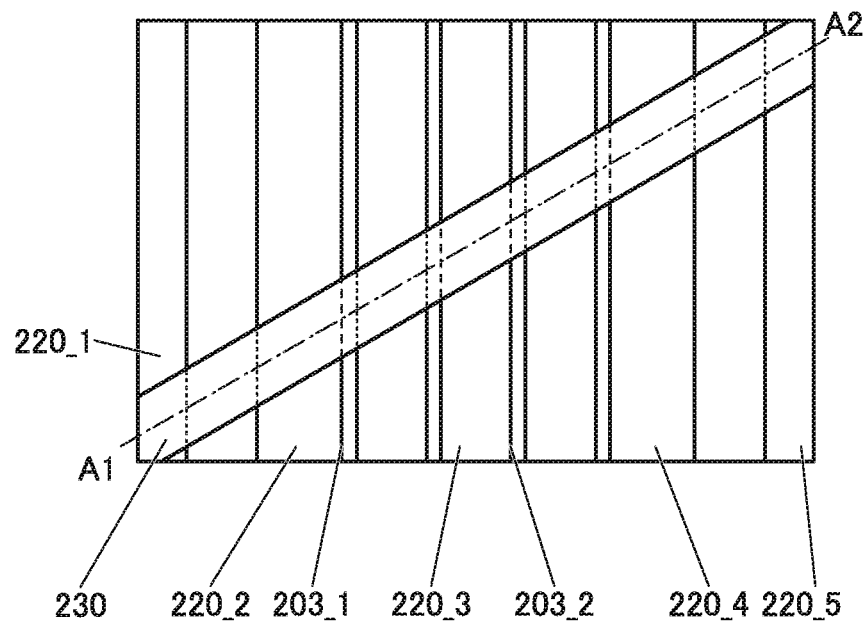
FIGS. 15A and 15B are a top view and a cross-sectional view illustrating a method for manufacturing a semiconductor device of one embodiment of the present invention.
Figure 15B:
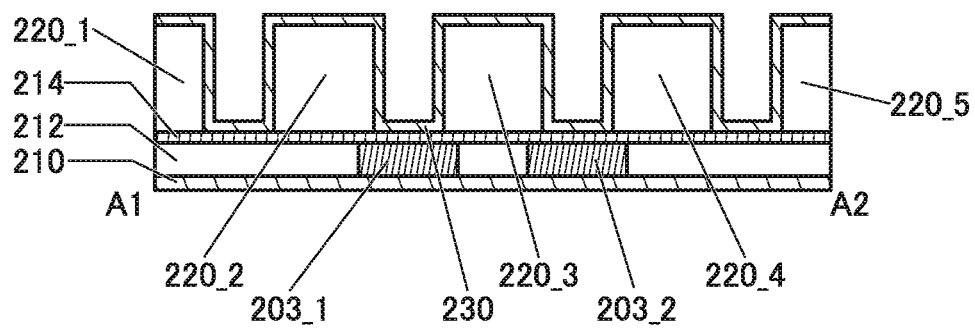

Then, the oxide film 230C is processed to form the oxide 230 (see FIGS. 15A and 15B).

Here, as illustrated in FIG. 15A, the oxide 230 is formed so that the angle between the long side of the oxide 230 and the long side of the insulator 220 is greater than or equal to 20° and less than or equal to 70°, preferably greater than or equal to 30° and less than or equal to 60°. In addition, the oxide 230 is formed to at least partly overlap with the conductor 203.

Note that the oxide film can be processed by a lithography method. The processing can be performed by a dry etching method or a wet etching method. A dry etching method is suitable for microfabrication.

As an etching mask, a hard mask formed of an insulator or a conductor may be used instead of a resist mask. In the case where a hard mask is used, an insulating film or a conductive film that is a hard mask material is formed over the oxide film 230C, a resist mask is formed thereover, and then the hard mask material is etched, whereby a hard mask with a desired shape can be formed. The etching of the oxide film 230C may be performed after removal of the resist mask or without removal of the resist mask. In the latter case, the resist mask is removed during the etching in some cases. The hard mask may be removed by etching after the etching of the oxide film 230C.

In some cases, the above treatment such as dry etching causes the attachment or diffusion of impurities due to an etching gas or the like to a surface or an inside of the oxide 230 or the like. Examples of the impurities include fluorine and chlorine.

In order to remove the impurities, cleaning is performed. As the cleaning, any of wet cleaning using a cleaning solution or the like, plasma treatment using plasma, cleaning by heat treatment, and the like can be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed.

Next, heat treatment may be performed. This heat treatment can be performed under the conditions similar to those for the above heat treatment.

Figure 16A:
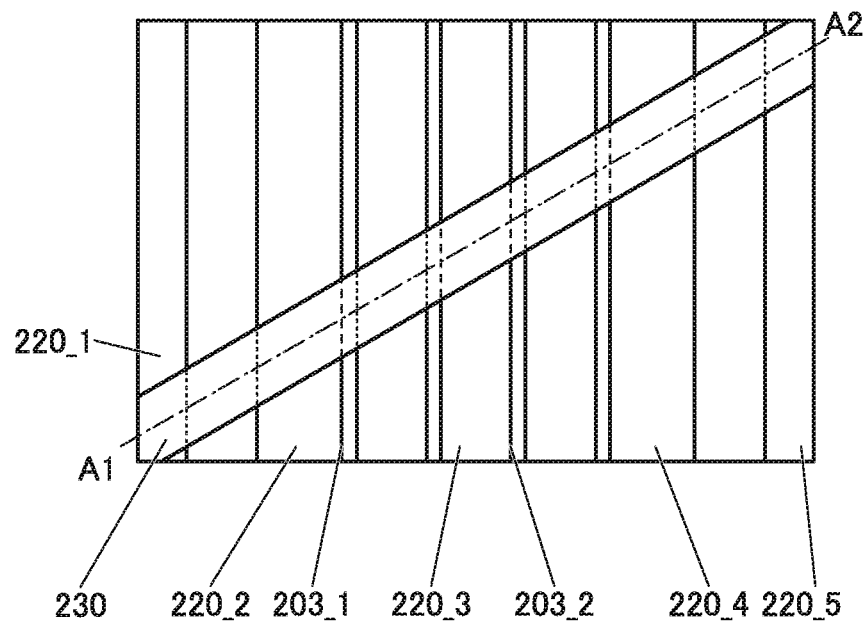
FIGS. 16A and 16B are a top view and a cross-sectional view illustrating a method for manufacturing a semiconductor device of one embodiment of the present invention.
Figure 16B:
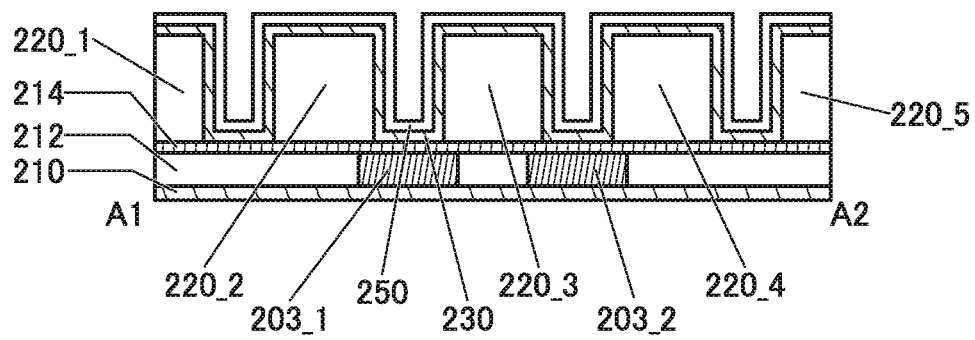

Then, the insulator 250 is deposited over the insulator 214, the insulator 220, and the oxide 230 (see FIGS. 16A and 16B). The insulator 250 can be deposited by a sputtering method, a CVD method, an MBE method, a PLD method, an ALD method, or the like. Here, the insulator 250 may have a stacked-layer structure. For example, in the case where the insulator 250 has a two-layer structure, a second layer of the insulator 250 is formed by a sputtering method in an atmosphere containing oxygen, whereby oxygen can be added to a first layer of the insulator 250.

Here, heat treatment may be performed. This heat treatment can be performed under the conditions similar to those for the above heat treatment. The heat treatment can reduce the moisture concentration and the hydrogen concentration in the insulator 250.

Figure 17A:
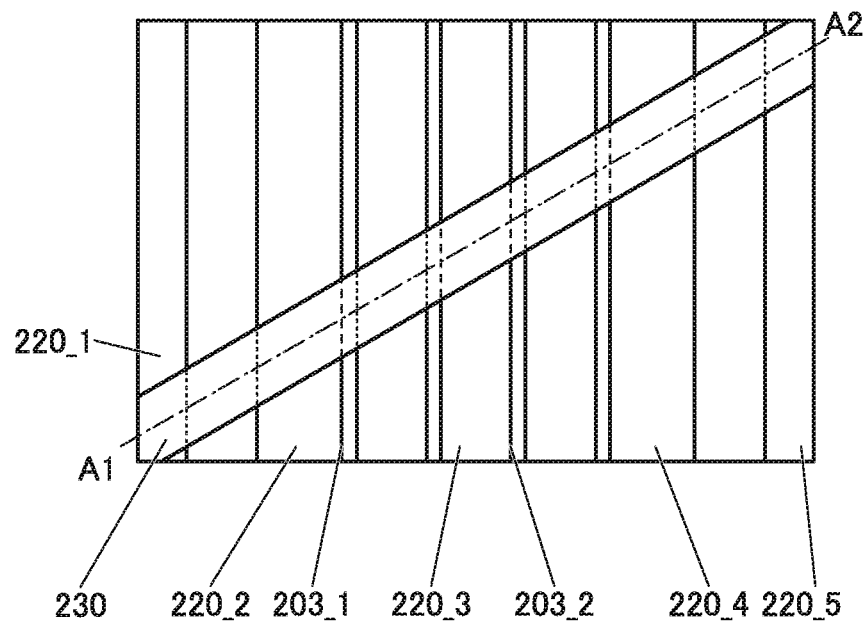
FIGS. 17A and 17B are a top view and a cross-sectional view illustrating a method for manufacturing a semiconductor device of one embodiment of the present invention.
Figure 17B:
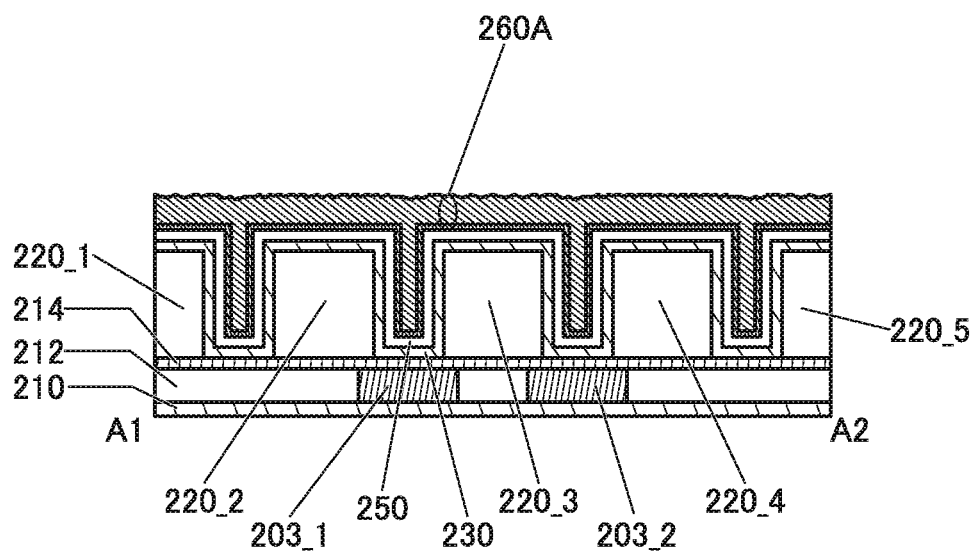

Next, a conductive film 260A is formed over the insulator 250 (see FIGS. 17A and 17B). The conductive film 260A can be formed by a sputtering method, a CVD method, an MBE method, a PLD method, an ALD method, or the like. The conductive film 260A may have a stacked structure of two or more layers. In this embodiment, titanium nitride is deposited by a CVD method or an ALD method, and then, tungsten is deposited by a CVD method.

Figure 18A:
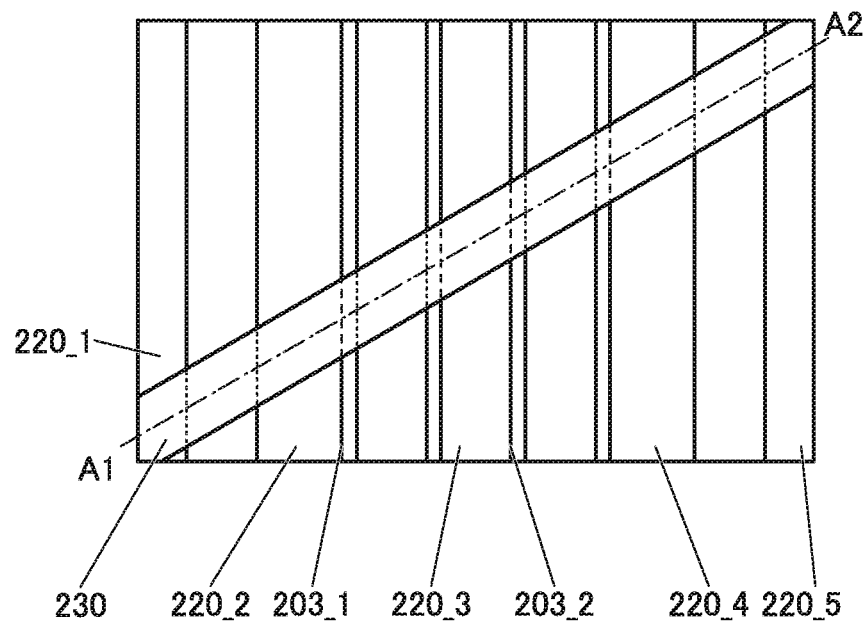
FIGS. 18A and 18B are a top view and a cross-sectional view illustrating a method for manufacturing a semiconductor device of one embodiment of the present invention.
Figure 18B:
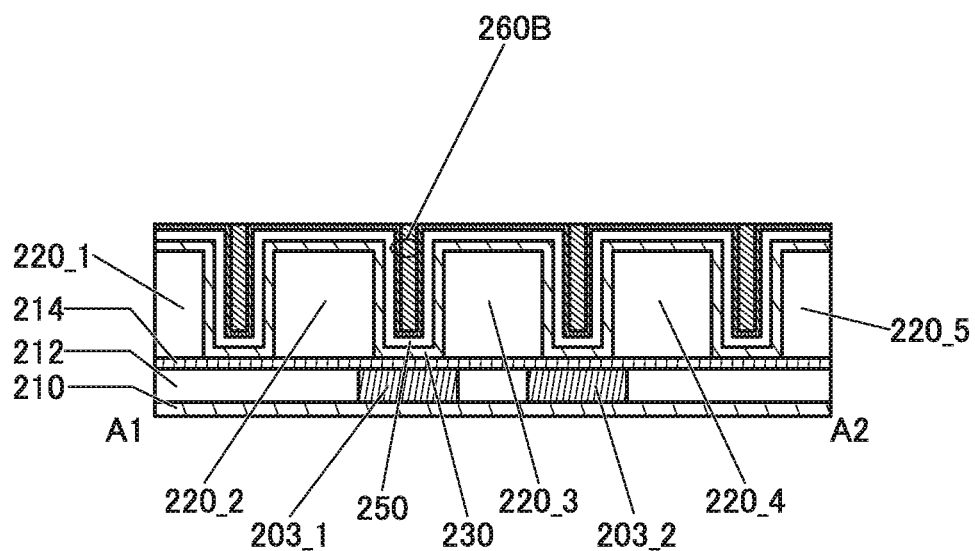

Next, CMP treatment is performed to remove part of the conductive film 260A and expose part of a first layer of the conductive film 260A, whereby a conductor 260B is formed (see FIGS. 18A and 18B).

Figure 19A:
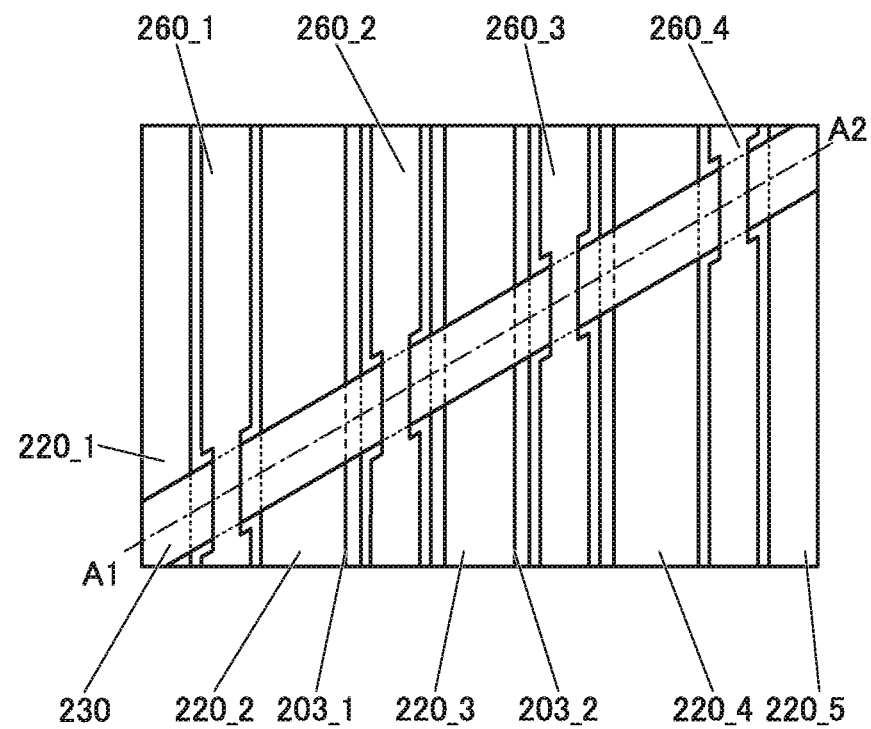
FIGS. 19A and 19B are a top view and a cross-sectional view illustrating a method for manufacturing a semiconductor device of one embodiment of the present invention.
Figure 19B:
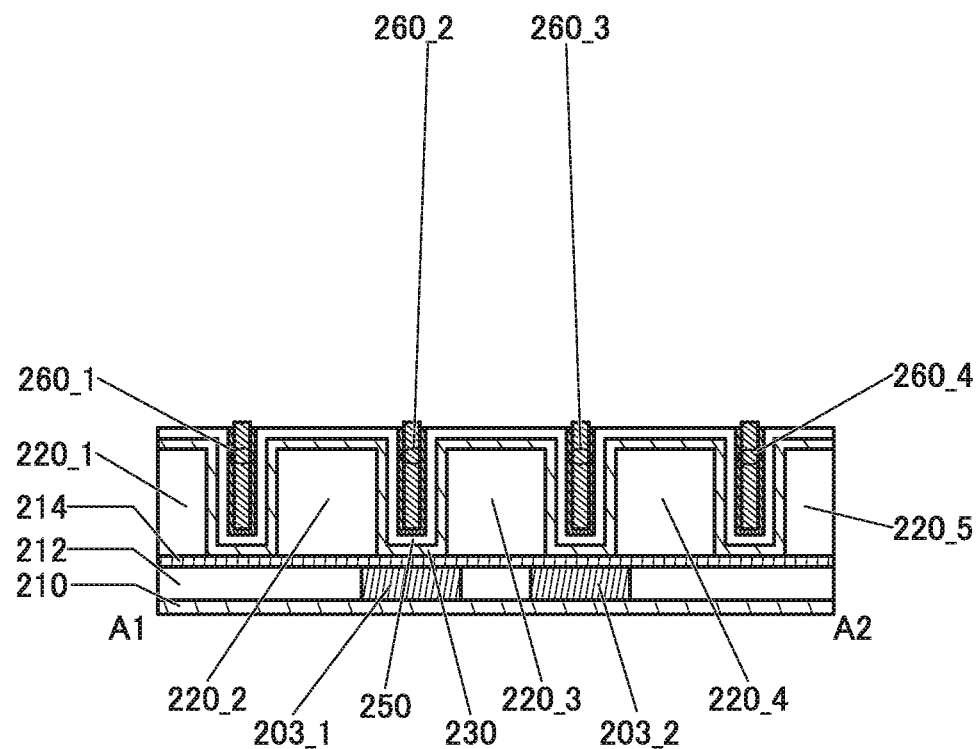
Figure 20A:
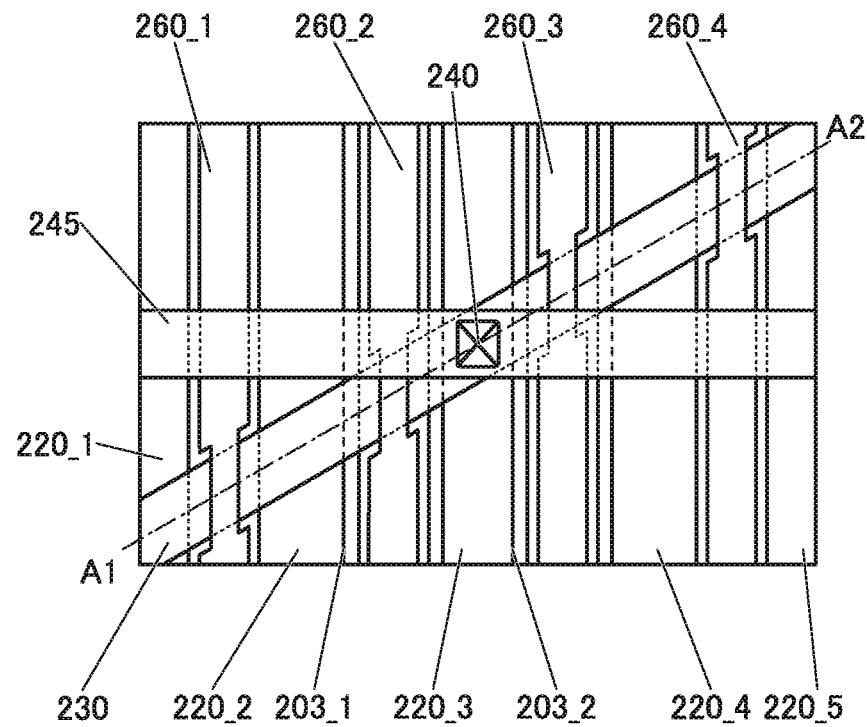
FIGS. 20A and 20B are a top view and a cross-sectional view illustrating a method for manufacturing a semiconductor device of one embodiment of the present invention.
Figure 20B:
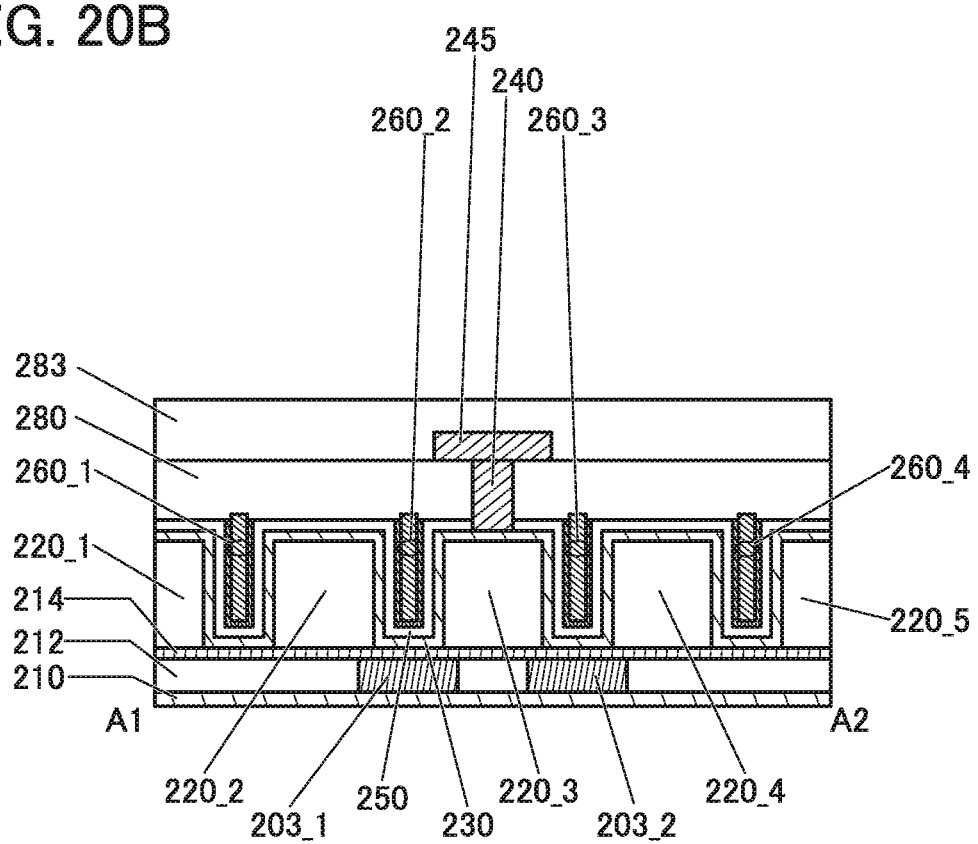
Figure 21A:
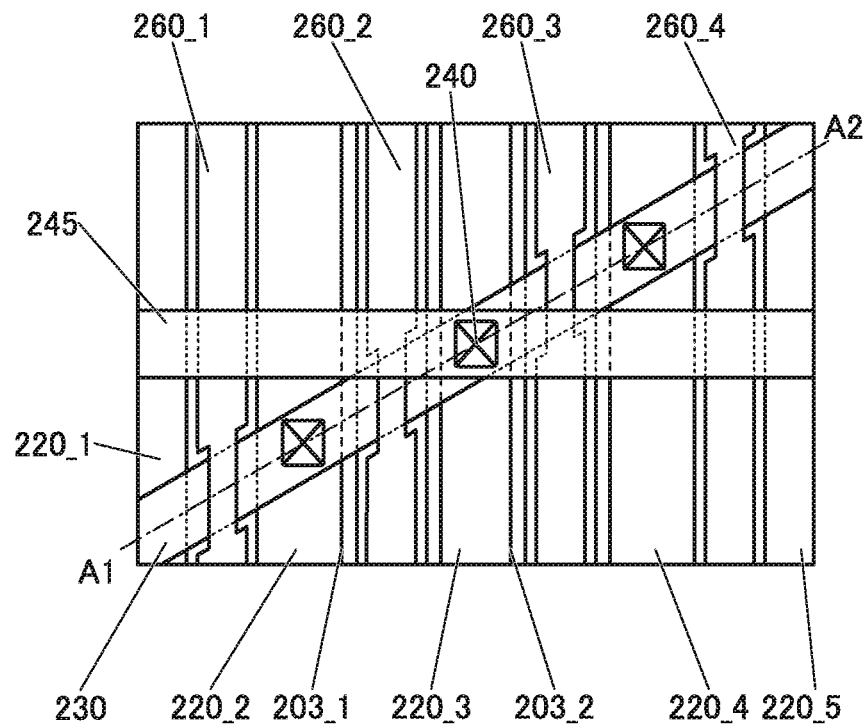
FIGS. 21A and 21B are a top view and a cross-sectional view illustrating a method for manufacturing a semiconductor device of one embodiment of the present invention.
Figure 21B:
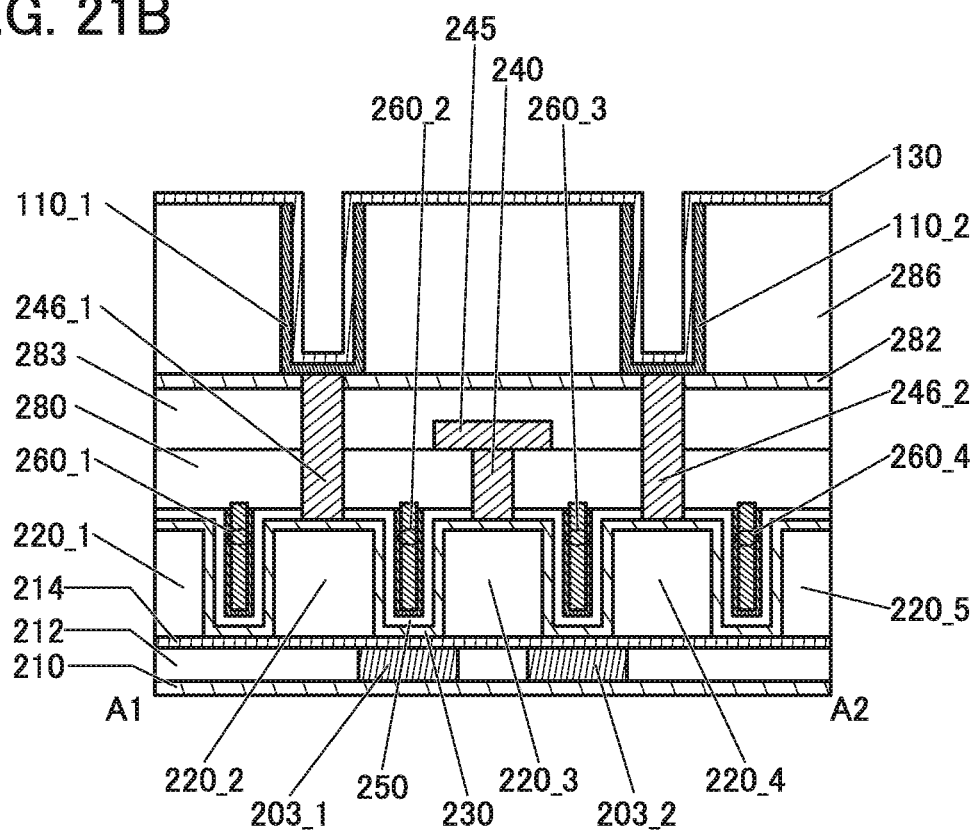

Then, the exposed first layer of the conductive film 260A, that is, the first layer of the conductive film 260A in a region overlapping with the top surface of the insulator 220, is etched to form the conductor 260 (the conductor 260_1, the conductor 260_2, the conductor 260_3, and the conductor 260_4) (see FIGS. 19A and 19B).

Next, the insulator 280 is formed. The insulator 280 can be formed by a sputtering method, a CVD method, an MBE method, a PLD method, an ALD method, or the like. Alternatively, the insulator 280 can be formed by a spin coating method, a dipping method, a droplet discharge method (such as an ink-jet method), a printing method (such as screen printing or offset printing), a doctor knife method, a roll coater method, a curtain coater method, or the like. In this embodiment, silicon oxynitride is used for the insulator 280.

The insulator 280 is preferably formed to have a flat top surface. For example, the insulator 280 may have a flat top surface right after the formation. Alternatively, the insulator 280 may be planarized by removing the insulator or the like from the top surface after the formation so that the top surface becomes parallel to a reference surface such as a rear surface of the substrate. Such treatment is referred to as planarization treatment. As the planarization treatment, CMP treatment, dry etching treatment, or the like can be performed. In this embodiment, CMP treatment is used as the planarization treatment (see FIGS. 20A and 20B).

Note that the insulator 280 has a single-layer structure in the drawings, but may have a stacked structure of two or more layers. For example, to reduce the warpage of the substrate, a layer having compressive stress and a layer having tensile stress may be stacked to cancel the internal stress.

Next, an opening reaching the region 231b of the oxide 230 is formed in the insulator 280. Since the opening has a high aspect ratio, anisotropic etching with a hard mask is preferably performed in this step. Note that dry etching is preferable as the anisotropic etching for forming the opening with a high aspect ratio.

Here, the region 231b may be subjected to ion implantation by an ion implantation method, an ion doping method by which an ionized source gas is added without mass separation, a plasma immersion ion implantation method, or the like. Ions can reach only a part of the region 231b that is exposed through the opening because they are blocked by the insulator 280. In other words, ions can be implanted into the region 231b in a self-aligned manner. This ion implantation can increase the carrier density of the region 231b, and thus the contact resistance between the conductor 240 and the region 231b can be reduced in some cases.

Next, a conductive film to be the conductor 240 is formed. The conductive film to be the conductor 240 desirably has a stacked-layer structure which includes a conductor having a function of inhibiting the passage of impurities such as water and hydrogen. For example, a stacked-layer structure of tantalum nitride, titanium nitride, or the like and tungsten, molybdenum, copper, or the like can be employed. The conductive film to be the conductor 240 can be deposited by a sputtering method, a CVD method, an MBE method, a PLD method, an ALD method, or the like.

Next, CMP treatment is performed to remove the conductive film to be the conductor 240 that is over the insulator 280. As a result, the conductive film remains only in the opening, so that the conductor 240 having a flat top surface can be formed (see FIGS. 20A and 20B).

The conductor 240 may be formed after aluminum oxide is formed on a side wall portion of the opening. The aluminum oxide formed on the side wall portion of the opening can inhibit the passage of oxygen from the outside to prevent oxidation of the conductor 240. Furthermore, impurities such as water and hydrogen can be prevented from diffusing from the conductor 240 to the outside. The aluminum oxide can be formed by forming aluminum oxide in the opening by an ALD method or the like and then performing anisotropic etching.

Next, a conductive film to be the conductor 245 is formed. The conductive film to be the conductor 245 can be formed by a sputtering method, a CVD method, an MBE method, a PLD method, an ALD method, or the like. Then, the conductive film to be the conductor 245 is processed by a lithography method to form the conductor 245 (see FIGS. 20A and 20B).

Then, the insulator 283 is formed. The insulator 283 can be formed in a manner similar to that for forming the insulator 280. In this embodiment, silicon oxynitride is used for the insulator 283.

The insulator 283 is preferably formed to have a flat top surface. For example, the insulator 283 may have a flat top surface right after the formation. Alternatively, the insulator 283 may be planarized by removing the insulator or the like from the top surface after the formation so that the top surface becomes parallel to a reference surface such as a rear surface of the substrate. As the planarization treatment, CMP treatment, dry etching treatment, or the like can be performed. In this embodiment, CMP treatment is used as the planarization treatment (see FIGS. 20A and 20B).

Next, the insulator 282 is formed over the insulator 283. The insulator 282 can be deposited by a sputtering method, a CVD method, an MBE method, a PLD method, an ALD method, or the like. For example, aluminum oxide is deposited as the insulator 282 by a sputtering method (see FIGS. 21A and 21B).

Next, openings reaching the region 231a of the oxide 230 are formed in the insulators 280, 283, and 282. Since the openings each have a high aspect ratio, anisotropic etching with a hard mask is preferably performed in this step. Note that dry etching is preferable as the anisotropic etching for forming the openings each with a high aspect ratio.

Here, the region 231a may be subjected to ion implantation by an ion implantation method, an ion doping method by which an ionized source gas is added without mass separation, a plasma immersion ion implantation method, or the like. Ions are blocked by the insulators 280, 283, and 282, and thus can reach only parts of the region 231a that are exposed through the openings. In other words, ions can be implanted into the region 231a in a self-aligned manner. This ion implantation can increase the carrier density of the region 231a, and thus the contact resistance between the conductors 246_1 and 246_2 and the region 231a can be reduced in some cases.

Next, a conductive film to be the conductors 246_1 and 246_2 is formed. The conductive film to be the conductors 246_1 and 246_2 desirably has a stacked-layer structure which includes a conductor having a function of inhibiting the passage of impurities such as water and hydrogen. For example, a stacked-layer structure of tantalum nitride, titanium nitride, or the like and tungsten, molybdenum, copper, or the like can be employed. The conductive film to be the conductors 246_1 and 246_2 can be formed by a sputtering method, a CVD method, an MBE method, a PLD method, an ALD method, or the like.

Next, CMP treatment is performed to remove the conductive film to be the conductors 246_1 and 246_2 that is over the insulator 282. As a result, the conductive film remains only in the openings, so that the conductors 246_1 and 246_2 having flat top surfaces can be formed (see FIGS. 21A and 21B).

The conductors 246_1 and 246_2 may be formed after aluminum oxide is formed on side wall portions of the openings. The aluminum oxide formed on the side wall portions of the openings can inhibit the passage of oxygen from the outside to prevent oxidation of the conductors 246_1 and 246_2. Furthermore, impurities such as water and hydrogen can be prevented from diffusing from the conductors 246_1 and 246_2 to the outside. The aluminum oxide can be formed by forming aluminum oxide in the openings by an ALD method or the like and then performing anisotropic etching.

Then, the insulator 286 is formed. The insulator 286 can be formed in a manner similar to that for forming the insulator 280. In this embodiment, silicon oxynitride is used for the insulator 286.

Note that the insulator 286 has a single-layer structure in the drawings, but may have a stacked structure of two or more layers. For example, a two-layer structure including silicon oxynitride and silicon nitride, which are stacked in this order, may be employed. The silicon nitride can be sometimes used as a stopper layer in CMP treatment in the following process.

Next, an opening reaching at least the top surface of the conductor 246_1 and an opening reaching at least the top surface of the conductor 246_2 are formed in the insulator 286. Since the openings each have a high aspect ratio, anisotropic etching with a hard mask is preferably performed in this step. Note that dry etching is preferable as the anisotropic etching for forming the openings each with a high aspect ratio.

Next, a conductive film to be the conductors 110_1 and 110_2 is formed in the openings. The conductive film can be formed by a sputtering method, a CVD method, an MBE method, a PLD method, an ALD method, or the like. In this embodiment, a titanium nitride film is formed by an ALD method.

Then, an insulator (not illustrated) is formed over the conductive film to be the conductors 110_1 and 110_2. The insulator can be deposited by a sputtering method, a CVD method, an MBE method, a PLD method, an ALD method, or the like.

Next, CMP treatment is performed to remove the insulator and the conductive film to be the conductors 110_1 and 110_2 that are over the insulator 286. Then, the insulator remaining in the openings is etched, whereby the conductors 110_1 and 110_2 can be formed (see FIGS. 21A and 21B).

The insulator 286 preferably has a layered structure of silicon oxynitride and silicon nitride as described above, in which case the silicon nitride functions as a stopper film in the CMP treatment and improved productivity and reduced production variation can be achieved. FIGS. 6A and 6B and FIG. 7 illustrate an example of the semiconductor device including a two-layer insulator: the insulator 286 and an insulator 288 stacked in this order.

Next, the insulator 130 is formed over the insulator 286, the conductor 110_1, and the conductor 110_2. The insulator 130 can be deposited by a sputtering method, a CVD method, an MBE method, a PLD method, an ALD method, or the like (see FIGS. 21A and 21B).

Then, a conductive film to be the conductors 120_1 and 120_2 is formed. The conductor can be deposited by a sputtering method, a CVD method, an MBE method, a PLD method, an ALD method, or the like.

Next, CMP treatment is performed on the conductive film to be the conductors 120_1 and 120_2, so that a surface of the conductive film to be the conductors 120_1 and 120_2 is planarized. At this time, the CMP treatment may be performed on an insulator formed over the conductive film to be the conductors 120_1 and 120_2 to remove the insulator, and then, the surface of the conductive film to be the conductors 120_1 and 120_2 may be planarized.

Next, the conductive film to be the conductors 120_1 and 120_2 is processed by a lithography method to form the conductors 120_1 and 120_2.

Figure 4A:
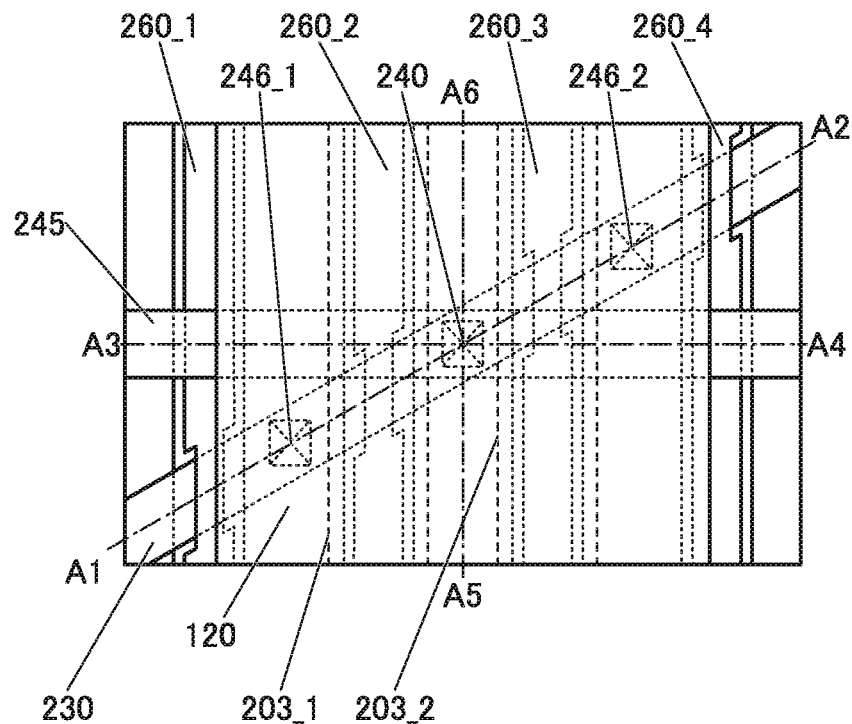
FIGS. 4A and 4B are a top view and a cross-sectional view of a semiconductor device of one embodiment of the present invention.
Figure 4B:
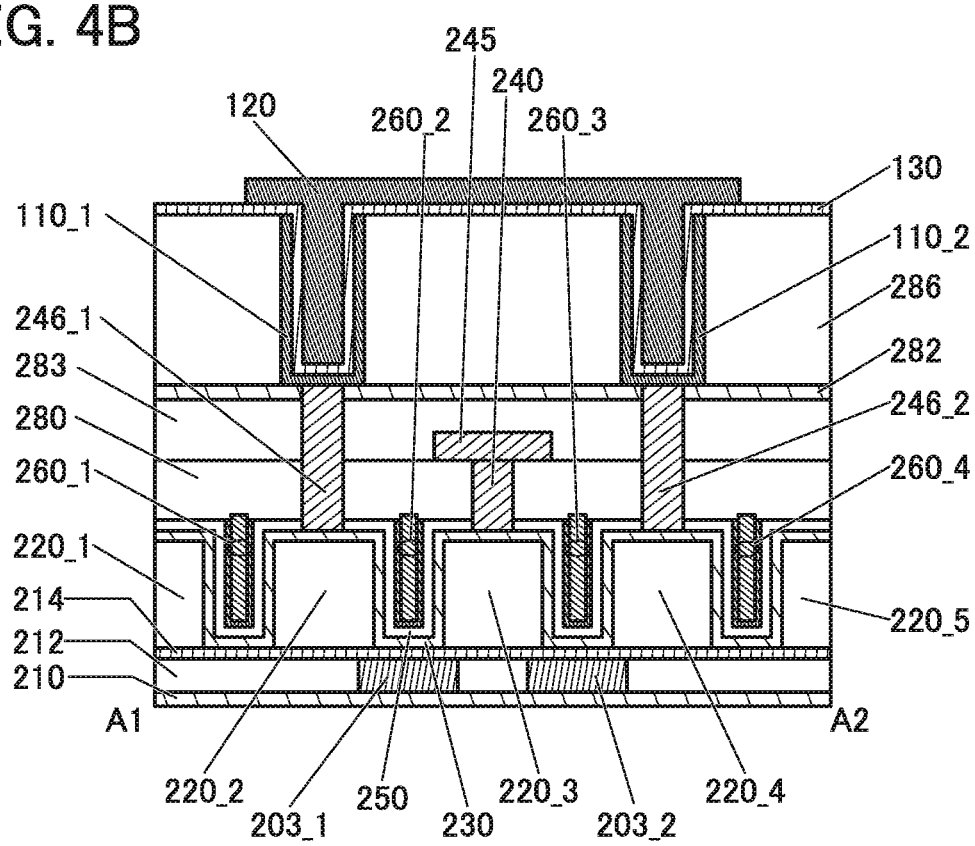
Figure 5:
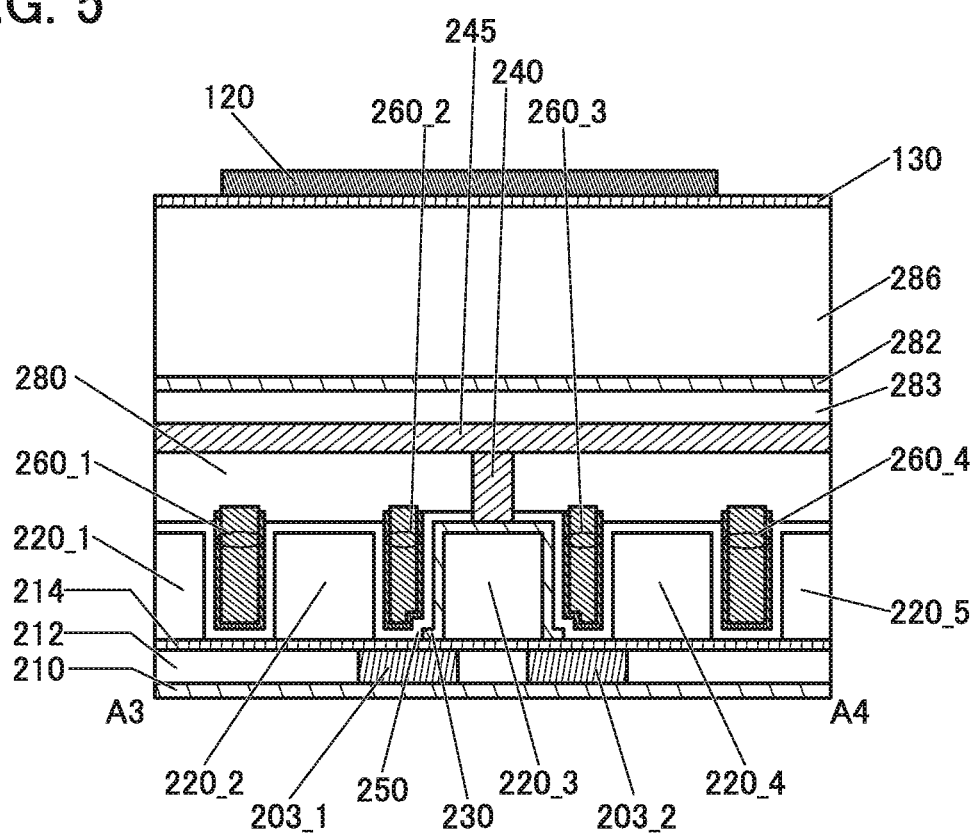
FIG. 5 is a cross-sectional view of a semiconductor device of one embodiment of the present invention.

Here, as illustrated in FIGS. 4A and 4B and FIG. 5, the conductors 120_1 and 120_2 may be formed as one conductor 120 without separation.

Through the above steps, the semiconductor device including the transistors 200a, 200b, 140a, and 140b and the capacitors 100a and 100b, which is illustrated in FIGS. 1A and 1B, FIGS. 2A and 2B, and FIG. 3, can be manufactured.

Modification Example of Semiconductor Device

Figure 8A:
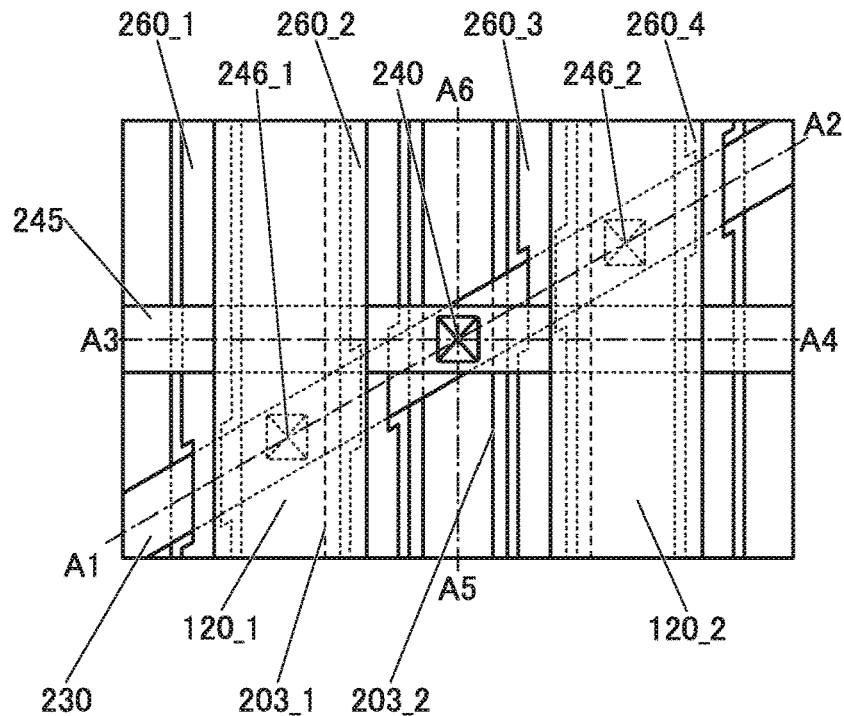
FIGS. 8A and 8B are a top view and a cross-sectional view of a semiconductor device of one embodiment of the present invention.
Figure 8B:
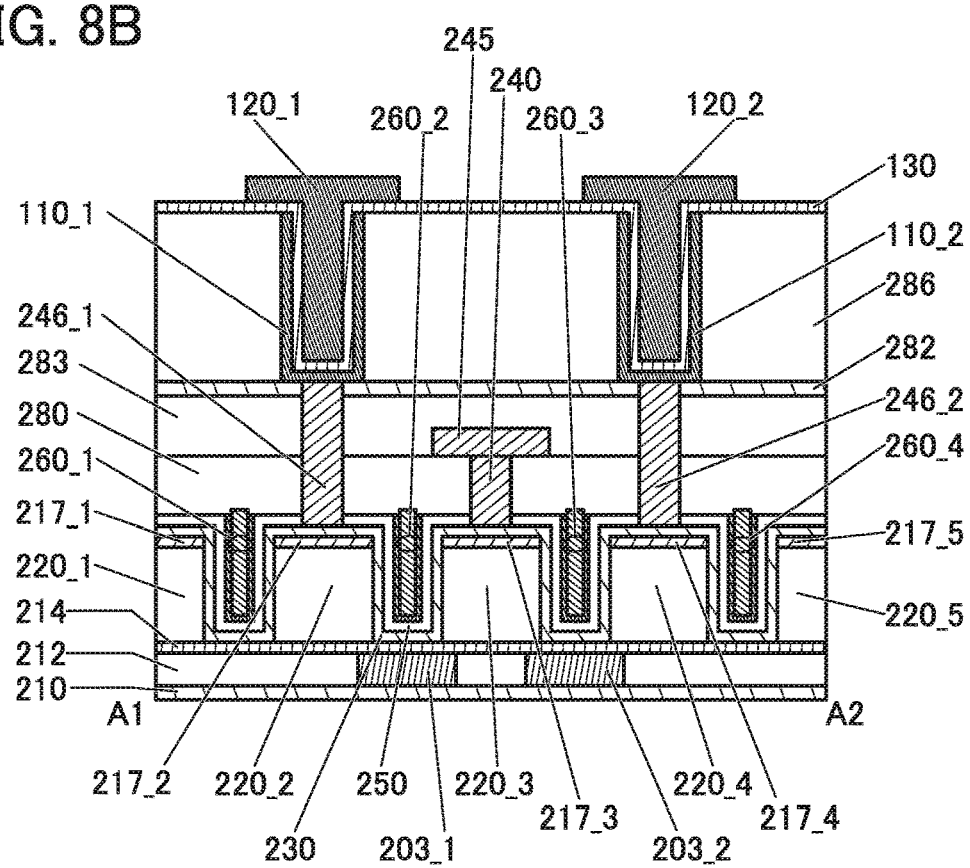
Figure 9:
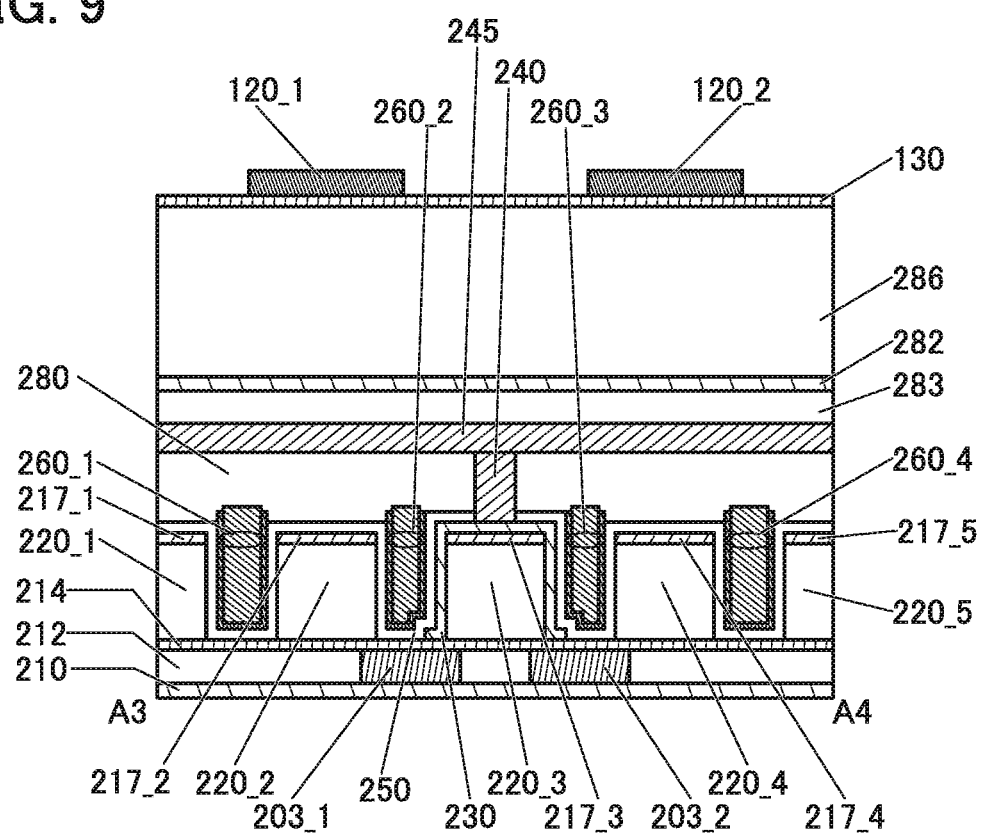
FIG. 9 is a cross-sectional view of a semiconductor device of one embodiment of the present invention.

FIGS. 8A and 8B and FIG. 9 illustrate an example of the semiconductor device including the transistors 200a, 200b, 140a, and 140b and the capacitors 100a and 100b. FIG. 8A is a top view of the semiconductor device. Note that some films are not illustrated in FIG. 8A for simplification of the drawing. FIG. 8B is a cross-sectional view taken along dashed-dotted line A1-A2 in FIG. 8A. FIG. 9 is a cross-sectional view taken along dashed-dotted line A3-A4 in FIG. 8A.

The semiconductor device illustrated in FIGS. 8A and 8B and FIG. 9 includes an insulator 217 (an insulator 217_1, an insulator 217_2, an insulator 217_3, an insulator 217_4, and an insulator 217_5) over the insulator 220 (the insulator 220_1, the insulator 220_2, the insulator 220_3, the insulator 220_4, and the insulator 220_5). In other words, the semiconductor device is different from that illustrated in FIGS. 1A and 1B, FIGS. 2A and 2B, and FIG. 3 in that the insulator 217 is positioned between the source or the drain of the oxide 230 and the insulator 220.

When the insulator 217 has a function of inhibiting the passage of oxygen and impurities such as hydrogen, for example, it is possible to prevent an increase in the resistance of the source or the drain of the oxide 230 due to injection of oxygen contained in the insulator 220 into the source or the drain. It is also possible to prevent oxidation and an increase in the resistance of the conductors 240 and 246 due to absorption of the oxygen in the conductors 240 and 246.

As the insulator 217, an insulator similar to the insulator 210 and the insulator 282 can be used. For the other structures and effects, the description for the semiconductor device illustrated in FIGS. 1A and 1B and FIGS. 2A and 2B can be referred to.

Figure 10A:
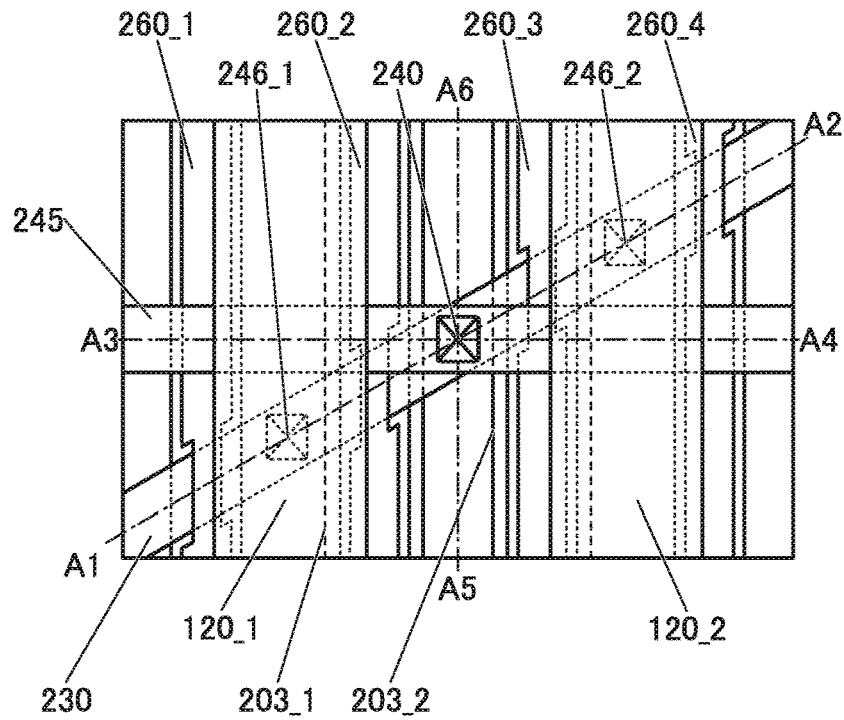
FIGS. 10A and 10B are a top view and a cross-sectional view of a semiconductor device of one embodiment of the present invention.
Figure 10B:
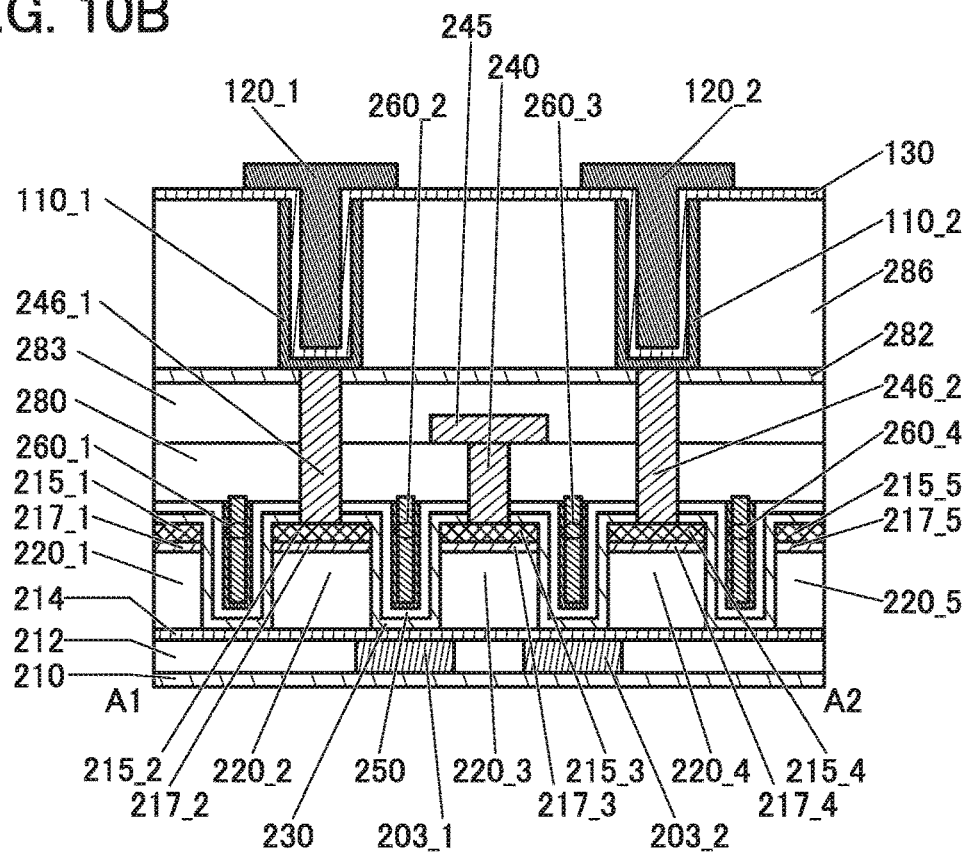
Figure 11:
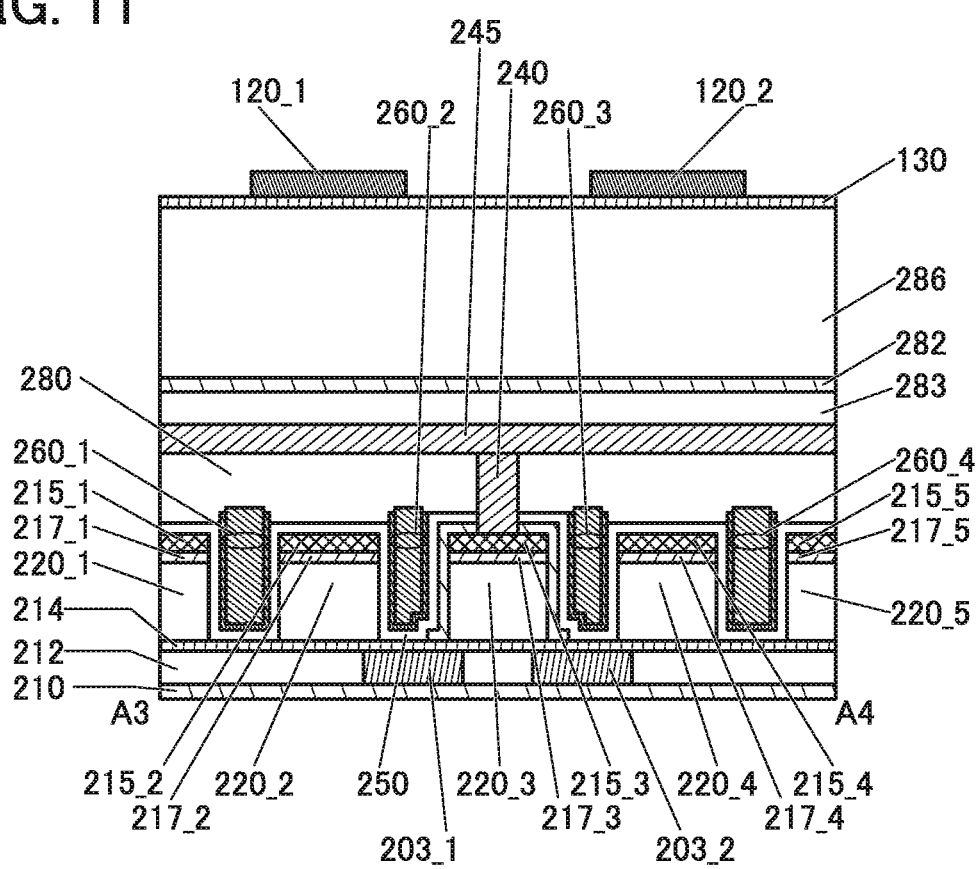
FIG. 11 is a cross-sectional view of a semiconductor device of one embodiment of the present invention.

FIGS. 10A and 10B and FIG. 11 illustrate an example of the semiconductor device including the transistors 200a, 200b, 140a, and 140b and the capacitors 100a and 100b. FIG. 10A is a top view of the semiconductor device. Note that some films are not illustrated in FIG. 10A for simplification of the drawing. FIG. 10B is a cross-sectional view taken along dashed-dotted line A1-A2 in FIG. 10A. FIG. 11 is a cross-sectional view taken along dashed-dotted line A3-A4 in FIG. 10A.

The semiconductor device illustrated in FIGS. 10A and 10B and FIG. 11 is different from that illustrated in FIGS. 1A and 1B, FIGS. 2A and 2B, and FIG. 3 in that the insulator 217 (the insulator 217_1, the insulator 217_2, the insulator 217_3, the insulator 217_4, and the insulator 217_5) is positioned over the insulator 220 (the insulator 220_1, the insulator 220_2, the insulator 220_3, the insulator 220_4, and the insulator 220_5), and furthermore, a conductor 215 (a conductor 215_1, a conductor 215_2, a conductor 215_3, a conductor 215_4, a conductor 215_5) is positioned over the insulator 217.

For the effect of the insulator 217, the description for the semiconductor device illustrated in FIGS. 8A and 8B and FIG. 9 can be referred to.

When the conductor 215 is positioned in contact with the source or the drain of the oxide 230 as illustrated in FIG. 10B and FIG. 11, the contact resistance between the conductor 240 and the source or the drain can be reduced. In addition, the contact resistance between the conductor 246 and the source or the drain can be reduced.

As the conductor 215, a conductor similar to the conductor 240 can be used. For the other structures and effects, the description for the semiconductor device illustrated in FIGS. 1A and 1B and FIGS. 2A and 2B can be referred to.

Application Example of Semiconductor Device

Figure 22:
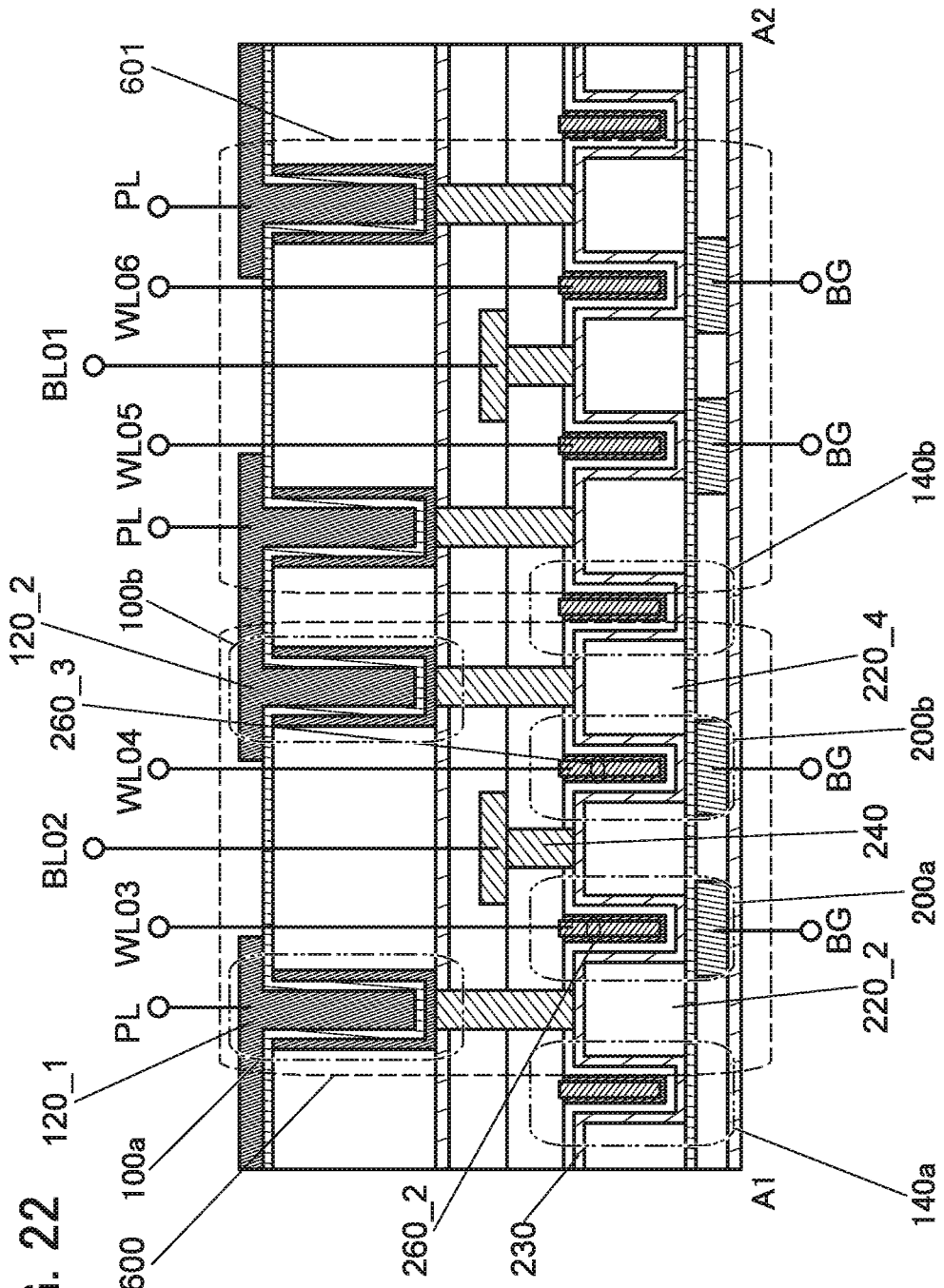
FIG. 22 is a cross-sectional view of a semiconductor device of one embodiment of the present invention.

In the above example, the semiconductor device includes the transistors 200a, 200b, 140a, and 140b and the capacitors 100a and 100b; however, the structure of the semiconductor device in this embodiment is not limited to this. For example, as illustrated in FIG. 22, a cell 600 and a cell 601, which has a structure similar to that of the cell 600, may be connected through the transistor 140b. Note that in this specification, the semiconductor device including the transistors 200a and 200b and the capacitors 100a and 100b is referred to as a cell. The above description for the transistors 200a, 200b, 140a, and 140b and the capacitors 100a and 100b can be referred to for the structures of the transistors 200a, 200b, 140a, and 140b and the capacitors 100a and 100b.

FIG. 22 is a cross-sectional view illustrating the cell 600, which includes the transistors 200a and 200b and the capacitors 100a and 100b, and the cell 601, which has a structure similar to that of the cell 600 and is connected to the cell 600 through the transistor 140b.

As illustrated in FIG. 22, the transistor 140b is positioned between the cell 600 and the cell 601. When the transistor 140b is normally off, the cell 600 and the cell 601 can be electrically isolated from each other. For the function and effect of the transistor 140b, the above description for the transistors 140a and 140b can be referred to.

When the transistors 200a and 200b and the capacitors 100a and 100b are formed to have the structures described in this embodiment, the area of the cell can be reduced and the semiconductor device can be miniaturized or highly integrated.

[Structure of Cell Array]

Figure 23:
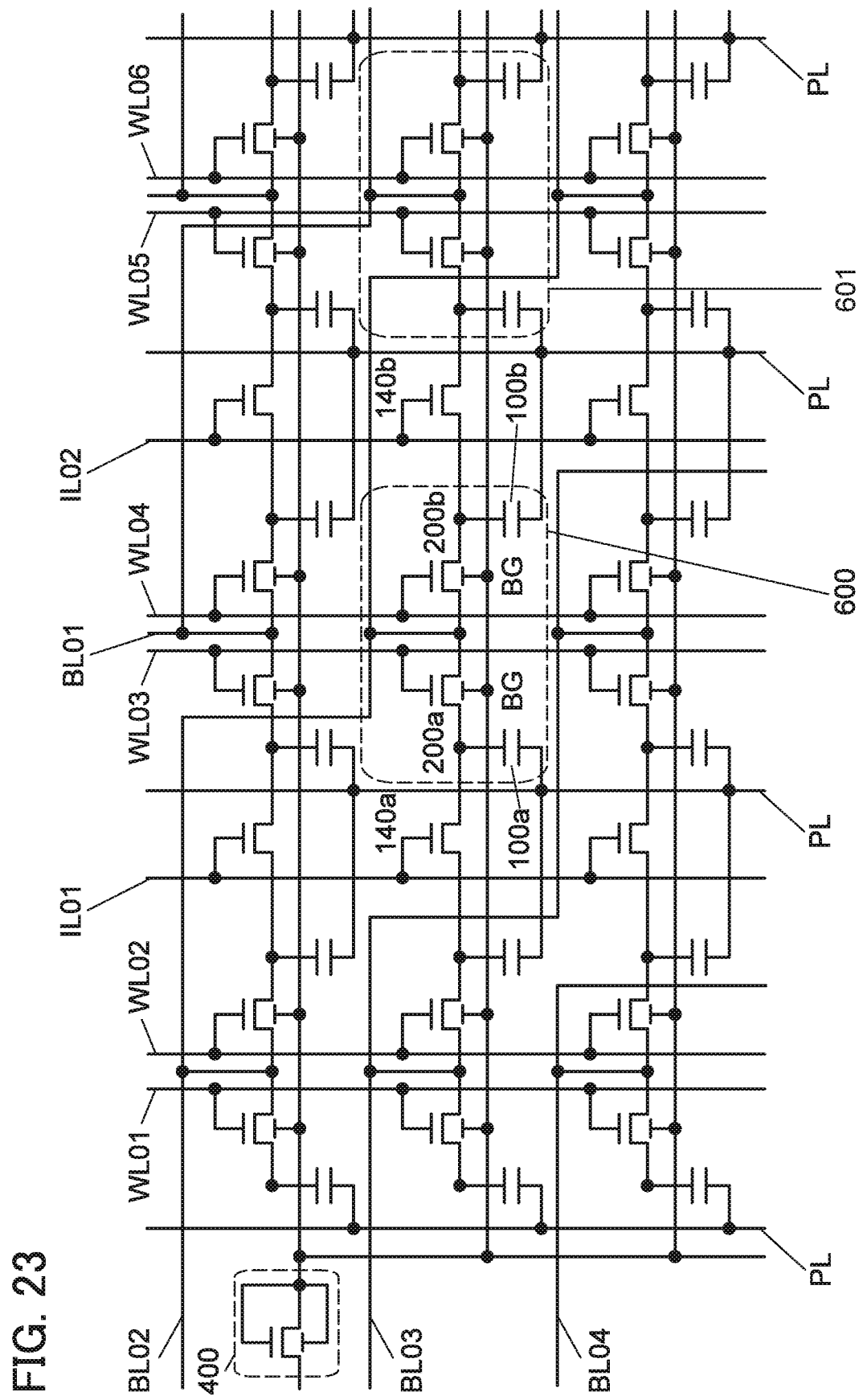
FIG. 23 is a circuit diagram of a semiconductor device of one embodiment of the present invention.

FIG. 23 illustrates an example of a cell array in this embodiment. For example, the semiconductor device illustrated in FIGS. 1A and 1B is regarded as a cell, and cells are arranged in rows and columns, or in a matrix, whereby a cell array is obtained.

FIG. 23 is a circuit diagram illustrating an embodiment in which the cells each having the structure in FIGS. 1A and 1B are arranged in a matrix. In the cell array illustrated in FIG. 23, wirings WL extend in a column direction.

As illustrated in FIG. 23, one of the source and the drain of each of the transistors 200a and 200b which are included in the cell is electrically connected to a common wiring BL (BL01, BL02, BL03, and BL04). The first gates of the transistors 200a and 200b which are included in the cell are electrically connected to different wirings WL (WL01 to WL06). Furthermore, these wirings WL are also electrically connected to the first gates of the transistors 200a and 200b included in the cells arranged in the column direction. The transistors 140a and 140b are positioned between the cells which are adjacent in the row direction. The first gates of the transistors 140a and 140b are electrically connected to different wirings IL (IL01 and IL02). Furthermore, these wirings IL are electrically connected to the first gates of the transistors 140a and 140b arranged in the column direction. When a potential at which the transistors 140a and 140b are normally off is applied to the wirings IL, the adjacent cells can be electrically isolated from each other.

For example, in the cell 600 connected to BL02, WL03, and WL04, as illustrated in FIG. 22, the conductor 240 is electrically connected to BL02, the conductor 260_2 is electrically connected to WL03, and the conductor 260_3 is electrically connected to WL04.

In addition, the transistors 200a and 200b which are included in the cell may each be provided with a second gate BG. The threshold voltage of the transistor can be controlled by a potential applied to the BG. The BG is connected to a transistor 400 and the potential applied to the BG can be controlled by the transistor 400. Furthermore, the conductor 120_1 of the capacitor 100a and the conductor 120_2 of the capacitor 100b which are included in the cell are electrically connected to different wirings PL.

Figure 24:
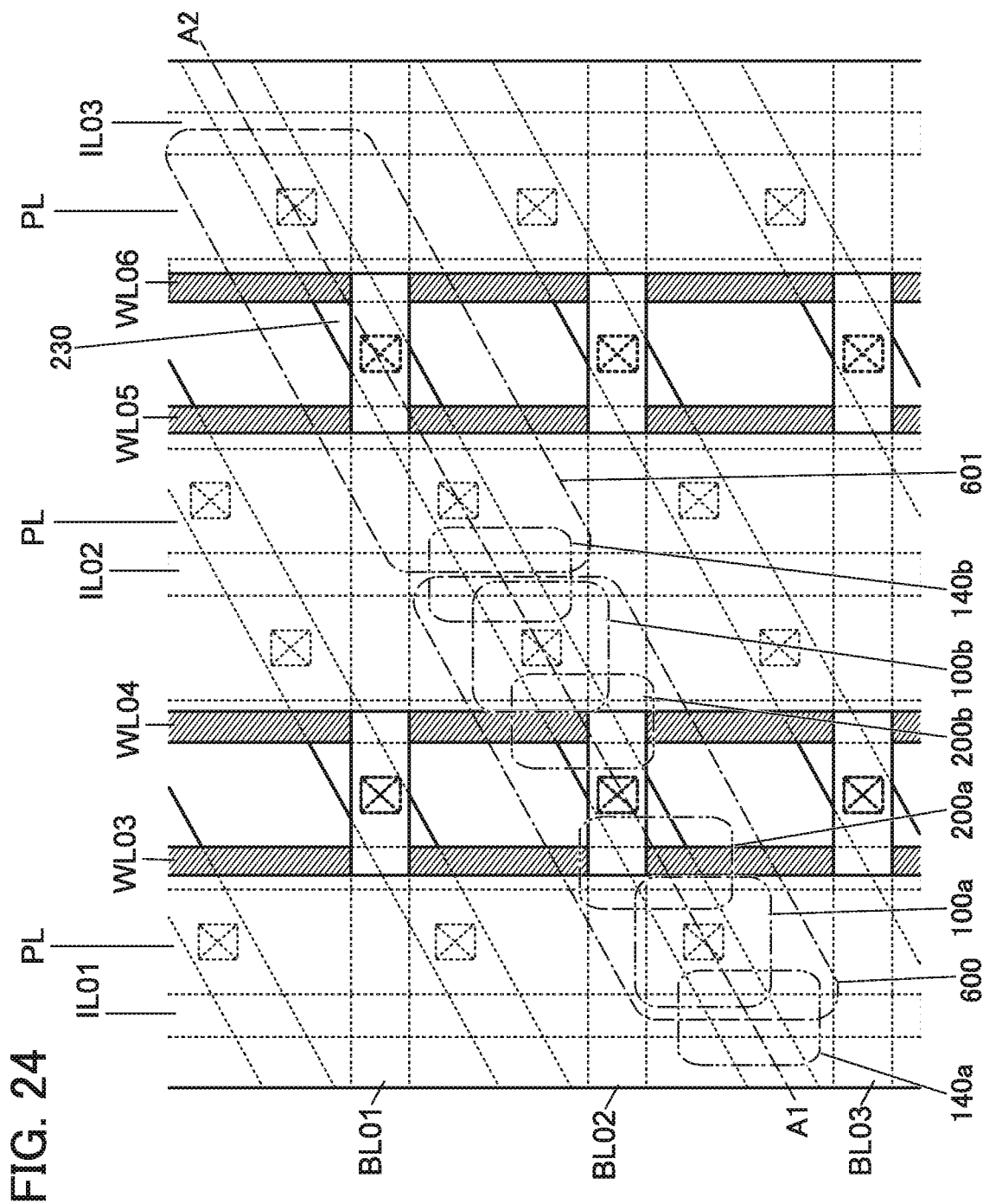
FIG. 24 is a top view of a semiconductor device of one embodiment of the present invention.

FIG. 24 is a schematic view showing a layout of the wirings and the components of the circuit diagram in FIG. 23. As shown in FIG. 24, the oxides 230 and the wirings WL are arranged in a matrix, whereby the semiconductor device in the circuit diagram shown in FIG. 23 can be formed. Here, the wirings BL are preferably provided in a layer different from the wirings WL and the oxides 230. Furthermore, as shown in FIG. 24, the wirings BL and the oxides 230 are preferably arranged so that the long side of each of the wirings BL and the long side of each of the oxides 230 are not parallel and form an angle of 20° to 70°, further preferably 30° to 60°. This arrangement allows, for example, the capacitors 100a and 100b and the wirings BL to be arranged without obstruction.

Furthermore, stacked cell arrays may be used instead of the single-layer cell array. When a plurality of cell arrays are stacked, cells can be integrated without increasing the area occupied by the cell arrays. That is, a 3D cell array can be formed.

As described above, according to one embodiment of the present invention, a semiconductor device that can be miniaturized or highly integrated can be provided. According to one embodiment of the present invention, a semiconductor device having good electrical characteristics can be provided. According to one embodiment of the present invention, a semiconductor device with a low off-state current can be provided. According to one embodiment of the present invention, a transistor with a high on-state current can be provided. According to one embodiment of the present invention, a highly reliable semiconductor device can be provided. According to one embodiment of the present invention, a semiconductor device with low power consumption can be provided. According to one embodiment of the present invention, a semiconductor device with high productivity can be provided.

The structures, methods, and the like described in this embodiment can be combined as appropriate with any of the structures, methods, and the like described in the other embodiments.

Embodiment 2

In this embodiment, one embodiment of the semiconductor device will be described with reference to FIG. 25.

[Memory Device 1]

Figure 25:
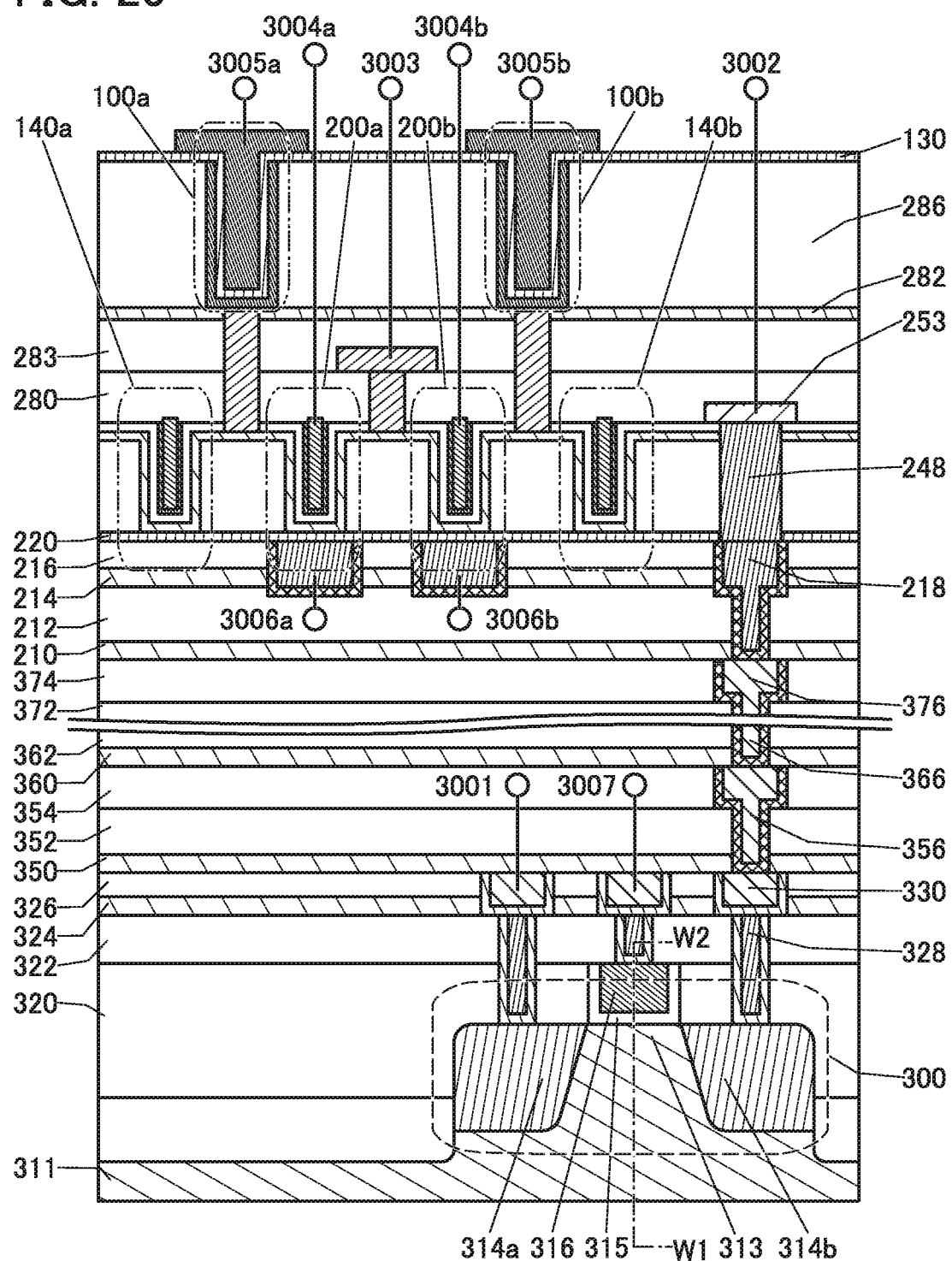
FIG. 25 is a cross-sectional view illustrating a structure of a memory device of one embodiment of the present invention.
Figure 26:
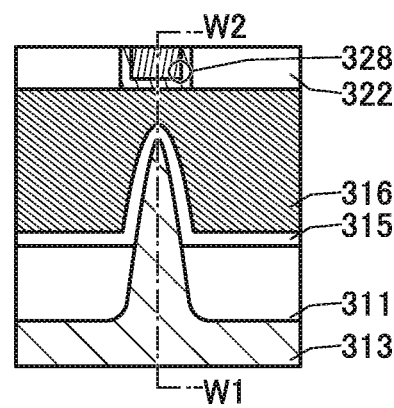
FIG. 26 is a cross-sectional view illustrating a structure of a memory device of one embodiment of the present invention.

A memory device illustrated in FIG. 25 includes the transistor 200a, the transistor 200b, the capacitor 100a, the capacitor 100b, the transistor 140a, the transistor 140b, and a transistor 300. FIG. 25 shows a cross section of the transistor 300 in the channel length direction. FIG. 26 is a cross-sectional view taken along dashed-dotted line W1-W2 in FIG. 25. That is, FIG. 26 is a cross-sectional view of the transistor 300 and the vicinity thereof in the channel width direction.

The transistors 200a and 200b are each a transistor in which a channel is formed in a semiconductor layer including an oxide semiconductor. Since the transistors 200a and 200b each have a low off-state current, a memory device including the transistors 200a and 200b can retain stored data for a long time. In other words, such a memory device does not require refresh operation or has an extremely low frequency of refresh operation, leading to a sufficient reduction in power consumption.

In the memory device illustrated in FIG. 25, a wiring 3001 is electrically connected to one of a source and a drain of the transistor 300. A wiring 3002 is electrically connected to the other of the source and the drain of the transistor 300. A wiring 3007 is electrically connected to a gate of the transistor 300. Furthermore, a wiring 3003 is electrically connected to one of the source and the drain of the transistor 200a and one of the source and the drain of the transistor 200b. A wiring 3004a is electrically connected to the first gate of the transistor 200a, a wiring 3004b is electrically connected to the first gate of the transistor 200b, a wiring 3006a is electrically connected to the second gate of the transistor 200a, and a wiring 3006b is electrically connected to the second gate of the transistor 200b. Furthermore, a wiring 3005a is electrically connected to one electrode of the capacitor 100a and a wiring 3005b is electrically connected to one electrode of the capacitor 100b.

The memory device illustrated in FIG. 25 can be used for a memory device including an oxide transistor, such as a DOSRAM described later. The transistors 200a and 200b have a low off-state current and hence, the potential of the other of the source and the drain of each of the transistors 200a and 200b (i.e., the other electrodes of the capacitors 100a and 100b) can be retained, so that data can be written, retained, and read.

<Structure of Memory Device 1>

The memory device of one embodiment of the present invention includes the transistor 200a, the transistor 200b, the capacitor 100a, the capacitor 100b, the transistor 140a, the transistor 140b, and the transistor 300 as illustrated in FIG. 25. The transistors 200a, 200b, 140a, and 140b and the capacitors 100a and 100b are provided above the transistor 300, and the transistors 200a, 200b, 140a, and 140b are provided in the same layer. The capacitors 100a and 100b are provided above the transistors 200a, 200b, 140a, and 140b. Note that the above embodiment can be referred to for the structures of the transistors 200a, 200b, 140a, and 140b and the capacitors 100a and 100b.

The transistor 300 is provided on a substrate 311 and includes a conductor 316, an insulator 315, a semiconductor region 313 that is a part of the substrate 311, and low-resistance regions 314a and 314b functioning as a source and a drain.

As illustrated in FIG. 26, the top surface and the side surface in the channel width direction of the semiconductor region 313 of the transistor 300 are covered with the conductor 316 with the insulator 315 therebetween. Such a FIN-type transistor 300 can have an increased effective channel width, and thus have improved on-state characteristics. In addition, since contribution of the electric field of the gate can be increased, the off-state characteristics of the transistor 300 can be improved.

The transistor 300 may be a p-channel transistor or an n-channel transistor.

A region of the semiconductor region 313 where a channel is formed, a region in the vicinity thereof, the low-resistance regions 314a and 314b functioning as the source and the drain, and the like preferably contain a semiconductor such as a silicon-based semiconductor, further preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is adjusted by applying stress to the crystal lattice and thereby changing the lattice spacing may be contained. Alternatively, the transistor 300 may be a high-electron-mobility transistor (HEMT) with GaAs and GaAlAs, or the like.

The low-resistance regions 314a and 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate can be formed using a semiconductor material such as silicon containing the element that imparts n-type conductivity, such as arsenic or phosphorus, or the element that imparts p-type conductivity, such as boron, or a conductive material such as a metal material, an alloy material, or a metal oxide material.

Note that the material for the conductor determines the work function, whereby the threshold voltage can be adjusted with the material for the conductor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

Note that the structure of the transistor 300 is not limited to that illustrated in FIG. 25, which is only an example, and an appropriate transistor may be used in accordance with a circuit configuration or a driving method.

An insulator 320, an insulator 322, an insulator 324, and an insulator 326 are stacked in this order to cover the transistor 300.

For the insulators 320, 322, 324, and 326, for example, silicon oxide, silicon oxynitride, silicon nitride oxide, silicon nitride, aluminum oxide, aluminum oxynitride, aluminum nitride oxide, or aluminum nitride can be used.

The insulator 322 may function as a planarization film for eliminating a level difference caused by the transistor 300 or the like underlying the insulator 322. For example, the top surface of the insulator 322 may be planarized by planarization treatment using a chemical mechanical polishing (CMP) method or the like to increase the level of planarity.

The insulator 324 is preferably formed using a film having a barrier property that prevents hydrogen and impurities from diffusing from the substrate 311, the transistor 300, or the like into regions where the transistors 200a and 200b are provided.

As the film having a barrier property against hydrogen, for example, a silicon nitride film formed by a CVD method can be used. Here, diffusion of hydrogen into a semiconductor element including an oxide semiconductor, such as the transistors 200a and 200b, degrades the characteristics of the semiconductor element in some cases. Therefore, a film that reduces hydrogen diffusion is preferably provided between the transistors 200a and 200b, and the transistor 300. Specifically, the film that reduces hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. In the case where a material with a low dielectric constant is used for an interlayer film, the parasitic capacitance between wirings can be reduced.

A conductor 328, a conductor 330, and the like that are electrically connected to the transistor 300 are embedded in the insulators 320, 322, 324, and 326. Note that the conductor 328 and the conductor 330 each function as a plug or a wiring. A plurality of conductors functioning as plugs or wirings are collectively denoted by the same reference numeral in some cases. Furthermore, in this specification and the like, a wiring and a plug electrically connected to the wiring may be a single component. That is, part of a conductor functions as a wiring in some cases and part of a conductor functions as a plug in other cases.

As a material for each of the plugs and wirings (e.g., the conductor 328 and the conductor 330), a conductive material such as a metal material, an alloy material, a metal nitride material, or a metal oxide material can be used in a single-layer structure or a layered structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are stacked in this order in FIG. 25. Furthermore, a conductor 356 is formed in the insulators 350, 352, and 354. The conductor 356 functions as a plug or a wiring. Note that the conductor 356 can be formed using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. In this structure, the transistor 300 can be separated from the transistors 200a, 200b, 140a, and 140b by a barrier layer, so that the diffusion of hydrogen from the transistor 300 into the transistors 200a, 200b, 140a, and 140b can be inhibited.

Note that as the conductor having a barrier property against hydrogen, tantalum nitride may be used, for example. By stacking tantalum nitride and tungsten, which has high conductivity, diffusion of hydrogen from the transistor 300 can be inhibited while the conductivity as the wiring is ensured. In this case, a tantalum nitride layer having a barrier property against hydrogen is preferably in contact with the insulator 350 having a barrier property against hydrogen.

Furthermore, a wiring layer may be provided over the insulator 354 and the conductor 356. In FIG. 25, an insulator 360 and an insulator 362 are stacked in this order, and a conductor 366 is formed in the insulators 360 and 362; thus, a wiring layer including the conductor 366 is provided.

Also in FIG. 25, an insulator 372 and an insulator 374 are stacked in this order, and a conductor 376 is formed in the insulators 372 and 374; thus, a wiring layer including the conductor 376 is provided. Furthermore, a plurality of wiring layers may be provided between the wiring layer including the conductor 366 and the wiring layer including the conductor 376. Note that the conductor 366 and the conductor 376 function as plugs or wirings. The insulators 360, 362, and 374 can be formed using a material similar to that for the above-described insulator.

The insulator 210 and the insulator 212 are stacked in this order over the insulator 374. A substance having a barrier property against oxygen or hydrogen is preferably used for either the insulator 210 or the insulator 212.

The insulator 210 is preferably formed using, for example, a film having a barrier property that prevents diffusion of hydrogen or impurities from the substrate 311, a region where the transistor 300 is formed, or the like into a region where the transistors 200a, 200b, 140a, and 140b are formed. Therefore, the insulator 210 can be formed using a material similar to that for the insulator 324.

As the film having a barrier property against hydrogen, a silicon nitride formed by a CVD method can be used, for example. Here, diffusion of hydrogen into the semiconductor element including an oxide semiconductor, such as the transistors 200a, 200b, 140a, and 140b, degrades the characteristics of the semiconductor element in some cases. Therefore, a film that reduces hydrogen diffusion is preferably provided between the transistor 300 and the transistors 200a, 200b, 140a, and 140b. Specifically, the film that reduces hydrogen diffusion is a film from which a small amount of hydrogen is released.

For the film having a barrier property against hydrogen used for the insulator 210, for example, a metal oxide such as aluminum oxide, hafnium oxide, or tantalum oxide is preferably used.

In particular, aluminum oxide has an excellent blocking effect that prevents permeation of oxygen and impurities such as hydrogen and moisture which cause a change in the electrical characteristics of the transistor. Accordingly, the use of aluminum oxide can prevent entry of impurities such as hydrogen and moisture into the transistors 200a, 200b, 140a, and 140b in and after a manufacturing process of the transistors. In addition, release of oxygen from the oxide in the transistors 200a, 200b, 140a, and 140b can be inhibited. Therefore, aluminum oxide is suitably used as a protective film for the transistors 200a, 200b, 140a, and 140b.

The insulator 212 can be formed using a material similar to that for the insulator 320, for example. In the case where a material with a relatively low dielectric constant is used for an interlayer film, the parasitic capacitance between wirings can be reduced. A silicon oxide film or a silicon oxynitride film can be used as the insulator 212, for example.

A conductor 218, a conductor included in the transistors 200a and 200b, and the like are embedded in the insulators 210, 212, 214, and 216. Note that the conductor 218 functions as a plug or a wiring that is electrically connected to the transistors 200a and 200b or the transistor 300. The conductor 218 can be formed using a material similar to that for the conductors 328 and 330.

In particular, part of the conductor 218 that is in contact with the insulators 210 and 214 is preferably a conductor having a barrier property against oxygen, hydrogen, and water. In such a structure, the transistor 300 can be separated from the transistors 200a, 200b, 140a, and 140b by the layer having a barrier property against oxygen, hydrogen, and water. As a result, the diffusion of hydrogen from the transistor 300 into the transistors 200a, 200b, 140a, and 140b can be inhibited.

The transistors 200a, 200b, 140a, and 140b and the capacitors 100a and 100b are provided above the insulator 212. Note that the transistors 200a, 200b, 140a, and 140b and the capacitors 100a and 100b can have the same structures as those described in the above embodiment. Furthermore, the structures of the transistors 200a, 200b, 140a, and 140b and the capacitors 100a and 100b are not limited to those illustrated in FIG. 25, which are only examples, and appropriate transistors and capacitors may be used in accordance with a circuit configuration or a driving method.

Furthermore, a conductor 248 is provided in contact with the conductor 218, so that a conductor 253 that is connected to the transistor 300 can be extracted above the transistors 200a and 200b. Although the wiring 3002 is extracted above the transistors 200a and 200b in FIG. 25, one embodiment of the present invention is not limited thereto. The wiring 3001, the wiring 3007, and the like may be extracted above the transistors 200a and 200b.

The above is the description of the structure example. With the use of the structure, a change in electrical characteristics can be reduced and reliability can be improved in a semiconductor device using a transistor including an oxide semiconductor. A transistor including an oxide semiconductor with a high on-state current can be provided. A transistor including an oxide semiconductor with a low off-state current can be provided. A semiconductor device with low power consumption can be provided.

[Memory Device 2]

Figure 27C:
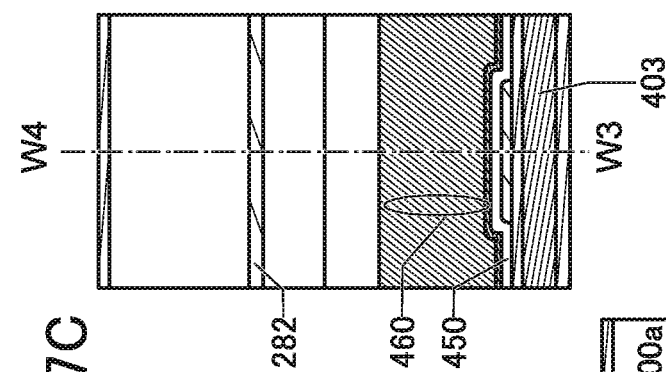
FIGS. 27A to 27C are a circuit diagram and cross-sectional views illustrating a structure of a memory device of one embodiment of the present invention.
Figure 27A:
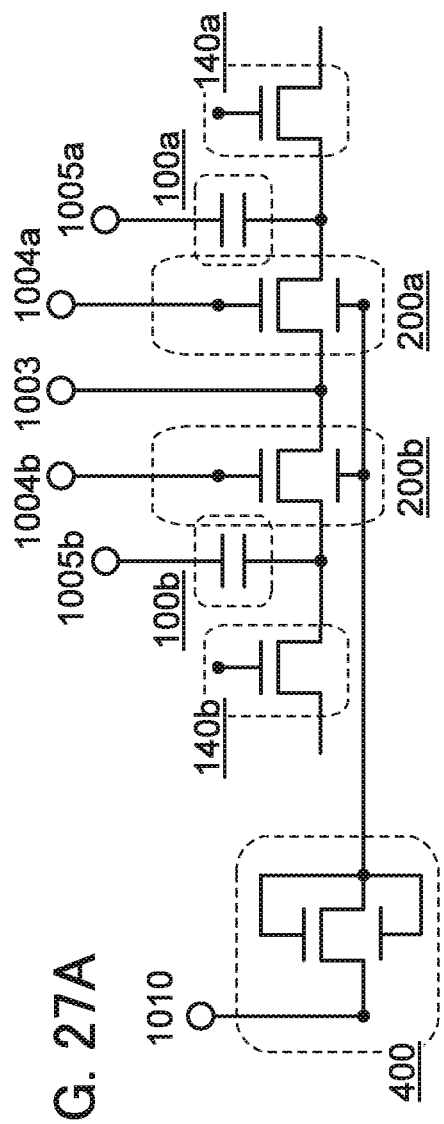
Figure 27B:
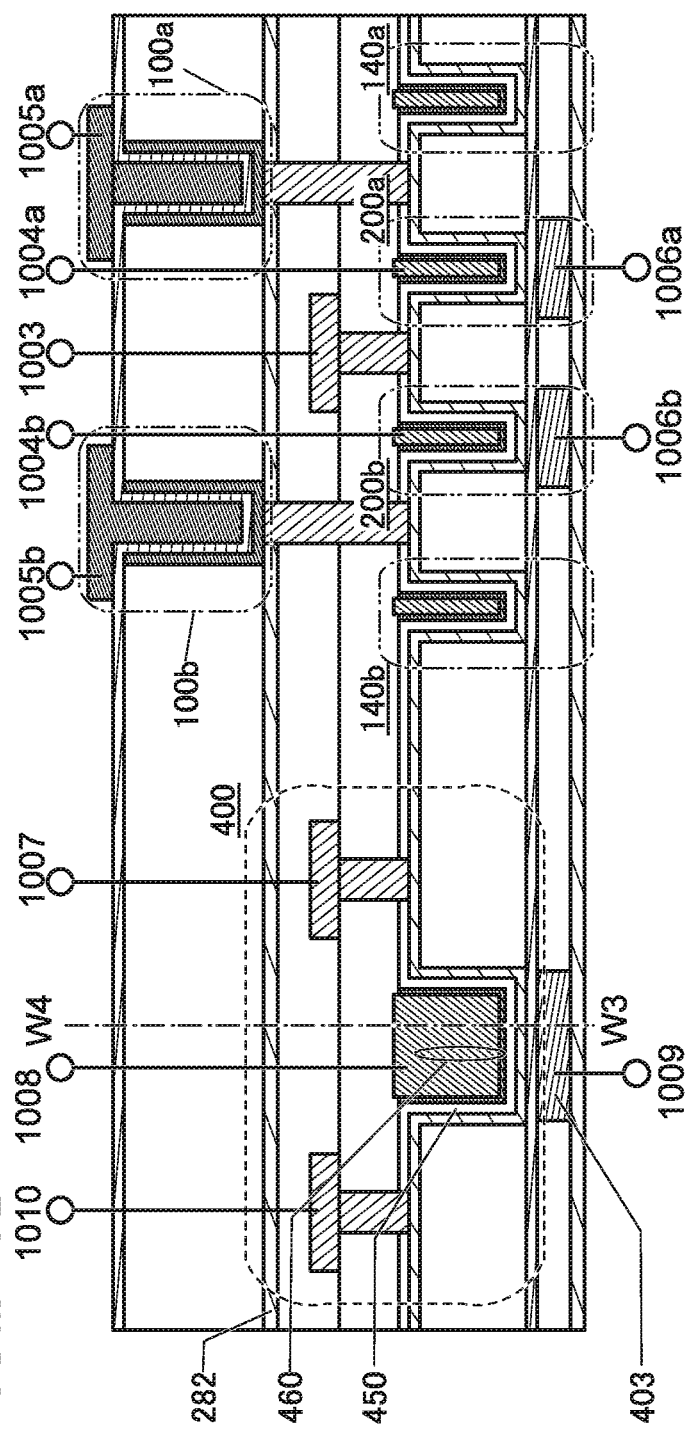

A semiconductor device illustrated in FIGS. 27A to 27C is a memory device including the transistor 400, the transistor 200a, the transistor 200b, the transistor 140a, the transistor 140b, the capacitor 100a, and the capacitor 100b. One embodiment of the memory device is described below with reference to FIGS. 27A to 27C.

FIG. 27A is a circuit diagram showing an example of the connection relation of the transistors 400, 200a, and 200b and the capacitors 100a and 100b in the semiconductor device described in this embodiment. FIG. 27B shows a cross section of the semiconductor device including a wiring 1003, a wiring 1004a, a wiring 1004b, a wiring 1005a, a wiring 1005b, a wiring 1010, and the like that correspond to those in FIG. 27A. Furthermore, a cross section along dashed-dotted line W3-W4 in FIG. 27B is shown in FIG. 27C. FIG. 27C is a cross-sectional view in the channel width direction of a channel formation region of the transistor 400.

As illustrated in FIGS. 27A to 27C, the gate of the transistor 200a is electrically connected to the wiring 1004a and one of the source and the drain of the transistor 200a is electrically connected to the wiring 1003. The other of the source and the drain of the transistor 200a is electrically connected to the lower electrode of the capacitor 100a. The upper electrode of the capacitor 100a is electrically connected to the wiring 1005a. The gate of the transistor 200b is electrically connected to the wiring 1004b and one of the source and the drain of the transistor 200b is electrically connected to the wiring 1003. The other of the source and the drain of the transistor 200b is electrically connected to the lower electrode of the capacitor 100b. The upper electrode of the capacitor 100b is electrically connected to the wiring 1005b. A drain of the transistor 400 is electrically connected to the wiring 1010. As illustrated in FIG. 27B, the second gate of the transistor 200a, and a source, a first gate, and a second gate of the transistor 400 are electrically connected through a wiring 1006a, a wiring 1006b, a wiring 1007, a wiring 1008, and a wiring 1009.

A potential applied to the wiring 1004a can control the on/off state of the transistor 200a. When a potential is applied to the wiring 1003 while the transistor 200a is on, a charge can be supplied to the capacitor 100a through the transistor 200a. At this time, the charge supplied to the capacitor 100a can be held when the transistor 200a is turned off. When a given potential is applied to the wiring 1005a, the potential of a connection portion between the transistor 200a and the capacitor 100a can be controlled by capacitive coupling. For example, when a ground potential is applied to the wiring 1005a, the charge is held easily.

Similarly, a potential applied to the wiring 1004b can control the on/off state of the transistor 200b. When a potential is applied to the wiring 1003 while the transistor 200b is on, a charge can be supplied to the capacitor 100b through the transistor 200b. At this time, the charge supplied to the capacitor 100b can be held when the transistor 200b is turned off. When a given potential is applied to the wiring 1005b, the potential of a connection portion between the transistor 200b and the capacitor 100b can be controlled by capacitive coupling. For example, when a ground potential is applied to the wiring 1005b, the charge is held easily. Furthermore, when a negative potential is applied to the wiring 1010, the negative potential can be applied to the second gates of the transistors 200a and 200b through the transistor 400, whereby the threshold voltages of the transistors 200a and 200b can be higher than 0 V to reduce the off-state current; thus, the drain current at a first gate voltage of 0 V can be noticeably reduced.

With a structure in which the first gate and the second gate of the transistor 400 are diode-connected to the source thereof and the source of the transistor 400 is connected to the second gates of the transistors 200a and 200b, the second gate voltage of each of the transistors 200a and 200b can be controlled by the wiring 1010. When negative potentials of the second gates of the transistors 200a and 200b are held, a first gate-source voltage and a second gate-source voltage of the transistor 400 are 0 V. The transistor 400 has an extremely low drain current at a first gate voltage of 0 V and a higher threshold voltage than the transistors 200a and 200b; thus, with such a structure, the negative potentials of the second gates of the transistors 200a and 200b can be held for a long time even without power supply to the transistor 400.

Furthermore, when the negative potentials of the second gates of the transistors 200a and 200b are held, the transistors 200a and 200b can each have an extremely low drain current at a first gate voltage of 0 V even without receiving power. In other words, the charges can be held in the capacitors 100a and 100b for a long time even without supply of power to the transistors 200a, 200b, and 400. For example, with use of the semiconductor device as a memory element, data can be retained for a long time without power supply. Therefore, a memory device with a low refresh frequency or a memory device that does not need refresh operation can be provided.

Note that the connection relation of the transistors 200a, 200b, and 400, and the capacitors 100a and 100b is not limited to that illustrated in FIGS. 27A and 27B. The connection relation can be modified as appropriate in accordance with a necessary circuit configuration.

<Structure of Memory Device 2>

FIG. 27B shows a cross section of the memory device including the capacitors 100a and 100b and the transistors 200a, 200b, 140a, 140b, and 400. Note that in the memory device illustrated in FIGS. 27A to 27C, components having the same functions as the components in the semiconductor device and the memory device described in the above embodiment and <Structure of memory device 1> are denoted by the same reference numerals.

The memory device of one embodiment of the present invention includes, as illustrated in FIGS. 27A to 27C, the transistor 400, the transistor 200a, the transistor 200b, the transistor 140a, the transistor 140b, the capacitor 100a, and the capacitor 100b. The transistors 400, 200a, 200b, 140a, and 140b are positioned in the same layer. The capacitors 100a and 100b are positioned above the transistors 400, 200a, 200b, 140a, and 140b.

Note that the capacitors and the transistors included in the semiconductor device described in the above embodiment and with reference to FIGS. 1A and 1B may be used as the transistors 200a, 200b, 140a, and 140b, and the capacitors 100a and 100b. Note that the structures of the capacitors 100a and 100b and the transistors 200a, 200b, 140a, 140b, and 400 are not limited to those illustrated in FIGS. 27A to 27C, which are only examples, and appropriate transistors and capacitors may be used in accordance with a circuit configuration or a driving method.

The transistors 400, 200a, 200b, 140a, and 140b are formed in the same layer and can be fabricated in parallel. The transistor 400 includes a conductor 460, which functions as the first gate, a conductor 403, which functions as the second gate, an insulator 450, which is in contact with each side surface of the conductor 460, and the oxide 230, which functions as the source or the drain.

In the transistor 400, the conductor 403 is in the same layer as the conductor 203. The insulator 450 is in the same layer as the insulator 250. The conductor 460 is in the same layer as the conductors 260_1, 260_2, 260_3, and 260_4.

In the oxide 230 functioning as an active layer of the transistor 400, oxygen vacancies and impurities such as hydrogen and water are reduced. Accordingly, the threshold voltage of the transistor 400 can be higher than 0 V to reduce the off-state current; thus, the drain current at a first and a second gate voltage of 0 V can be noticeably reduced.

With the use of the structure, a change in electrical characteristics can be reduced and reliability can be improved in a semiconductor device using a transistor including an oxide semiconductor. The power consumption of a semiconductor device using a transistor including an oxide semiconductor can be reduced. A semiconductor device using a transistor including an oxide semiconductor can be miniaturized or highly integrated. A miniaturized or highly integrated semiconductor device can be provided with high productivity.

The structures, methods, and the like described in this embodiment can be combined as appropriate with any of the structures, methods, and the like described in the other embodiments.

Embodiment 3

In this embodiment, a DOSRAM (registered trademark) is described with reference to FIG. 28 and FIGS. 29A and 29B as an example of a memory device of one embodiment of the present invention, which includes a transistor using an oxide for a semiconductor (hereinafter referred to as an OS transistor) and a capacitor. The DOSRAM is an abbreviation of "dynamic oxide semiconductor RAM", which indicates a RAM including one transistor (1T) and one capacitor (1C). Hereinafter, a memory device including an OS transistor, such as a DOSRAM, is referred to as an OS memory in some cases.

A memory device in which OS transistors are used in memory cells (hereinafter referred to as an OS memory) is used for the DOSRAM. The OS memory is a memory including at least a capacitor and an OS transistor that controls the charging and discharging of the capacitor. Because the OS transistor has an extremely low off-state current, the OS memory has excellent retention characteristics and thus can function as a nonvolatile memory.

<<DOSRAM 1400>>

Figure 28:
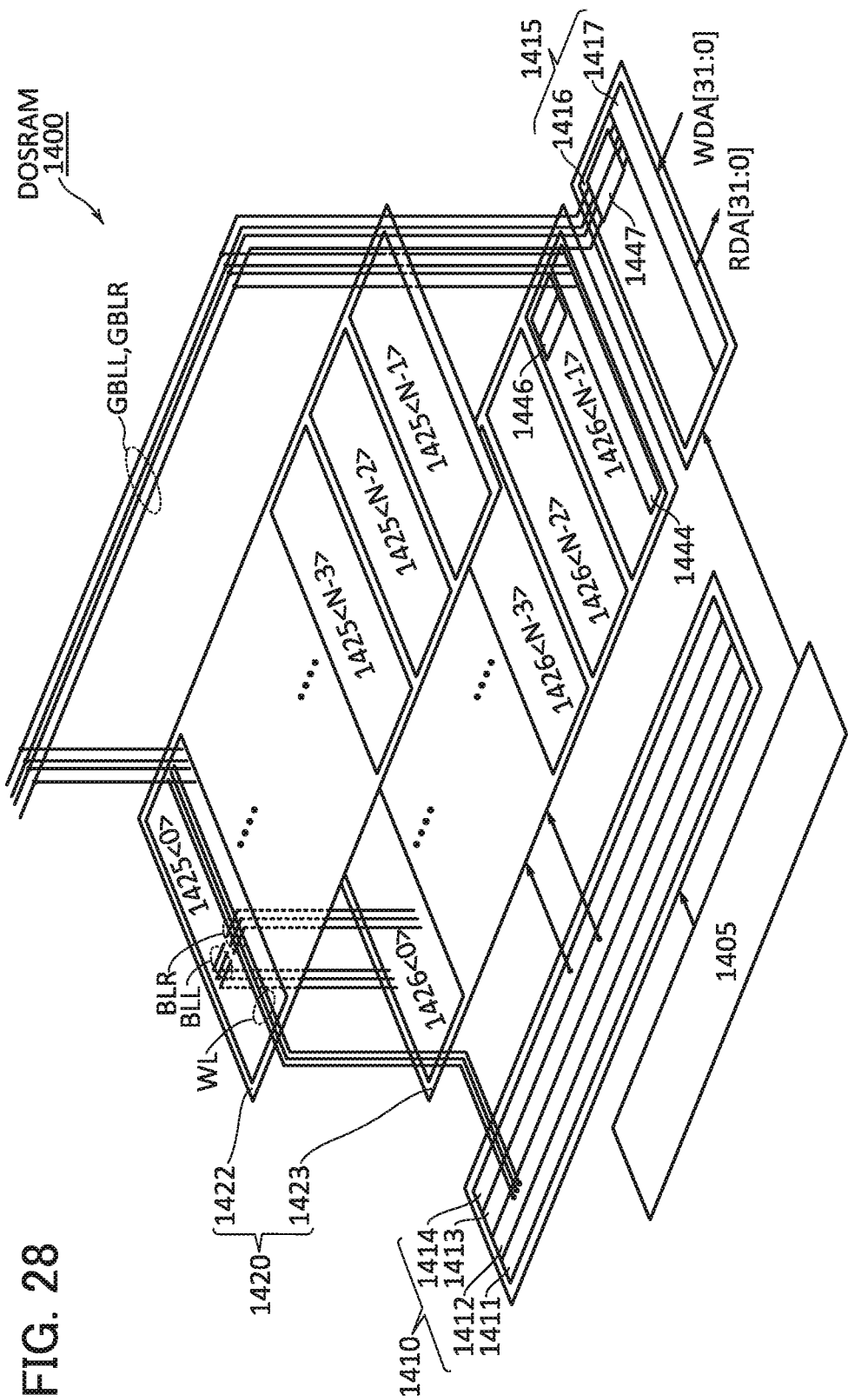
FIG. 28 is a block diagram illustrating a configuration example of a memory device of one embodiment of the present invention.
Figure 29A:
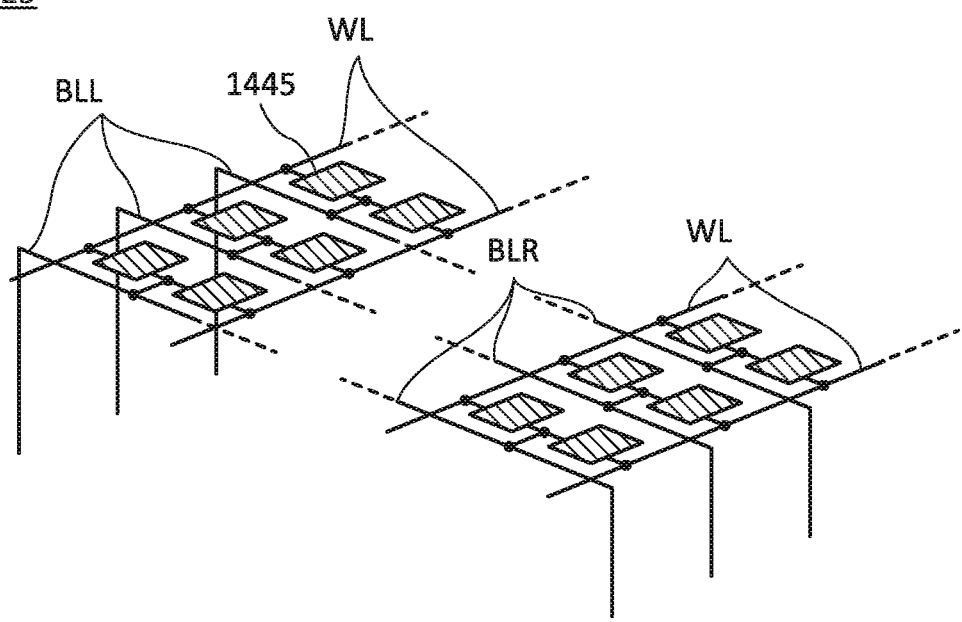
FIGS. 29A and 29B are a block diagram and a circuit diagram illustrating a configuration example of a memory device of one embodiment of the present invention.

FIG. 28 illustrates a configuration example of the DOSRAM. As illustrated in FIG. 28, a DOSRAM 1400 includes a controller 1405, a row circuit 1410, a column circuit 1415, and a memory cell and sense amplifier array 1420 (hereinafter referred to as an MC-SA array 1420).

The row circuit 1410 includes a decoder 1411, a word line driver circuit 1412, a column selector 1413, and a sense amplifier driver circuit 1414. The column circuit 1415 includes a global sense amplifier array 1416 and an input/output circuit 1417. The global sense amplifier array 1416 includes a plurality of global sense amplifiers 1447. The MC-SA array 1420 includes a memory cell array 1422, a sense amplifier array 1423, and global bit lines GBLL and GBLR.

(MC-SA Array 1420)

The MC-SA array 1420 has a stacked-layer structure where the memory cell array 1422 is stacked over the sense amplifier array 1423. The global bit lines GBLL and GBLR are stacked over the memory cell array 1422. The DOSRAM 1400 adopts a hierarchical bit line structure with local and global bit lines.

The memory cell array 1422 includes N local memory cell arrays 1425<0> to 1425<N−1>, where N is an integer greater than or equal to 2. FIG. 29A illustrates a configuration example of the local memory cell array 1425. The local memory cell array 1425 includes a plurality of memory cells 1445, a plurality of word lines WL, and a plurality of bit lines BLL and BLR. In the example in FIG. 29A, the local memory cell array 1425 has an open bit-line architecture but may have a folded bit-line architecture.

Figure 29B:
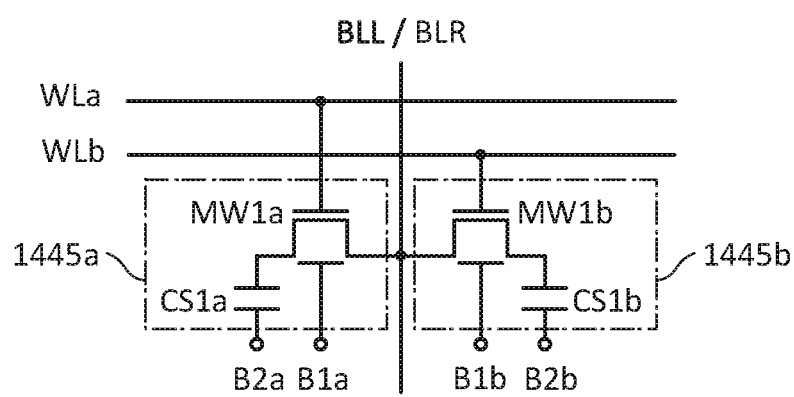

FIG. 29B illustrates a circuit configuration example of a pair of memory cells 1445a and 1445b connected to the same bit line BLL (BLR). The memory cell 1445a includes a transistor MW1a, a capacitor CS1a, and terminals B1a and B2a, and is connected to a word line WLa and the bit line BLL (BLR). The memory cell 1445b includes a transistor MW1b, a capacitor CS1b, and terminals B1b and B2b, and is connected to a word line WLb and the bit line BLL (BLR). Hereinafter, in the case where the description applies to both the memory cell 1445a and the memory cell 1445b, reference numerals without the letter "a" or "b" are used for the memory cell 1445 and its components, in some cases.

The transistor MW1a has a function of controlling the charging and discharging of the capacitor CS1a, and the transistor MW1b has a function of controlling the charging and discharging of the capacitor CS1b. A gate of the transistor MW1a is electrically connected to the word line WLa, a first terminal of the transistor MW is electrically connected to the bit line BLL (BLR), and a second terminal of the transistor MW1a is electrically connected to a first terminal of the capacitor CS1a. A gate of the transistor MW1b is electrically connected to the word line WLb, a first terminal of the transistor MW1b is electrically connected to the bit line BLL (BLR), and a second terminal of the transistor MW1b is electrically connected to a first terminal of the capacitor CS1b. In this way, the bit line BLL (BLR) is shared by the first terminal of the transistor MW1a and the first terminal of the transistor MW1b.

The transistor MW1 has a function of controlling the charging and discharging of the capacitor CS1. A second terminal of the capacitor CS1 is electrically connected to the terminal B2. A constant voltage (e.g., a low power supply voltage) is applied to the terminal B2.

In the case where the semiconductor device described in any of the above embodiments is used for the memory cells 1445a and 1445b, the transistor 200a can be used as the transistor MW1a, the transistor 200b can be used as the transistor MW1b, the capacitor 100a can be used as the capacitor CS1a, and the capacitor 100b can be used as the capacitor CS1b. In that case, the area occupied by each set consisting of one transistor and one capacitor in the top view can be reduced; accordingly, the memory device of this embodiment can be highly integrated. As a result, storage capacity per unit area of the memory device of this embodiment can be increased.

The transistor MW1 includes a back gate, and the back gate is electrically connected to the terminal B1. Thus, the threshold voltage of the transistor MW1 can be changed with a voltage applied to the terminal B1. For example, a fixed voltage (e.g., a negative constant voltage) may be applied to the terminal B1; alternatively, the voltage applied to the terminal B1 may be changed in response to the operation of the DOSRAM 1400.

The back gate of the transistor MW1 may be electrically connected to the gate, the source, or the drain of the transistor MW1. The transistor MW1 does not necessarily include the back gate.

The sense amplifier array 1423 includes N local sense amplifier arrays 1426<0> to 1426<N−1>. The local sense amplifier arrays 1426 each include one switch array 1444 and a plurality of sense amplifiers 1446. Each of the sense amplifiers 1446 is electrically connected to a bit line pair. The sense amplifiers 1446 each have a function of precharging the corresponding bit line pair, a function of amplifying a voltage difference of the bit line pair, and a function of retaining the voltage difference. The switch array 1444 has a function of selecting a bit line pair and electrically connecting the selected bit line pair and a global bit line pair to each other.

Here, the bit line pair refers to two bit lines that are compared simultaneously by the sense amplifier, and the global bit line pair refers to two global bit lines that are compared simultaneously by the global sense amplifier. The bit line pair can be referred to as a pair of bit lines, and the global bit line pair can be referred to as a pair of global bit lines. Here, the bit line BLL and the bit line BLR form one bit line pair, and the global bit line GBLL and the global bit line GBLR form one global bit line pair. In the following description, the expressions "bit line pair (BLL, BLR)" and "global bit line pair (GBLL, GBLR)" are also used.

(Controller 1405)

The controller 1405 has a function of controlling the overall operation of the DOSRAM 1400. The controller 1405 has a function of performing logic operation on a command signal that is input from the outside and determining an operation mode, a function of generating control signals for the row circuit 1410 and the column circuit 1415 so that the determined operation mode is executed, a function of retaining an address signal that is input from the outside, and a function of generating an internal address signal.

(Row Circuit 1410)

The row circuit 1410 has a function of driving the MC-SA array 1420. The decoder 1411 has a function of decoding an address signal. The word line driver circuit 1412 generates a selection signal for selecting the word line WL of a row that is to be accessed.

The column selector 1413 and the sense amplifier driver circuit 1414 are circuits for driving the sense amplifier array 1423. The column selector 1413 has a function of generating a selection signal for selecting the bit line of a column that is to be accessed. The selection signal from the column selector 1413 controls the switch array 1444 of each local sense amplifier array 1426. The plurality of local sense amplifier arrays 1426 are independently driven by control signals from the sense amplifier driver circuit 1414.

(Column Circuit 1415)

The column circuit 1415 has a function of controlling the input of data signals WDA[31:0], and a function of controlling the output of data signals RDA[31:0]. The data signals WDA[31:0] are write data signals, and the data signals RDA[31:0] are read data signals.

Each of the global sense amplifiers 1447 is electrically connected to the global bit line pair (GBLL, GBLR). The global sense amplifiers 1447 each have a function of amplifying a voltage difference of the global bit line pair (GBLL, GBLR), and a function of retaining the voltage difference. Data is written to and read from the global bit line pair (GBLL, GBLR) by the input/output circuit 1417.

The write operation of the DOSRAM 1400 is briefly described. Data is written to the global bit line pair by the input/output circuit 1417. The data of the global bit line pair is retained by the global sense amplifier array 1416. By the switch array 1444 of the local sense amplifier array 1426 specified by an address signal, the data of the global bit line pair is written to the bit line pair of a column where data is to be written. The local sense amplifier array 1426 amplifies the written data, and then retains the amplified data. In the specified local memory cell array 1425, the word line WL of the row where data is to be written is selected by the row circuit 1410, and the data retained in the local sense amplifier array 1426 is written to the memory cell 1445 of the selected row.

The read operation of the DOSRAM 1400 is briefly described. One row of the local memory cell array 1425 is specified with an address signal. In the specified local memory cell array 1425, the word line WL of a row where data is to be read is selected, and data of the memory cell 1445 is written to the bit line. The local sense amplifier array 1426 determines a voltage difference between the bit line pair of each column as data, and retains the data. The switch array 1444 writes the data of a column specified by the address signal to the global bit line pair; the data is chosen from the data retained in the local sense amplifier array 1426. The global sense amplifier array 1416 determines and retains the data of the global bit line pair. The data retained in the global sense amplifier array 1416 is output to the input/output circuit 1417. Thus, the read operation is completed.

The DOSRAM 1400 has no limitations on the number of rewrites in principle and data can be read and written with low energy consumption, because data is rewritten by charging and discharging the capacitor CS1. In addition, a simple circuit configuration of the memory cell 1445 easily increases the memory capacity.

The transistor MW1 is an OS transistor. The extremely low off-state current of the OS transistor can inhibit charge leakage from the capacitor CS1. Therefore, the retention time of the DOSRAM 1400 is much longer than that of a DRAM. This allows less frequent refresh, which can reduce the power needed for refresh operations. Thus, the DOSRAM 1400 is suitably used for a memory device that rewrites a large volume of data with a high frequency, for example, a frame memory used for image processing.

Since the MC-SA array 1420 has a stacked-layer structure, the bit line can be shortened to a length that is close to the length of the local sense amplifier array 1426. A shorter bit line results in smaller bit line capacitance, which enables the storage capacitance of the memory cell 1445 to be reduced. In addition, the switch array 1444 provided in the local sense amplifier array 1426 reduces the number of long bit lines. For the reasons described above, a load to be driven during access to the DOSRAM 1400 is reduced, leading to lower power consumption.

Thus, a DOSRAM including OS transistors can easily have a large capacity. In addition, the DOSRAM including OS transistors can retain data for a long time, which makes the refresh penalty substantially negligible. Furthermore, the DOSRAM including OS transistors can perform power gating of a peripheral circuit by utilizing the potential of the back gates.

Figure 30:
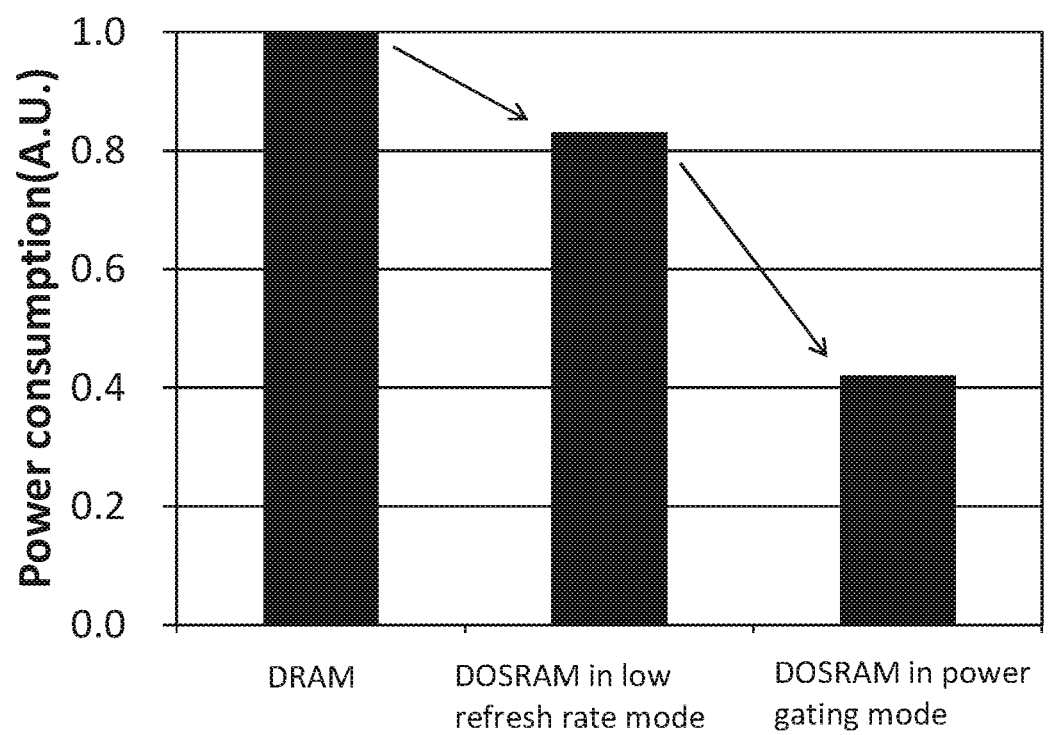
FIG. 30 shows the power consumption of a memory device of one embodiment of the present invention.

FIG. 30 is a graph comparing the power consumption of the DOSRAM including OS transistors and the power consumption of a general DRAM. Note that the vertical axis represents the estimated power consumption in actual use when the power consumption of the general DRAM is assumed to be 1 (arbitrary unit: A.U.). In the "actual use" herein, the DOSRAM or DRAM is assumed to be active for 10% of a day and on standby or in a self-refresh mode for 90% of the day. The graph indicates that the power consumption of the DOSRAM including OS transistors in a low refresh rate mode can be lower than that of the general DRAM by approximately 20%. Furthermore, the power consumption of the DOSRAM including OS transistors in a power gating mode is estimated to be lower than that of the general DRAM by approximately 60%.

The structures described in this embodiment can be used in appropriate combination with any of the structures described in the other embodiments.

Embodiment 4

In this embodiment, an AI system using the semiconductor device of any of the above-described embodiments will be described with reference to FIG. 31.

Figure 31:
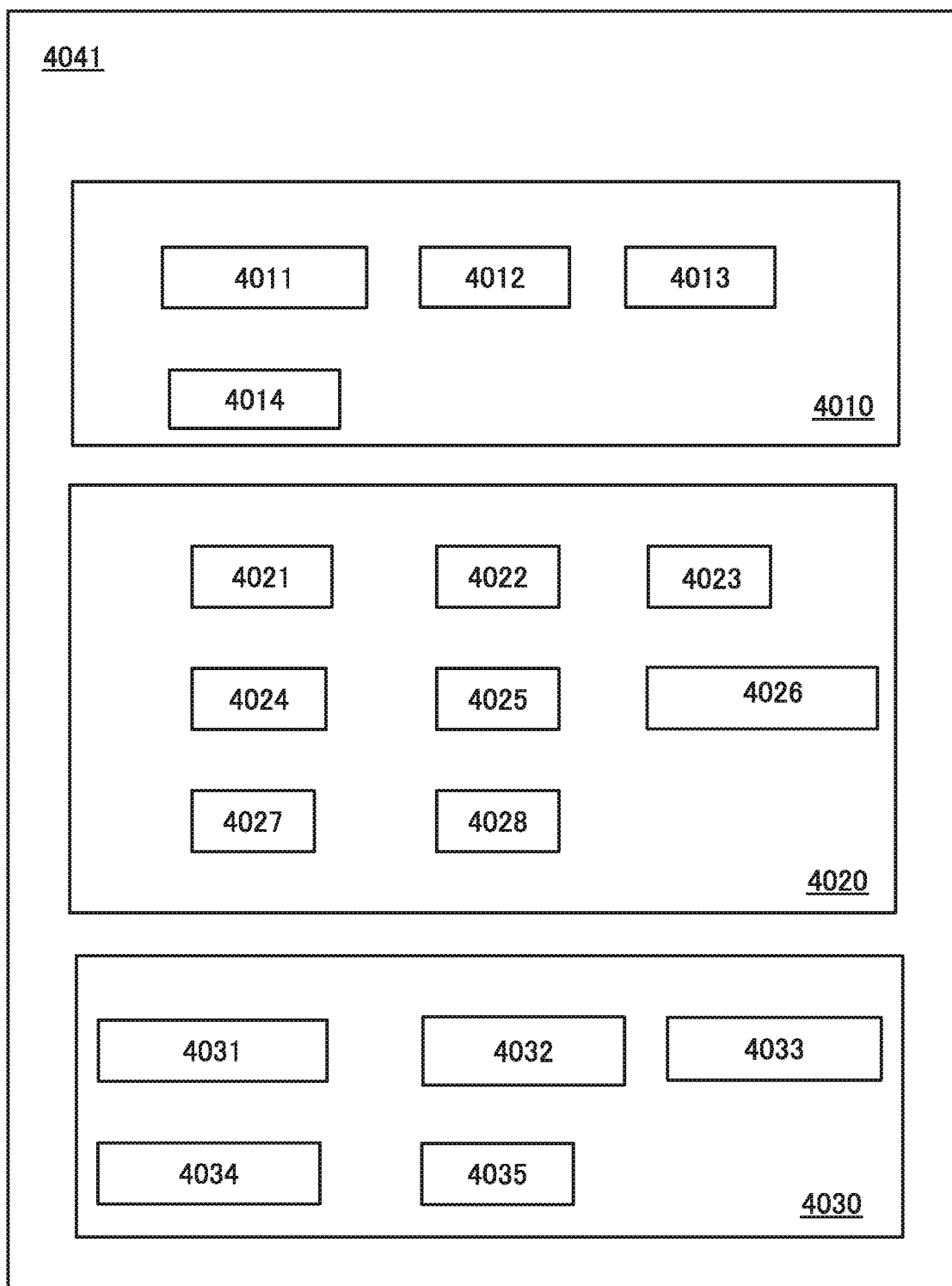
FIG. 31 is a block diagram illustrating a configuration example of an AI system of one embodiment of the present invention.

FIG. 31 is a block diagram illustrating a configuration example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, and an FPGA 4014. The DOSRAM 1400 described in the above embodiment can be used as the DOSRAM 4012.

The control portion 4020 includes a central processing unit (CPU) 4021, a graphics processing unit (GPU) 4022, a phase locked loop (PLL) 4023, a static random access memory (SRAM) 4024, a programmable read only memory (PROM) 4025, a memory controller 4026, a power supply circuit 4027, and a power management unit (PMU) 4028.

The input/output portion 4030 includes an external memory control circuit 4031, an audio codec 4032, a video codec 4033, a general-purpose input/output module 4034, and a communication module 4035.

The arithmetic portion 4010 can perform neural network learning or neural network inference.

The analog arithmetic circuit 4011 includes an analog/digital (A/D) converter circuit, a digital/analog (D/A) converter circuit, and a product-sum operation circuit.

The analog arithmetic circuit 4011 is preferably formed using an OS transistor. The analog arithmetic circuit 4011 formed using an OS transistor includes an analog memory and can execute a product-sum operation necessary for the learning and the inference with low power consumption.

The DOSRAM 4012 is a DRAM including an OS transistor. The DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, the number of input data exceeds 1000 in some cases. In the case where the input data are stored in an SRAM, the input data has to be stored piece by piece because of the circuit area limitation and small storage capacity of the SRAM. The DOSRAM 4012 has a larger storage capacity than the SRAM because memory cells of the DOSRAM can be highly integrated even in a limited circuit area. Therefore, the DOSRAM 4012 can efficiently store the input data.

The NOSRAM 4013 is a nonvolatile memory including an OS transistor. NOSRAM (registered trademark) is an abbreviation of "nonvolatile oxide semiconductor RAM", which indicates a RAM including a gain cell (2T or 3T) memory cell. As in the DOSRAM, an OS memory can be used in the NOSRAM of this embodiment.

The NOSRAM 4013 consumes less power in writing data than the other nonvolatile memories such as a flash memory, a resistive random access memory (ReRAM), and a magnetoresistive random access memory (MRAM). Furthermore, unlike a flash memory and a ReRAM which deteriorate by data writing, the NOSRAM does not have a limit on the number of times of data writing.

Furthermore, the NOSRAM 4013 can store multilevel data of two or more bits as well as one-bit binary data. The multilevel data storage in the NOSRAM 4013 leads to a reduction in the memory cell area per bit.

Because the NOSRAM 4013 can store analog data as well as digital data, the analog arithmetic circuit 4011 can use the NOSRAM 4013 as an analog memory. The NOSRAM 4013 can store analog data as it is, and thus requires neither a D/A converter circuit nor an A/D converter circuit. This reduces the area of a peripheral circuit for the NOSRAM 4013. In this specification, analog data refers to data having a resolution of three bits (eight levels) or more. The above-described multilevel data might be included in the analog data.

Data and parameters used in the neural network calculation can be once stored in the NOSRAM 4013. The data and parameters may be stored in a memory provided outside the AI system 4041 via the CPU 4021. However, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA including an OS transistor. In the FPGA of this embodiment, an OS memory can be used for a configuration memory and a register. Here, such an FPGA is referred to as an "OS-FPGA". By including the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), a deep belief network (DBN), or the like described later, with hardware. The connection of the neural network with hardware enables higher speed performance.

The FPGA 4014 is an OS-FPGA. An OS-FPGA can have a smaller memory area than an FPGA formed using an SRAM. Thus, adding a context switching function only causes a small increase in area. Moreover, an OS-FPGA can transmit data and parameters at high speed by utilizing the boosting.

In the AI system 4041, the analog arithmetic circuit 4011, the DOSRAM 4012, the NOSRAM 4013, and the FPGA 4014 can be provided on one die (chip). Thus, the AI system 4041 can perform calculation of the neural network quickly with low power consumption. The analog arithmetic circuit 4011, the DOSRAM 4012, the NOSRAM 4013, and the FPGA 4014 can be manufactured through the same manufacturing process. This enables the AI system 4041 to be manufactured at low cost.

Note that the arithmetic portion 4010 does not need to include all of the following: the DOSRAM 4012, the NOSRAM 4013, and the FPGA 4014. One or more memories are selected from the DOSRAM 4012, the NOSRAM 4013, and the FPGA 4014 in accordance with a problem that is to be solved in the AI system 4041.

The AI system 4041 can implement a method such as a deep neural network (DNN), a convolutional neural network (CNN), a recurrent neural network (RNN), an autoencoder, a deep Boltzmann machine (DBM), or a deep belief network (DBN) in accordance with the problem that is to be solved. The PROM 4025 can store a program for implementing at least one of these methods. Part or the whole of the program may be stored in the NOSRAM 4013.

Most of the existing programs used as libraries are premised on processing with a GPU. Therefore, the AI system 4041 preferably includes the GPU 4022. In the AI system 4041, the arithmetic portion 4010 can execute the bottleneck product-sum operation among all the product-sum operations used for learning and inference, and the GPU 4022 can execute the other product-sum operations. Accordingly, the learning and inference can be performed at high speed.

The power supply circuit 4027 generates not only a low power supply potential for a logic circuit but also a potential for an analog operation. The power supply circuit 4027 may include an OS memory. When a reference potential is stored in the OS memory, the power consumption of the power supply circuit 4027 can be reduced.

The PMU 4028 has a function of temporarily stopping the power supply to the AI system 4041.

The CPU 4021 and the GPU 4022 preferably include OS memories as registers. By including the OS memories, the CPU 4021 and the GPU 4022 can retain data (logic values) in the OS memories even when power supply is stopped. This saves the power of the AI system 4041.

The PLL 4023 has a function of generating a clock. The AI system 4041 performs an operation on the basis of the clock generated by the PLL 4023. The PLL 4023 preferably includes an OS memory. By including the OS memory, the PLL 4023 can hold an analog potential for controlling the clock oscillation frequency.

The AI system 4041 may store data in an external memory such as a DRAM. For this reason, the AI system 4041 preferably includes the memory controller 4026 functioning as an interface with the external DRAM. Furthermore, the memory controller 4026 is preferably positioned near the CPU 4021 or the GPU 4022. This enables quick data transmission.

Some or all of the circuits in the control portion 4020 can be formed on the same die as the arithmetic portion 4010. Thus, the AI system 4041 can execute neural network calculation at high speed with low power consumption.

Data used for neural network calculation is stored in an external storage device such as a hard disk drive (HDD) or a solid state drive (SSD) in many cases. Therefore, the AI system 4041 preferably includes the external memory control circuit 4031 functioning as an interface with the external storage device.

Because audio and video are often subjects of the learning and inference using the neural network, the AI system 4041 includes the audio codec 4032 and the video codec 4033. The audio codec 4032 encodes and decodes audio data, and the video codec 4033 encodes and decodes video data.

The AI system 4041 can perform learning or make an inference using data obtained from an external sensor. For this reason, the AI system 4041 includes the general-purpose input/output module 4034. The general-purpose input/output module 4034 includes, for example, a universal serial bus (USB) or an inter-integrated circuit (I2C).

The AI system 4041 can perform learning or make an inference using data obtained via the Internet. Hence, the AI system 4041 preferably includes the communication module 4035.

The analog arithmetic circuit 4011 may include a multi-level flash memory as an analog memory. However, the flash memory has a limit on the number of rewriting times. In addition, the multi-level flash memory is extremely difficult to embed; in other words, the arithmetic circuit and the memory are difficult to form on the same die.

Alternatively, the analog arithmetic circuit 4011 may include a ReRAM as an analog memory. However, the ReRAM has a limit on the number of rewriting times and also has a problem in storage accuracy. Moreover, because the ReRAM is a two-terminal element, the complicated circuit design is necessary for separating data writing and data reading.

Further alternatively, the analog arithmetic circuit 4011 may include an MRAM as an analog memory. However, the MRAM has a problem in storage accuracy because of its low magnetoresistive ratio.

In consideration of the above, an OS memory is preferably used as an analog memory in the analog arithmetic circuit 4011.

The structures described in this embodiment can be used in appropriate combination with any of the structures described in the other embodiments.

Embodiment 5

Application Example of AI System

In this embodiment, application examples of the AI system described in the above embodiment will be described with reference to FIGS. 32A and 32B.

Figure 32A:
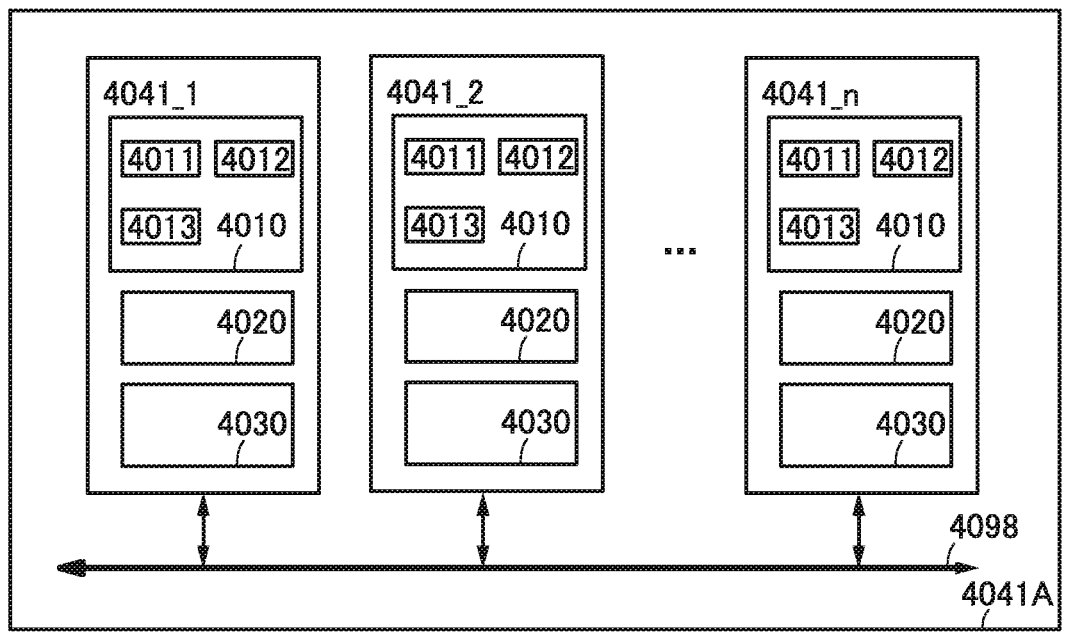
FIGS. 32A and 32B are block diagrams illustrating application examples of an AI system of one embodiment of the present invention.

FIG. 32A illustrates an AI system 4041A in which the AI systems 4041 described with FIG. 31 are arranged parallel to each other and a signal can be transmitted between the systems via a bus line.

The AI system 4041A illustrated in FIG. 32A includes AI systems 4041_1 to 4041_*n* (n is a natural number). The AI systems 4041_1 to 4041_*n* are connected to each other via a bus line 4098.

Figure 32B:
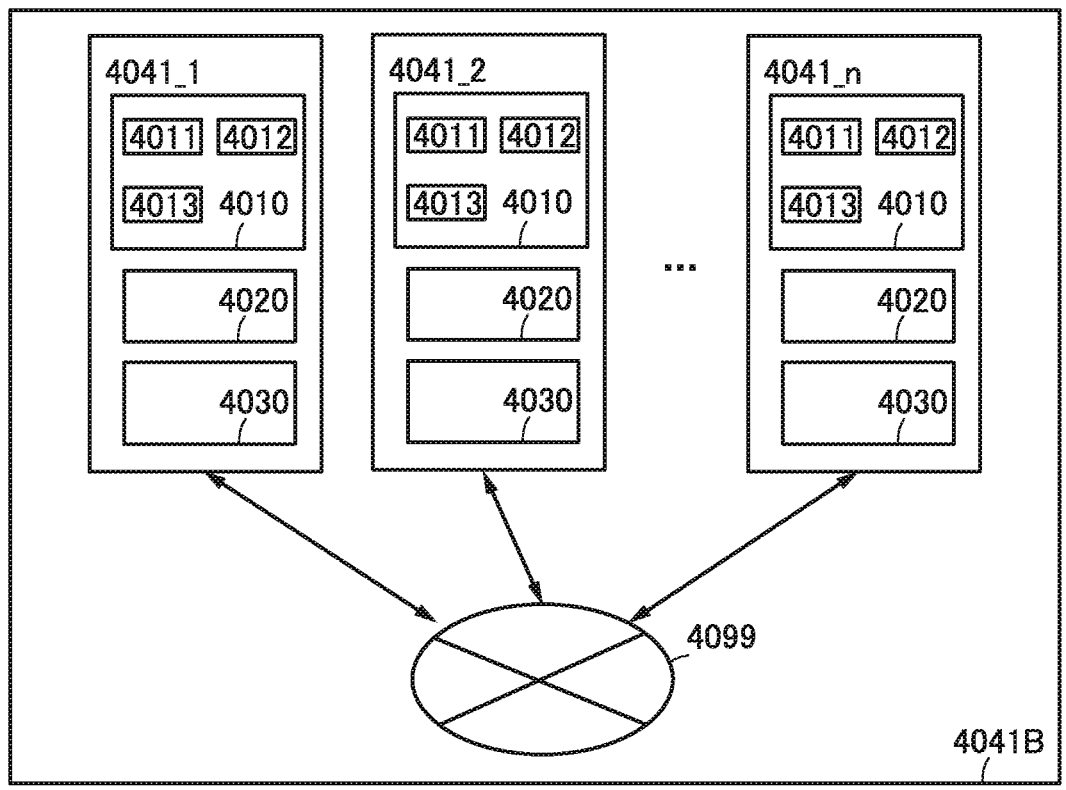

FIG. 32B illustrates an AI system 4041B in which the AI systems 4041 described with FIG. 31 are arranged parallel to each other as in FIG. 32A and a signal can be transmitted between the systems via a network.

The AI system 4041B illustrated in FIG. 32B includes the AI systems 4041_1 to 4041_*n*. The AI systems 4041_1 to 4041_*n* are connected to each other via a network 4099.

The network 4099 may establish wireless or wired communication with a communication module provided in each of the AI systems 4041_1 to 4041_*n*. The communication with the communication module can be performed via an antenna. For example, the communication can be performed in such a manner that an electronic device is connected to a computer network such as the Internet (infrastructure of the World Wide Web, WWW), an intranet, an extranet, a personal area network (PAN), a local area network (LAN), a campus area network (CAN), a metropolitan area network (MAN), a wide area network (WAN), or a global area network (GAN). A communication protocol or a communication technology used for wireless communication is a communications standard such as Long-Term Evolution (LTE), Global System for Mobile Communication (GSM: registered trademark), Enhanced Data Rates for GSM Evolution (EDGE), Code Division Multiple Access 2000 (CDMA2000), or W-CDMA (registered trademark), or a communications standard developed by IEEE such as Wi-Fi (registered trademark), Bluetooth (registered trademark), or ZigBee (registered trademark).

The configuration illustrated in FIG. 32A or FIG. 32B enables analog signals obtained with external sensors or the like to be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. The signal processing or learning with different AI systems reduces the amount of information processed by each AI system. This reduces the amount of arithmetic processing necessary for the signal processing or learning, leading to improved recognition accuracy. The information obtained with each AI system is expected to instantly give collective biological information that irregularly changes.

The structures described in this embodiment can be used in appropriate combination with any of the structures described in the other embodiments.

Embodiment 6

In this embodiment, an example of an IC incorporating the AI system described in the above embodiment will be described.

In the AI system described in the above embodiment, a digital processing circuit (e.g., a CPU) that includes a Si transistor, an analog arithmetic circuit that includes an OS transistor, an OS-FPGA, and an OS memory (e.g., a DOSRAM or a NOSRAM) can be integrated into one die.

Figure 33:
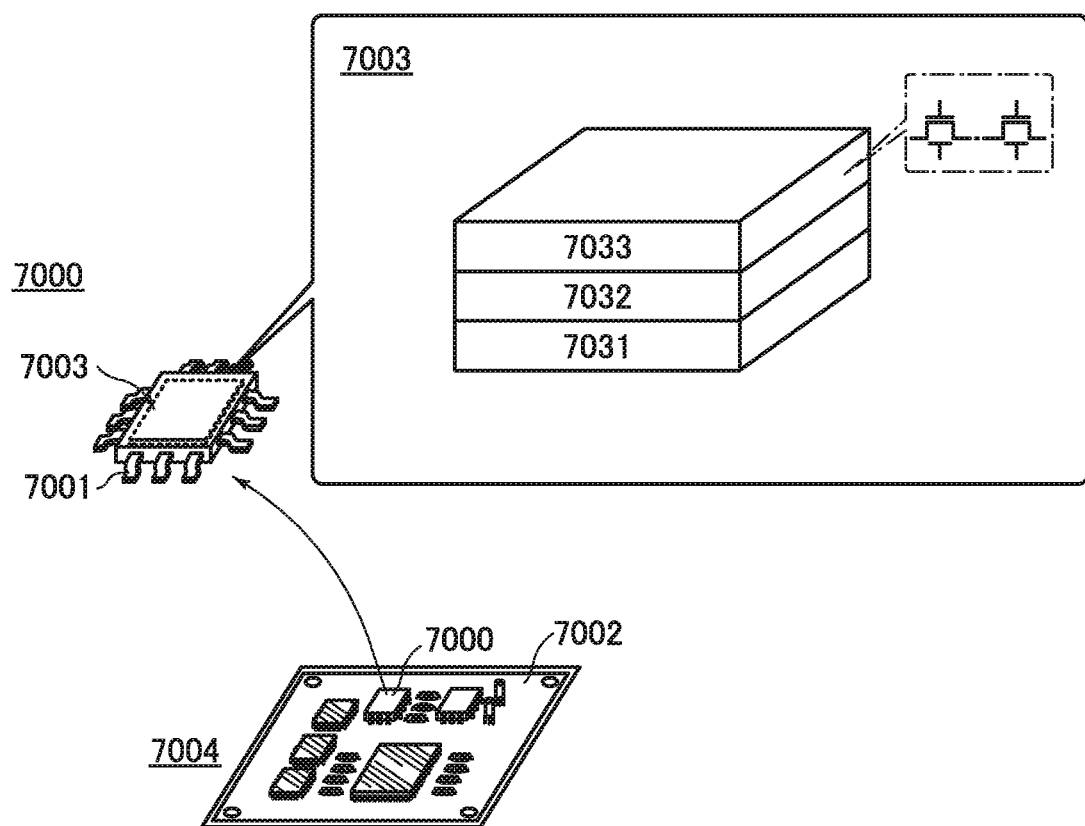
FIG. 33 is a schematic perspective view illustrating a configuration example of an IC including an AI system of one embodiment of the present invention.

FIG. 33 illustrates an example of the IC incorporating the AI system. An AI system IC 7000 illustrated in FIG. 33 includes a lead 7001 and a circuit portion 7003. The AI system IC 7000 is mounted on, for example, a printed circuit board 7002. A plurality of such IC chips are combined and electrically connected to each other on the printed circuit board 7002; thus, a substrate (a circuit board 7004) on which electronic components are mounted is completed. In the circuit portion 7003, the circuits described in any of the above embodiments are provided on one die. The circuit portion 7003 has a stacked-layer structure that is broadly divided into a Si transistor layer 7031, a wiring layer 7032, and an OS transistor layer 7033. Since the OS transistor layer 7033 can be stacked over the Si transistor layer 7031, the size of the AI system IC 7000 can be easily reduced.

Although a Quad Flat Package (QFP) is used as a package of the AI system IC 7000 in FIG. 33, the package is not limited thereto.

The digital processing circuit (e.g., a CPU), the analog arithmetic circuit including an OS transistor, the OS-FPGA, and the OS memory (e.g., a DOSRAM or a NOSRAM) can all be formed in the Si transistor layer 7031, the wiring layer 7032, and the OS transistor layer 7033. In other words, elements included in the AI system can be formed through the same manufacturing process. This allows a larger number of elements to be provided in the IC in this embodiment without an increase in manufacturing process, enabling the AI system to be incorporated into the IC at low cost.

The structures described in this embodiment can be used in appropriate combination with any of the structures described in the other embodiments.

Embodiment 7

<Electronic Device>

The semiconductor device of one embodiment of the present invention can be used for a variety of electronic devices. FIGS. 34A to 34F each illustrate a specific example of an electronic device including the semiconductor device of one embodiment of the present invention.

Figure 34A:
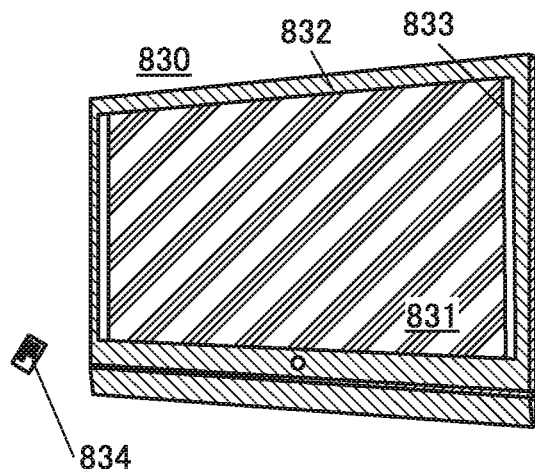
FIGS. 34A to 34F illustrate electronic devices of one embodiment of the present invention.

FIG. 34A illustrates a monitor 830. The monitor 830 includes a display portion 831, a housing 832, a speaker 833, and the like. The monitor 830 can also include an LED lamp, operation keys (including a power switch or an operation switch), a connection terminal, a variety of sensors, a microphone, and the like. The monitor 830 can be controlled with a remote controller 834.

The monitor 830 can function as a television device by receiving airwaves.

The monitor 830 can receive airwaves such as a ground wave or a satellite wave, airwaves for analog broadcasting or digital broadcasting, airwaves for image-and-sound broadcasting or sound-only broadcasting, and the like. For example, the monitor 830 can receive airwaves transmitted in a certain frequency band in a UHF band (higher than or equal to 300 MHz and lower than or equal to 3 GHz) or a VHF band (higher than or equal to 30 MHz and lower than or equal to 300 MHz). With the use of a plurality of pieces of data received in a plurality of frequency bands, the transfer rate can be increased and more information can thus be obtained. This allows the display portion 831 to display an image with a resolution higher than the full high definition, such as 4K2K, 8K4K, 16K8K, or more.

An image to be displayed on the display portion 831 may be generated using broadcasting data transmitted with a technology for transmitting data via a computer network such as the Internet, a local area network (LAN), or Wi-Fi (registered trademark). In that case, the monitor 830 does not need to include a tuner.

The monitor 830 can be used as a computer monitor when connected to a computer. Several people can see the monitor 830 connected to a computer at the same time; thus, the monitor 830 is suitably used for a conference system. The monitor 830 can also be used for a videoconference system by displaying data in a computer via a network or being connected to a network.

Alternatively, the monitor 830 can be used as a digital signage.

The semiconductor device of one embodiment of the present invention can be used for, for example, a driver circuit or an image processing portion of the display portion, in which case high-speed operation or high-speed signal processing can be achieved with low power consumption.

When an AI system including the semiconductor device of one embodiment of the present invention is used for the image processing portion of the monitor 830, image processing such as noise removal, grayscale conversion, color tone correction, or luminance correction can be performed. Furthermore, pixel interpolation with resolution up-conversion, frame interpolation with frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Figure 34B:
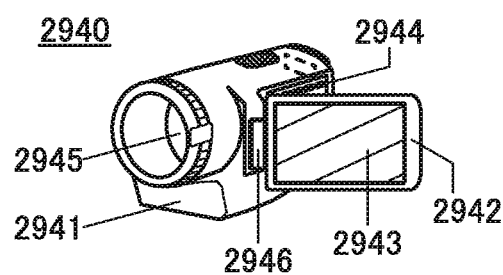

A video camera 2940 illustrated in FIG. 34B includes a housing 2941, a housing 2942, a display portion 2943, operation switches 2944, a lens 2945, a joint 2946, and the like. The operation switches 2944 and the lens 2945 are provided on the housing 2941, and the display portion 2943 is provided on the housing 2942. The video camera 2940 also includes an antenna, a battery, and the like inside the housing 2941. The housing 2941 and the housing 2942 are connected to each other with the joint 2946, and the angle between the housings 2941 and 2942 can be changed with the joint 2946. With the angle between the housings 2941 and 2942, the orientation of an image displayed on the display portion 2943 can be changed or display and non-display of images can be switched.

The semiconductor device of one embodiment of the present invention can be used for, for example, a driver circuit or an image processing portion of the display portion, in which case high-speed operation or high-speed signal processing can be achieved with low power consumption.

When an AI system including the semiconductor device of one embodiment of the present invention is used for the image processing portion of the video camera 2940, imaging appropriate for the surroundings of the video camera 2940 can be performed. Specifically, imaging can be performed with optimal exposure for the surrounding brightness. In the case of performing imaging with backlighting or imaging under mixed brightness conditions (e.g., indoors and outdoors), high-dynamic-range (HDR) imaging can be performed.

Furthermore, the AI system can learn user's habit and assist the user in performing imaging. Specifically, the AI system can learn user's camera shaking habit and correct the camera shake during imaging, so that blurring of the obtained image associated with camera shake can be reduced as much as possible. In the case of using a zoom function during imaging, the orientation of a lens or the like can be controlled such that a subject is positioned at the center of an image all the time.

Figure 34C:
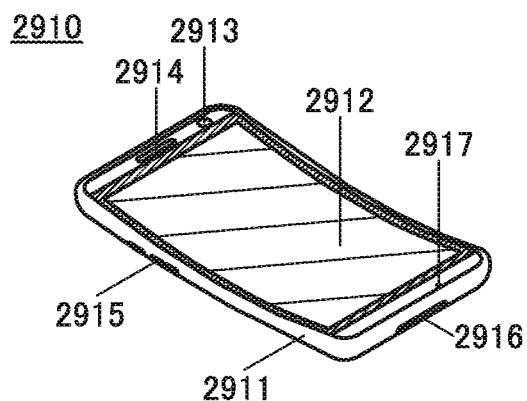

An information terminal 2910 illustrated in FIG. 34C includes a housing 2911, a display portion 2912, a microphone 2917, a speaker portion 2914, a camera 2913, an external connection portion 2916, operation switches 2915, and the like. A touch screen and a display panel formed using flexible substrates are provided in the display portion 2912. The information terminal 2910 also includes an antenna, a battery, and the like inside the housing 2911. The information terminal 2910 can be used as, for example, a smartphone, a mobile phone, a tablet information terminal, a tablet personal computer, or an e-book reader.

For example, a memory device including the semiconductor device of one embodiment of the present invention can hold control data, a control program, or the like of the information terminal 2910 for a long time.

When an AI system including the semiconductor device of one embodiment of the present invention is used for the image processing portion of the information terminal 2910, image processing such as noise removal, grayscale conversion, color tone correction, or luminance correction can be performed. Furthermore, pixel interpolation with resolution up-conversion, frame interpolation with frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Furthermore, the AI system can learn user's habit and assist the user in operating the information terminal 2910. The information terminal 2910 incorporating the AI system can predict touch input from the motion of user's fingers, eyes, or the like.

Figure 34D:
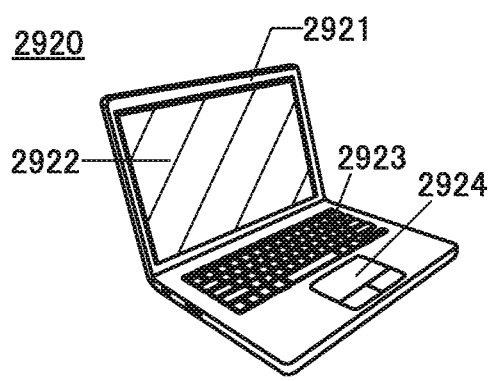

A notebook personal computer 2920 illustrated in FIG. 34D includes a housing 2921, a display portion 2922, a keyboard 2923, a pointing device 2924, and the like. The notebook personal computer 2920 also includes an antenna, a battery, and the like inside the housing 2921.

For example, a memory device including the semiconductor device of one embodiment of the present invention can hold control data, a control program, or the like of the notebook personal computer 2920 for a long time.

When an AI system including the semiconductor device of one embodiment of the present invention is used for the image processing portion of the notebook personal computer 2920, image processing such as noise removal, grayscale conversion, color tone correction, or luminance correction can be performed. Furthermore, pixel interpolation with resolution up-conversion, frame interpolation with frame frequency up-conversion, or the like can be performed. In the grayscale conversion, the number of grayscale levels of an image can be changed, and interpolation of the gray value in the case of increasing the number of grayscale levels can be performed. In addition, high-dynamic range (HDR) processing for increasing a dynamic range is also included in the grayscale conversion.

Furthermore, the AI system can learn user's habit and assist the user in operating the notebook personal computer 2920. The notebook personal computer 2920 incorporating the AI system can predict touch input to the display portion 2922, from the motion of user's finger, eyes, or the like. In texting, the AI system predicts input from the past input text or a text or a diagram (e.g., a photograph) around the text to be input, to assist conversion. Accordingly, input mistakes and conversion mistakes can be reduced as much as possible.

Figure 34E:
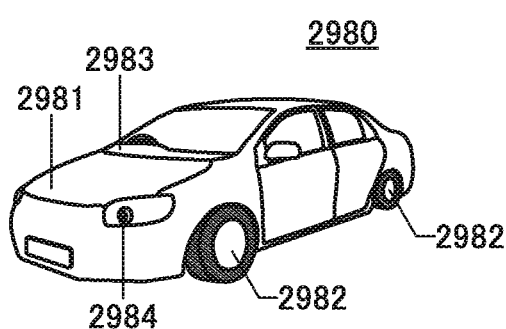
Figure 34F:
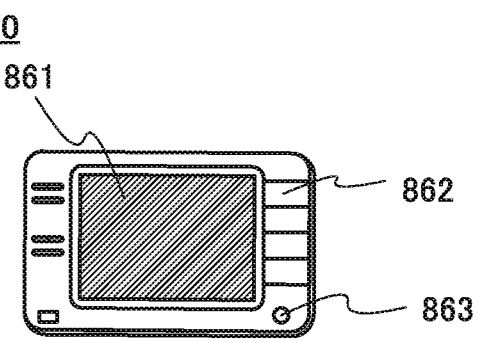

FIG. 34E is an external view illustrating an example of an automobile. FIG. 34F illustrates a navigation device 860. An automobile 2980 includes a car body 2981, wheels 2982, a dashboard 2983, lights 2984, and the like. The automobile 2980 also includes an antenna, a battery, and the like. The navigation device 860 includes a display portion 861, operation buttons 862, and an external input terminal 863. The automobile 2980 and the navigation device 860 can be independent of each other; however, it is preferable that the navigation device 860 be incorporated into and linked to the automobile 2980.

For example, a memory device including the semiconductor device of one embodiment of the present invention can hold control data, a control program, or the like of the automobile 2980 or the navigation device 860 for a long time. When an AI system including the semiconductor device of one embodiment of the present invention is used for a control device or the like of the automobile 2980, the AI system can learn driver's driving skill and habit and assist the driver in safe driving or driving involving efficient use of fuel such as gasoline or a battery. To assist the driver in safe driving, the AI system learns not only driver's driving skill and habit, but also learns the behavior of the automobile 2980 such as the speed and movement, road information saved in the navigation device 860, and the like complexly; thus, lane departure and collision with other automobiles, pedestrians, objects, and the like can be prevented. Specifically, when there is a sharp curve ahead, the navigation device 860 transmits the road information to the automobile 2980 so that the speed of the automobile 2980 can be controlled and steering can be assisted.

This embodiment can be implemented in an appropriate combination with any of the structures described in the other embodiments and the like.

Embodiment 8

Figure 35A:
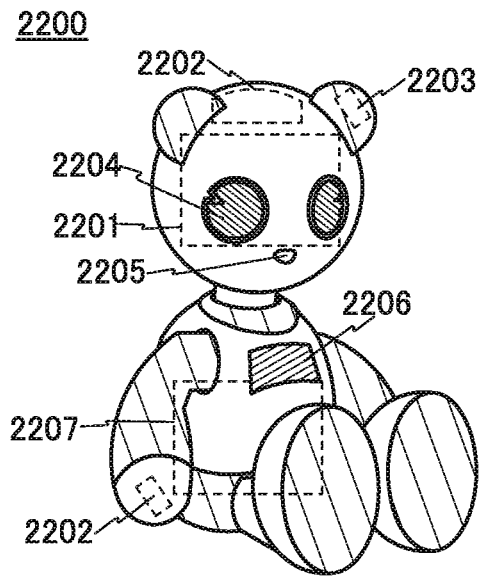
FIGS. 35A to 35D illustrate electronic devices of one embodiment of the present invention.

FIG. 35A illustrates a communication robot 2200 as an example of an electronic device employing the semiconductor device one embodiment of the present invention. The communication robot 2200 includes an arithmetic device 2201, contact sensors 220_2, a microphone 220_3, a camera 220_4, a speaker 2205, a display 2206, and a battery 2207.

In the communication robot 2200, the semiconductor device of one embodiment of the present invention can be used for the arithmetic device 2201. The communication robot 2200 can make conversation with the user by processing a factory-installed language library, sensing results of various sensors, and the like in the arithmetic device 2201. In addition, the communication robot 2200 can recognize the user's face or facial expression.

The display 2206 has a function of displaying various types of information. Information that the user desires can be displayed on the display 2206 in the communication robot 2200. Note that the display 2206 may include a touch panel. The communication robot 2200 may have a telephone function.

Figure 35B:
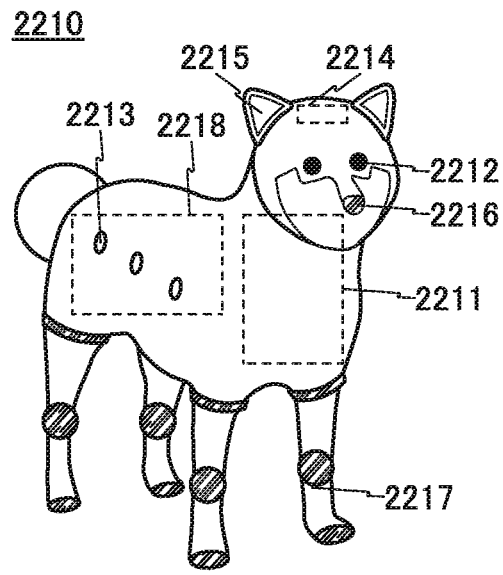

FIG. 35B illustrates a robotic dog 2210 as an example of the electronic device employing the semiconductor device of one embodiment of the present invention. The robotic dog 2210 includes an arithmetic device 2211, a front camera 2212, a side camera 2213, a contact sensor 2214, a microphone 2215, a speaker 2216, legs 2217, and a battery 2218.

In the robotic dog 2210, the semiconductor device of one embodiment of the present invention can be used for the arithmetic device 2211. By processing online map information, sensing results of various sensors, and the like in the arithmetic device 2211, the robotic dog 2210 can automatically run with the legs 2217 and raise an alert to ensure the user's safety. For example, an alert can be raised through the speaker 2216 or the like when the user walking on a road with the robotic dog 2210 fails to stop at a red light.

Furthermore, the robotic dog 2210 can recognize the surroundings using the front camera 2212 and the side camera 2213. For example, the robotic dog 2210 may have a function of raising a loud alert through the speaker 2216 or reporting an emergency in the case where a suspicious person is intruding into a house where the robotic dog 2210 is set. Note that the robot is not limited to the robotic dog 2210 illustrated in FIG. 35B, and may be a humanoid robot, a robotic cat, a robotic bird, and other types of robots.

Figure 35C:
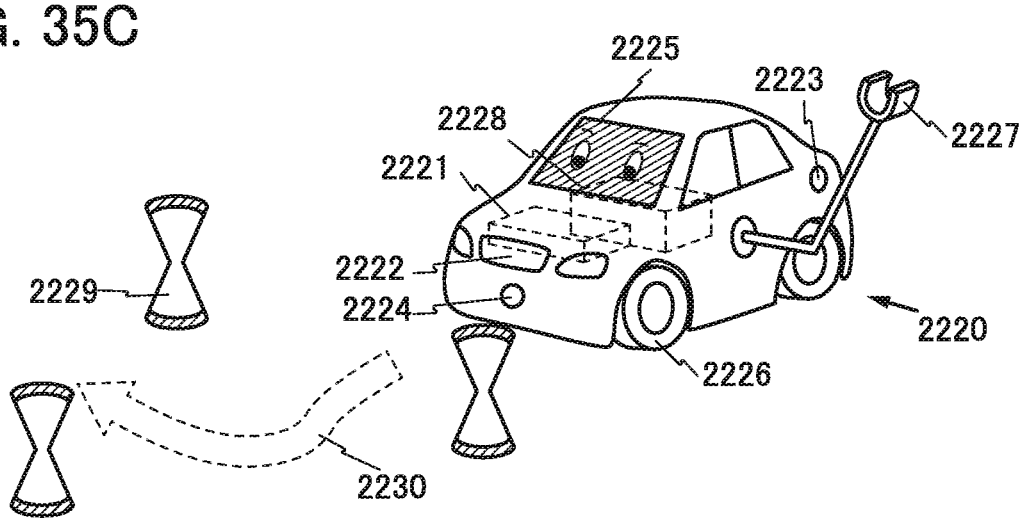
Figure 35D:
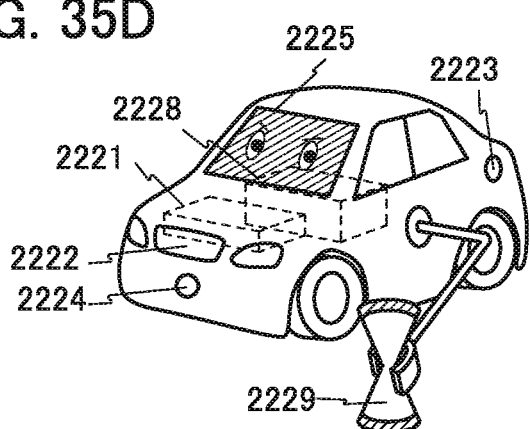

FIGS. 35C and 35D illustrate a robotic car 2220 as an example of the electronic device employing the semiconductor device of one embodiment of the present invention. The robotic car 2220 includes an arithmetic device 2221, a front camera 2222, a side camera 2223, a speaker 2224, a display 2225, tires 2226, an arm 2227, and a battery 2228.

The robotic car 2220 can move with the tires 2226. In the robotic car 2220, the semiconductor device of one embodiment of the present invention can be used for the arithmetic device 2221. The robotic car 2220 can also move while perceiving the surroundings by recognizing, in the arithmetic device 2221, an image captured by the front camera 2222 and the side camera 2223. For example, as illustrated in FIG. 35C, the robotic car 2220 can travel around obstacles 2229 (see an arrow 2230) or recognize the user's face to turn toward the user.

In addition, the robotic car 2220 can lift up and transfer the obstacle 2229 with the arm 2227 as illustrated in FIG. 35D. With the use of this function, the speaker 2224, and the display 2225, the robotic car 2220 can play a game with the user.

The robotic car 2220 may also be connected to a portable information terminal such as a smartphone. For example, the user may operate the portable information terminal to control the robotic car 2220.

REFERENCE NUMERALS

100*a*: capacitor 100*b*: capacitor 110_1: conductor 110_2: conductor 120: conductor 120_1: conductor 120_2: conductor 130: insulator 140*a*: transistor 140*b*: transistor 200*a*: transistor 200*b*: transistor 203: conductor 203_1: conductor 203_2: conductor 205: conductor 205_1: conductor 205_2: conductor 210: insulator 212: insulator 214: insulator 215: conductor 215_1: conductor 215_2: conductor 215_3: conductor 215_4: conductor 215_5: conductor 216: insulator 217: insulator 217_1: insulator 217_2: insulator 217_3: insulator 217_4: insulator 217_5: insulator 218: conductor 220: insulator 220_1: insulator 220_2: insulator 220_3: insulator 220_4: insulator 220_5: insulator 230: oxide 230C: oxide film 231: region 231*a*: region 231*b*: region 234: region 240: conductor 245: conductor 246: conductor 246_1: conductor 246_2: conductor 248: conductor 250: insulator 253: conductor 260: conductor 260_1: conductor 260_2: conductor 260_3: conductor 260_4: conductor 260A: conductive film 260B: conductor 280: insulator 282: insulator 283: insulator 286: insulator 288: insulator 300: transistor 311: substrate 313: semiconductor region 314*a*: low-resistance region 314*b*: low-resistance region 315: insulator 316: conductor 320: insulator 322: insulator 324: insulator 326: insulator 328: conductor 330: conductor 350: insulator 352: insulator 354: insulator 356: conductor 360: insulator 362: insulator 366: conductor 372: insulator 374: insulator 376: conductor 400: transistor 403: conductor 450: insulator 460: conductor 600: cell 601: cell 830: monitor 831: display portion 832: housing 833: speaker 834: remote controller 860: navigation device 861: display portion 862: operation button 863: external input terminal 1003: wiring 1004*a*: wiring 1004*b*: wiring 1005*a*: wiring 1005*b*: wiring 1006*a*: wiring 1006*b*: wiring 1007: wiring 1008: wiring 1009: wiring 1010: wiring 1400: DOSRAM 1405: controller 1410: row circuit 1411: decoder 1412: word line driver circuit 1413: column selector 1414: sense amplifier driver circuit 1415: column circuit 1416: global sense amplifier array 1417: input/output circuit 1420: MC-SA array 1422: memory cell array 1423: sense amplifier array 1425: local memory cell array 1426: local sense amplifier array 1444: switch array 1445: memory cell 1445*a*: memory cell 1445*b*: memory cell 1446: sense amplifier 1447: global sense amplifier 2200: communication robot 2201: arithmetic device 2202: contact sensor 2203: microphone 2204: camera 2205: speaker 2206: display 2207: battery 2210: robotic dog 2211: arithmetic device 2212: front camera 2213: side camera 2214: contact sensor 2215: microphone 2216: speaker 2217: legs 2218: battery 2220: robotic car 2221: arithmetic device 2222: front camera 2223: side camera 2224: speaker 2225: display 2226: tire 2227: arm 2228: battery 2229: obstacle 2230: arrow 2910: information terminal 2911: housing 2912: display portion 2913: camera 2914: speaker portion 2915: operation switch 2916: external connection portion 2917: microphone 2920: notebook personal computer 2921: housing 2922: display portion 2923: keyboard 2924: pointing device 2940: video camera 2941: housing 2942: housing 2943: display portion 2944: operation switch 2945: lens 2946: connection portion 2980: automobile 2981: car body 2982: wheel 2983: dashboard 2984: light 3001: wiring 3002: wiring 3003: wiring 3004*a*: wiring 3004*b*: wiring 3005*a*: wiring 3005*b*: wiring 3006*a*: wiring 3006*b*: wiring 3007: wiring 4010: arithmetic portion 4011: analog arithmetic circuit 4012: DOSRAM 4013: NOSRAM 4014: FPGA 4020: control portion 4021: CPU 4022: GPU 4023: PLL 4025: PROM 4026: memory controller 4027: power supply circuit 4028: PMU 4030: input/output portion 4031: external memory control circuit 4032: audio codec 4033: video codec 4034: general-purpose input/output module 4035: communication module 4041: AI system 4041_n: AI system 4041_1: AI system 4041A: AI system 4041B: AI system 4098: bus line 4099: network 7000: AI system IC 7001: lead 7003: circuit portion 7031: Si transistor layer 7032: wiring layer 7033: OS transistor layer This application is based on Japanese Patent Application Serial No. 2017-177386 filed with Japan Patent Office on Sep. 15, 2017, the entire contents of which are hereby incorporated by reference.

The invention claimed is:

1. A semiconductor device comprising:
a first insulator;
a second insulator and a third insulator over the first insulator;
a fourth insulator positioned between the second insulator and the third insulator;
an oxide covering the first to fourth insulators;
a fifth insulator over the oxide;
a first conductor that is positioned between the second insulator and the fourth insulator and is in contact with the fifth insulator;
a second conductor that is positioned between the third insulator and the fourth insulator and is in contact with the fifth insulator; and
a third conductor overlapping with the fourth insulator,
wherein the oxide, the fifth insulator, and the first conductor constitute a first transistor,
wherein the oxide, the fifth insulator, and the second conductor constitute a second transistor,
wherein the third conductor is positioned between the first transistor and the second transistor and is connected to one of a source and a drain of the first transistor and one of a source and a drain of the second transistor,
wherein a channel length of the first transistor is longer than a short side of the first conductor, and
wherein a channel length of the second transistor is longer than a short side of the second conductor.

2. The semiconductor device according to claim 1, wherein the oxide includes In, an element M (M is Al, Ga, Y, or Sn), and Zn.

3. The semiconductor device according to claim 1, further comprising:
a fourth conductor over the third conductor;
a fifth conductor over the first transistor;
a sixth conductor over the second transistor;
a first capacitor over the fifth conductor; and
a second capacitor over the sixth conductor,
wherein the fourth conductor is connected to the third conductor,
wherein the fifth conductor is connected to the other of the source and the drain of the first transistor and one electrode of the first capacitor, and
wherein the sixth conductor is connected to the other of the source and the drain of the second transistor and one electrode of the second capacitor.

4. The semiconductor device according to claim 3, further comprising:
a sixth insulator over the first transistor and the second transistor; and
a seventh insulator over the sixth insulator,
wherein the sixth insulator includes a first opening that exposes the oxide,
wherein the sixth insulator and the seventh insulator include a second opening and a third opening that expose the oxide,
wherein the third conductor is provided in the first opening,
wherein the fifth conductor is provided in the second opening,
wherein the sixth conductor is provided in the third opening, and
wherein the fourth conductor functioning as a wiring is positioned over the sixth insulator and the third conductor.

5. The semiconductor device according to claim 4,
wherein a long side of the fourth conductor is substantially perpendicular to a long side of the first conductor and a long side of the second conductor, and
wherein an angle between a long side of the oxide and the long side of the fourth conductor is greater than or equal to 20° and less than or equal to 70°.

* * * * *